(12) United States Patent
Tullberg et al.

(10) Patent No.: US 11,568,214 B2
(45) Date of Patent: *Jan. 31, 2023

(54) NEURAL NETWORKS FOR DECODING

(71) Applicant: Telefonaktiebolaget LM Ericsson (publ), Stockholm (SE)

(72) Inventors: Hugo Tullberg, Nyköping (SE); Navneet Agrawal, Jaipur (IN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 350 days.

This patent is subject to a terminal disclaimer.

(21) Appl. No.: 16/636,128

(22) PCT Filed: Aug. 22, 2018

(86) PCT No.: PCT/IB2018/056360
§ 371 (c)(1),
(2) Date: Feb. 3, 2020

(87) PCT Pub. No.: WO2019/038693
PCT Pub. Date: Feb. 28, 2019

(65) Prior Publication Data
US 2021/0110241 A1    Apr. 15, 2021

Related U.S. Application Data

(60) Provisional application No. 62/549,026, filed on Aug. 23, 2017.

(51) Int. Cl.
*G06N 3/08* (2006.01)
*G06N 3/04* (2006.01)
*H03M 13/39* (2006.01)

(52) U.S. Cl.
CPC ............ *G06N 3/0472* (2013.01); *G06N 3/08* (2013.01); *H03M 13/3977* (2013.01)

(58) Field of Classification Search
CPC .... G06N 3/0472; G06N 3/03; H05M 13/3977
See application file for complete search history.

(56) References Cited

U.S. PATENT DOCUMENTS

| 2008/0163025 A1* | 7/2008 | Djordjevic ............ H04L 27/186 714/755 |
| 2018/0343017 A1* | 11/2018 | Kumar ...................... G06N 3/08 |
| 2020/0082910 A1* | 3/2020 | Frey .......................... G06N 3/08 |

FOREIGN PATENT DOCUMENTS

WO    WO-2018165762 A1 *  9/2018  ........... C12Q 1/6869

OTHER PUBLICATIONS

International Search Report and Written Opinion of the International Searching Authority, PCT/IB2018/056360, dated Dec. 5, 2018, 12 pages.

(Continued)

*Primary Examiner* — Samir W Rizk
(74) *Attorney, Agent, or Firm* — Sage Patent Group

(57) ABSTRACT

Methods and apparatus for training a Neural Network to recover a codeword of a Forward Error Correction (FEC) code are provided. Trainable parameters of the Neural Network are optimised to minimise a loss function. The loss function is calculated by representing an estimated value of the message bit output from the Neural Network as a probability of the value of the bit in a predetermined real number domain and multiplying the representation of the estimated value of the message bit by a representation of a target value of the message bit. Training a neural network may be implemented via a loss function.

18 Claims, 47 Drawing Sheets

(56) References Cited

OTHER PUBLICATIONS

Nachmani, E., et al., "Deep Learning Methods For Improved Decoding of Linear Codes," IEEE Journal of Selected Topics in Signal Processing, Jun. 21, 2017, 12 pages, XP080771666.
Gruber, T., et al., "On Deep Learning-Based Channel Decoding," Jan. 26, 2017, arxiv.org, Cornell University Library, 6 pages, XP080751805.
Bruck, J., et al., "Neural Networks, Error-Correcting Codes, and Polynomials Over the Binary N-Cube," IEEE Transactions on Information Theory, vol. 35, No. 5, Sep. 1989, 12 pages, XP100931.
Hagenauer, J., et al., "Decoding And Equalization With Analog Non-Linear Networks," European Transactions on Telecommunications, Wiley & Sons, Chichester, GB, vol. 10, No. 6, Nov. 1, 1999, pp. 659-680, XP000912999.
Agrawal, N., "Machine Intelligence In Decoding Of Forward Error Correction Codes," KTH Royal Institute of Technology, School of Electrical Engineering, <URL: http://kth.diva-portal.org/smash/get/diva2:1146212/FULLTEXT02.pdf>, retrieved Oct. 1, 2018, 82 pages, XP055511495.

\* cited by examiner

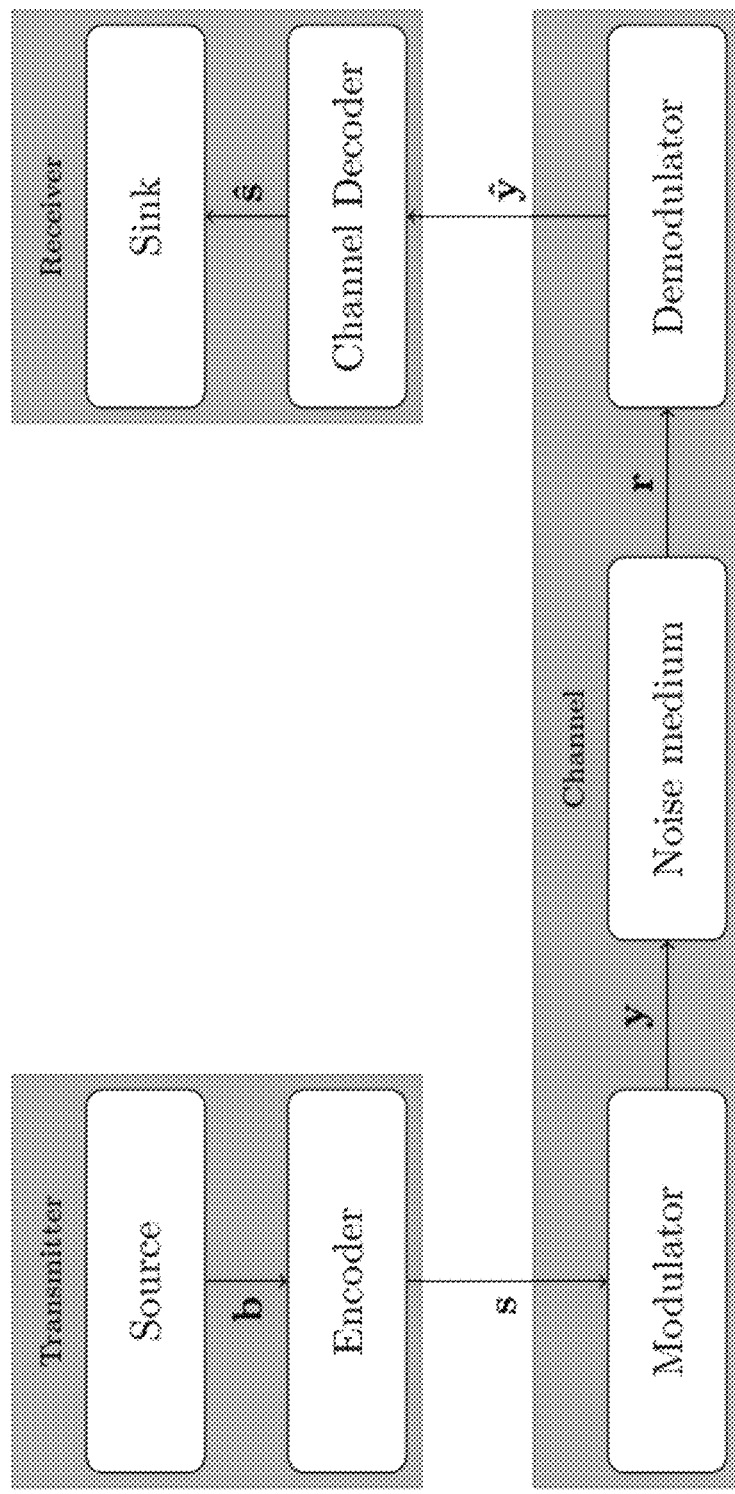
Figure 2.1

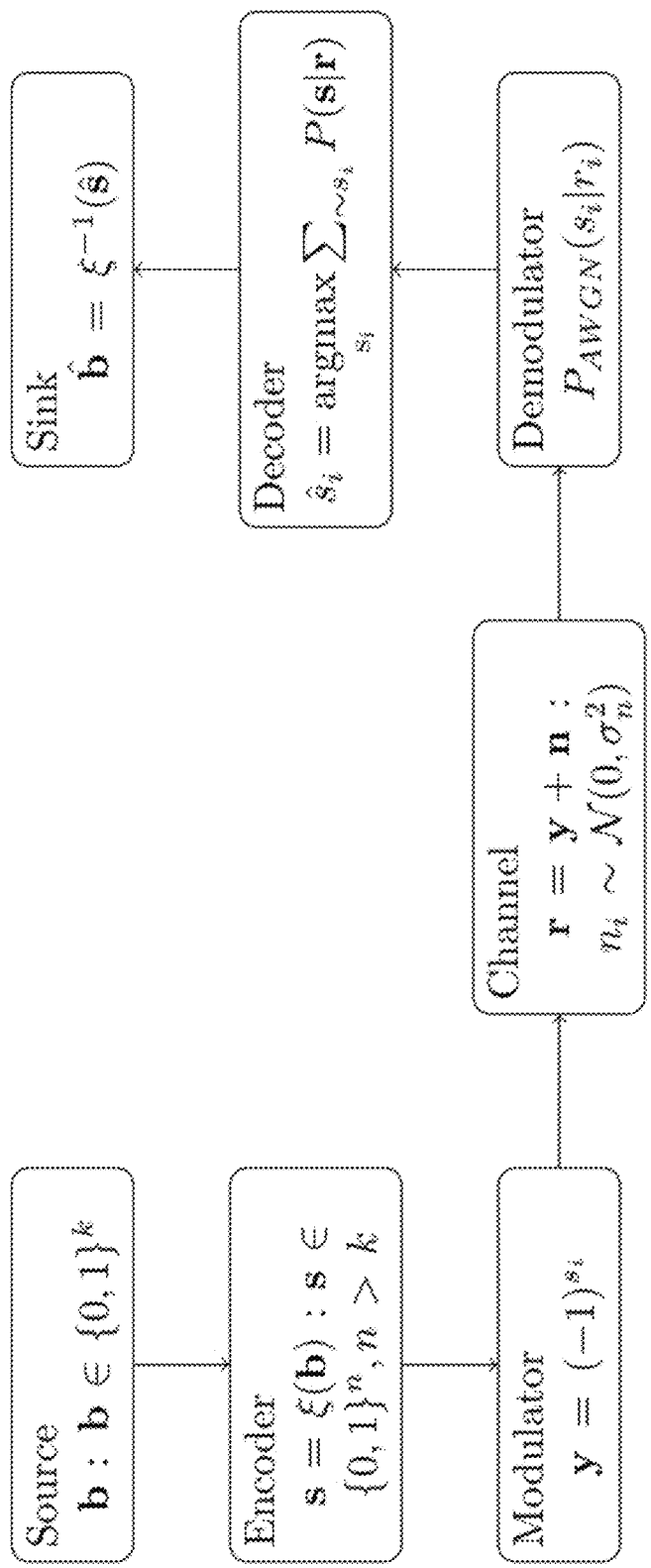
Figure 2.2

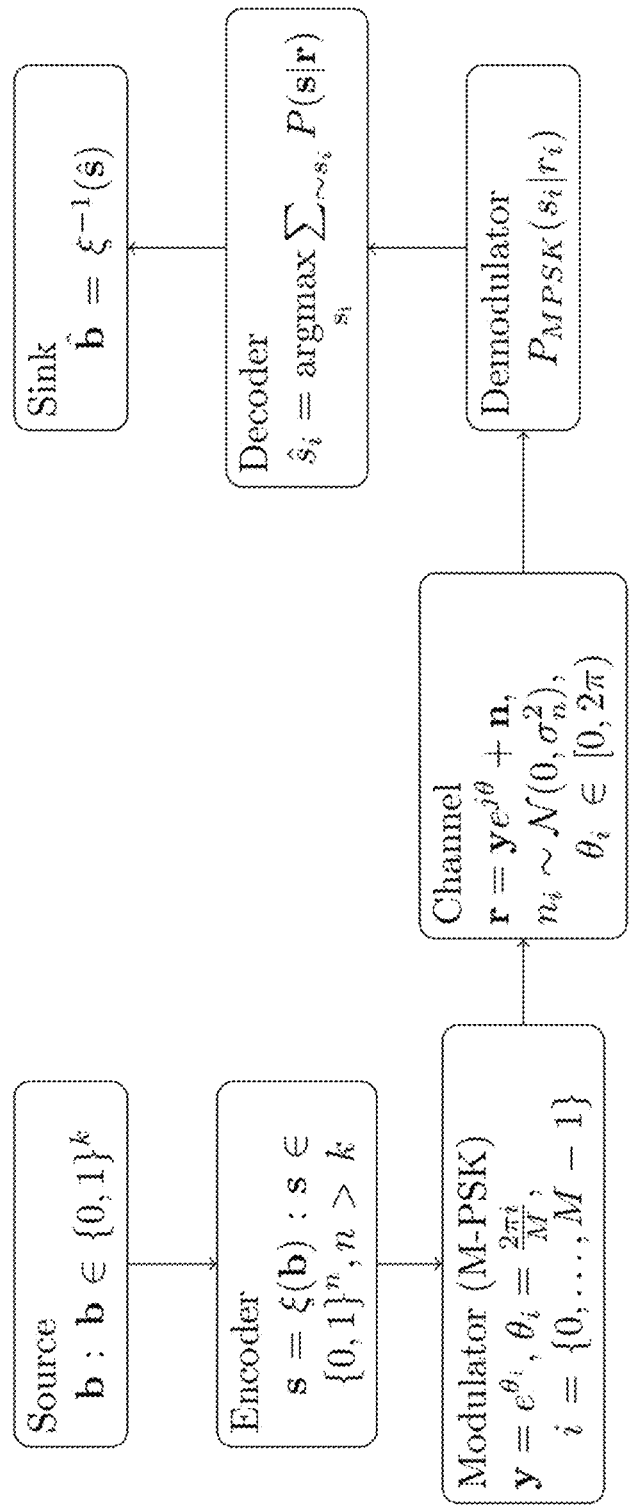
Figure 2.3

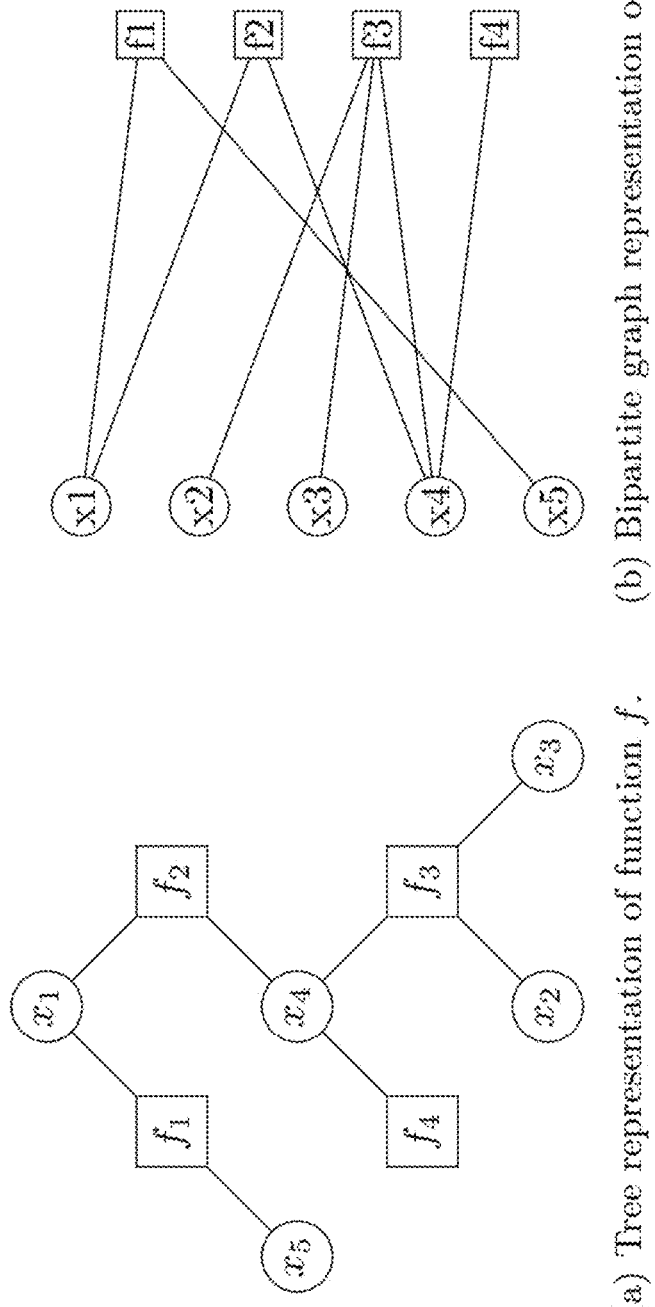
(a) Tree representation of function $f$.  (b) Bipartite graph representation of $f$.
Figure 2.4

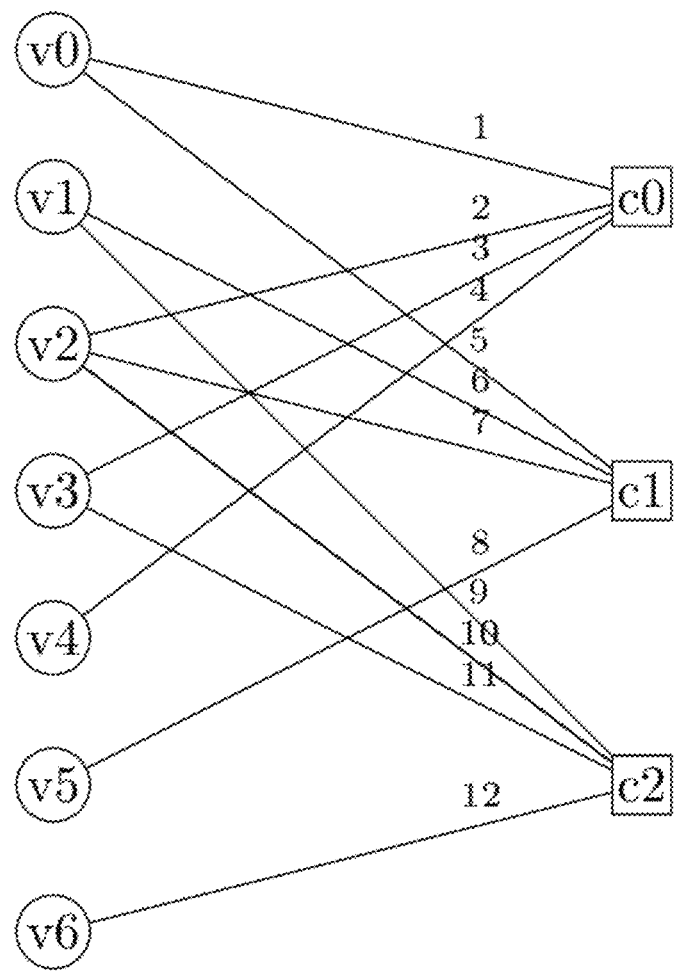
Figure 2.5

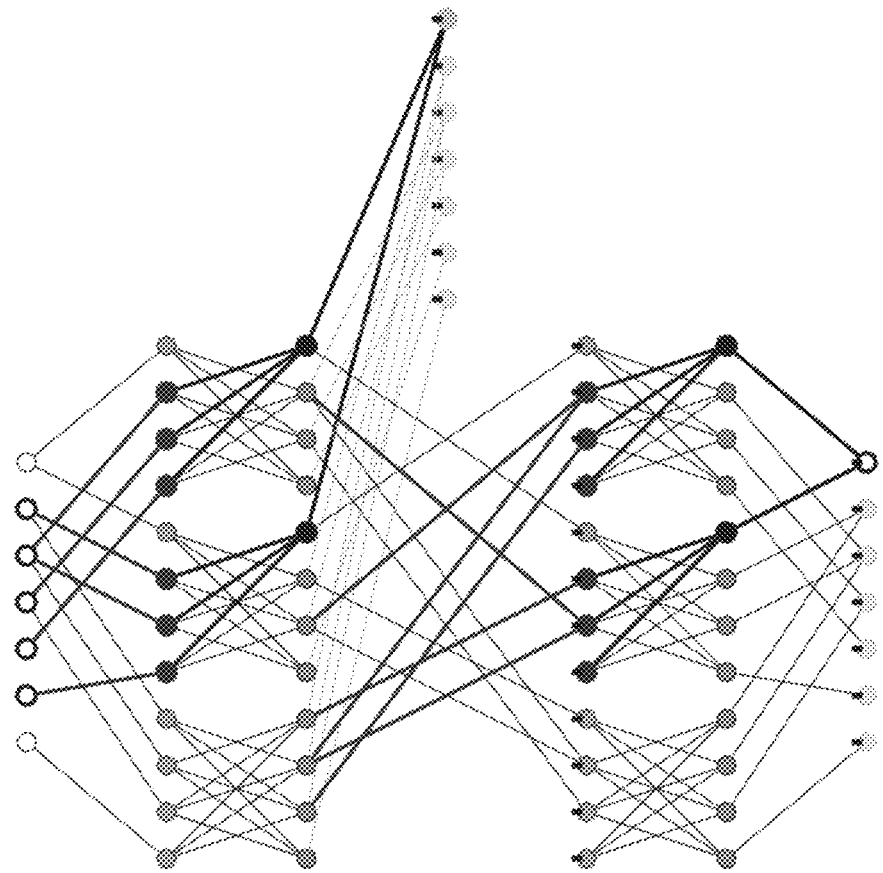
(a) Network graph of SPA-NN with nodes as edges of Tanner graph.
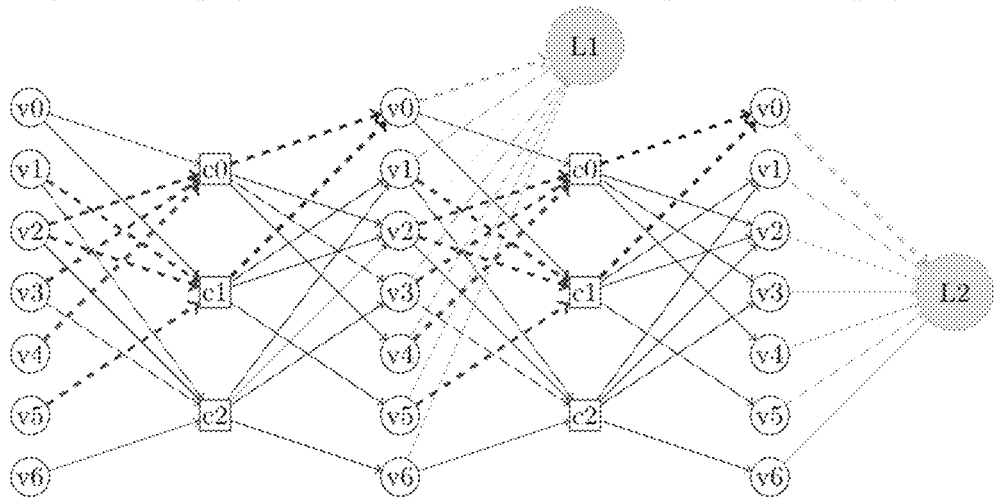
(b) *Unrolled* Tanner graph and SPA message flow for two full iteration.
Figure 3.1

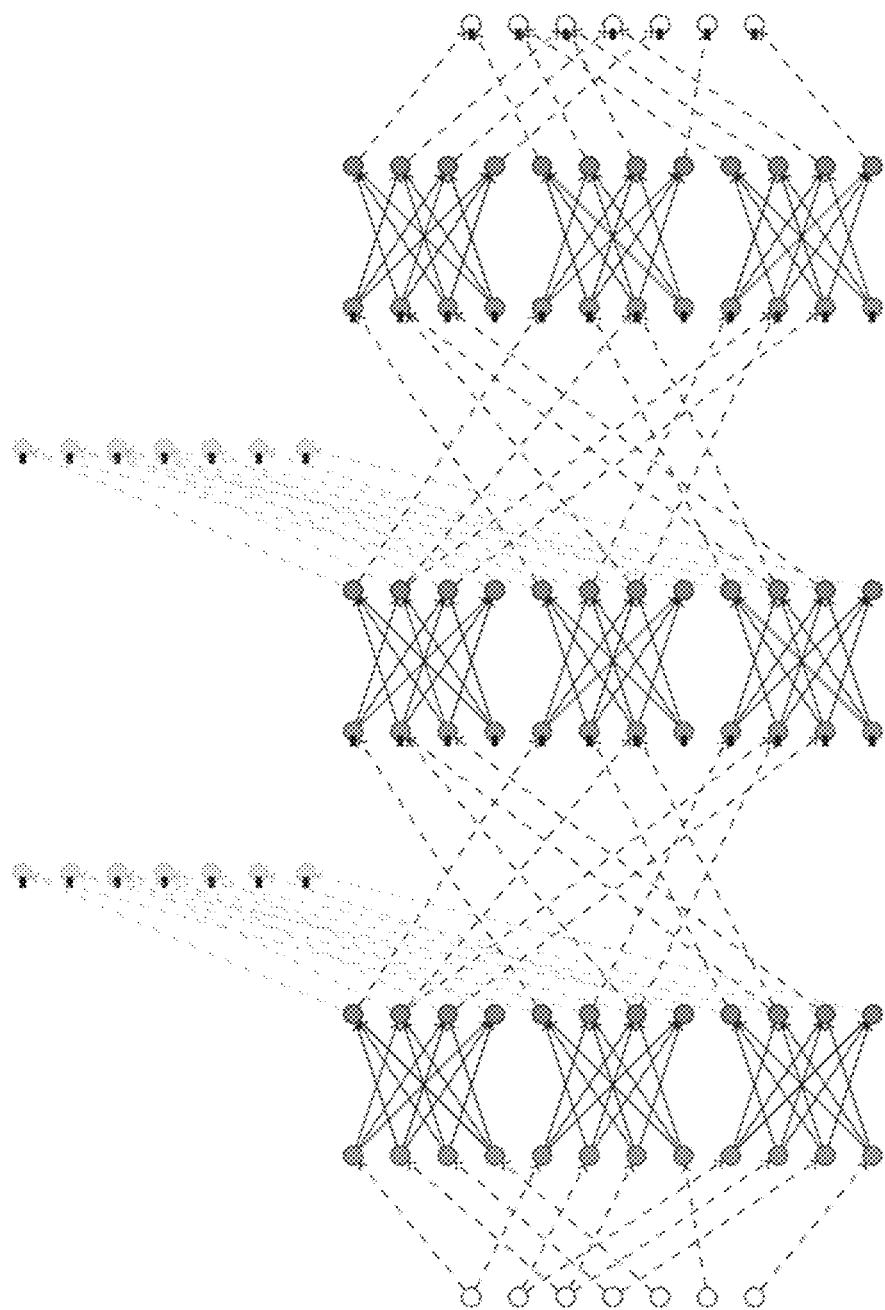
Figure 3.2

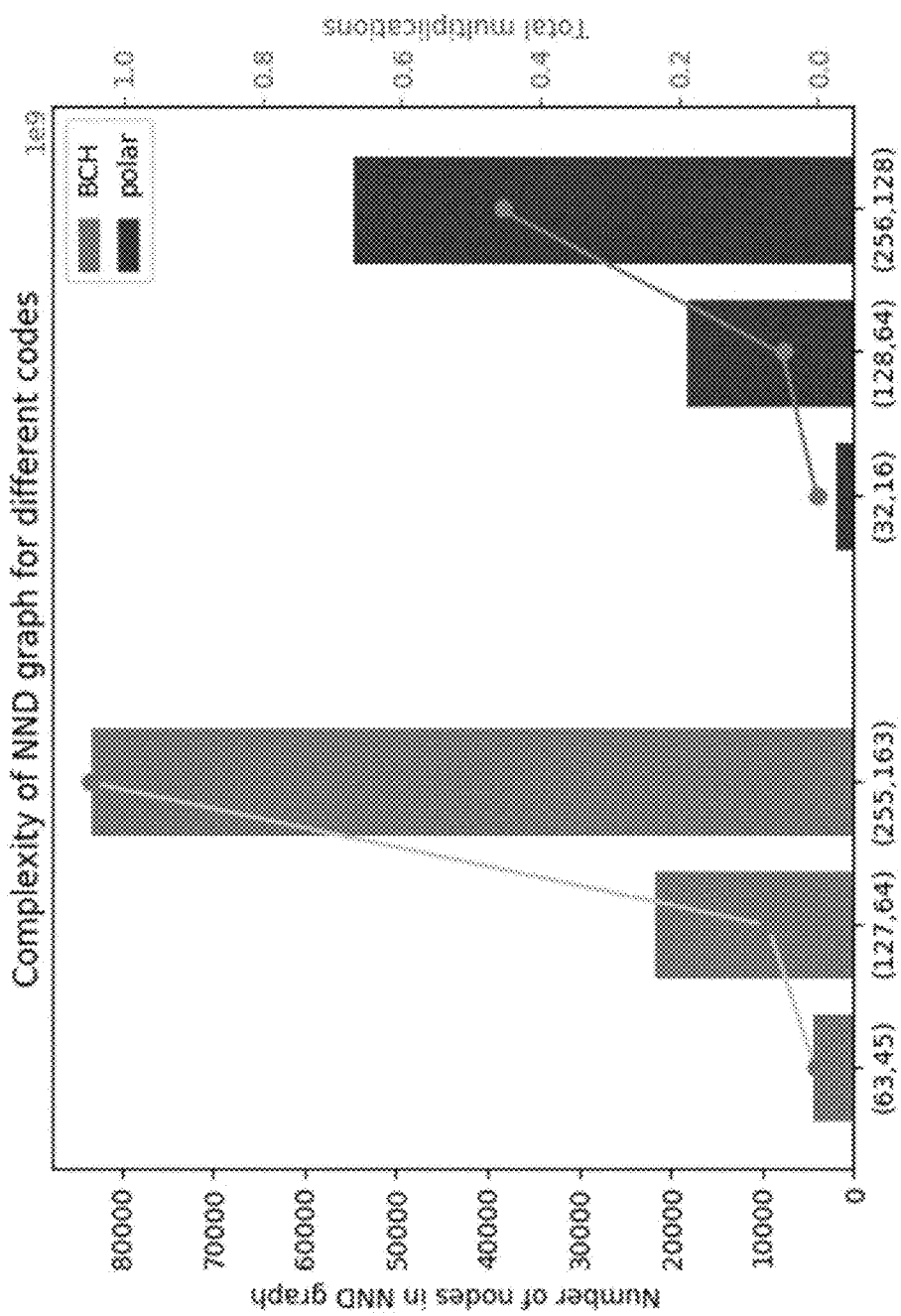
Figure 3.3

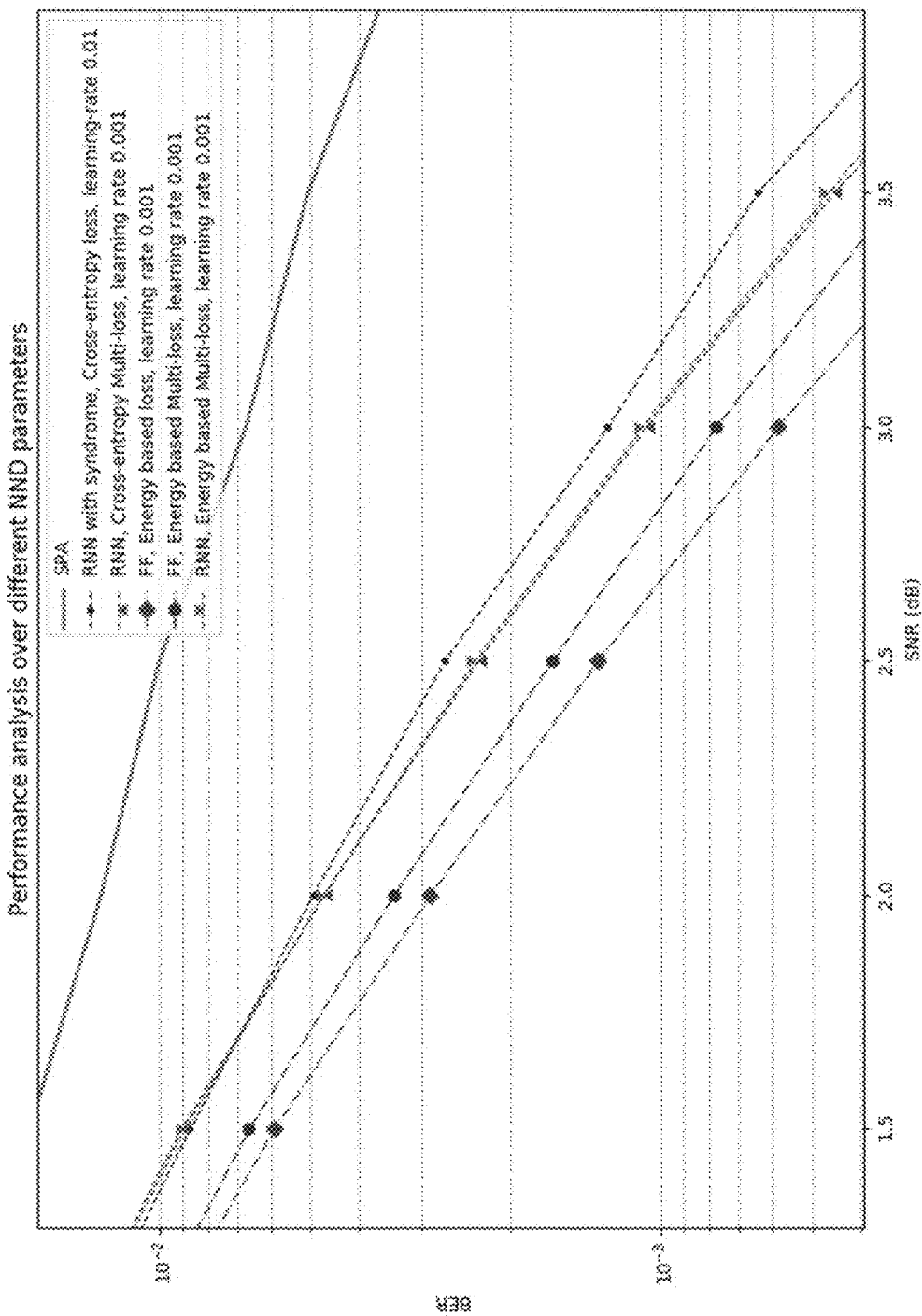
(a) Comparison of performance for different parameter settings for (32,16) polar code.
Figure 3.4

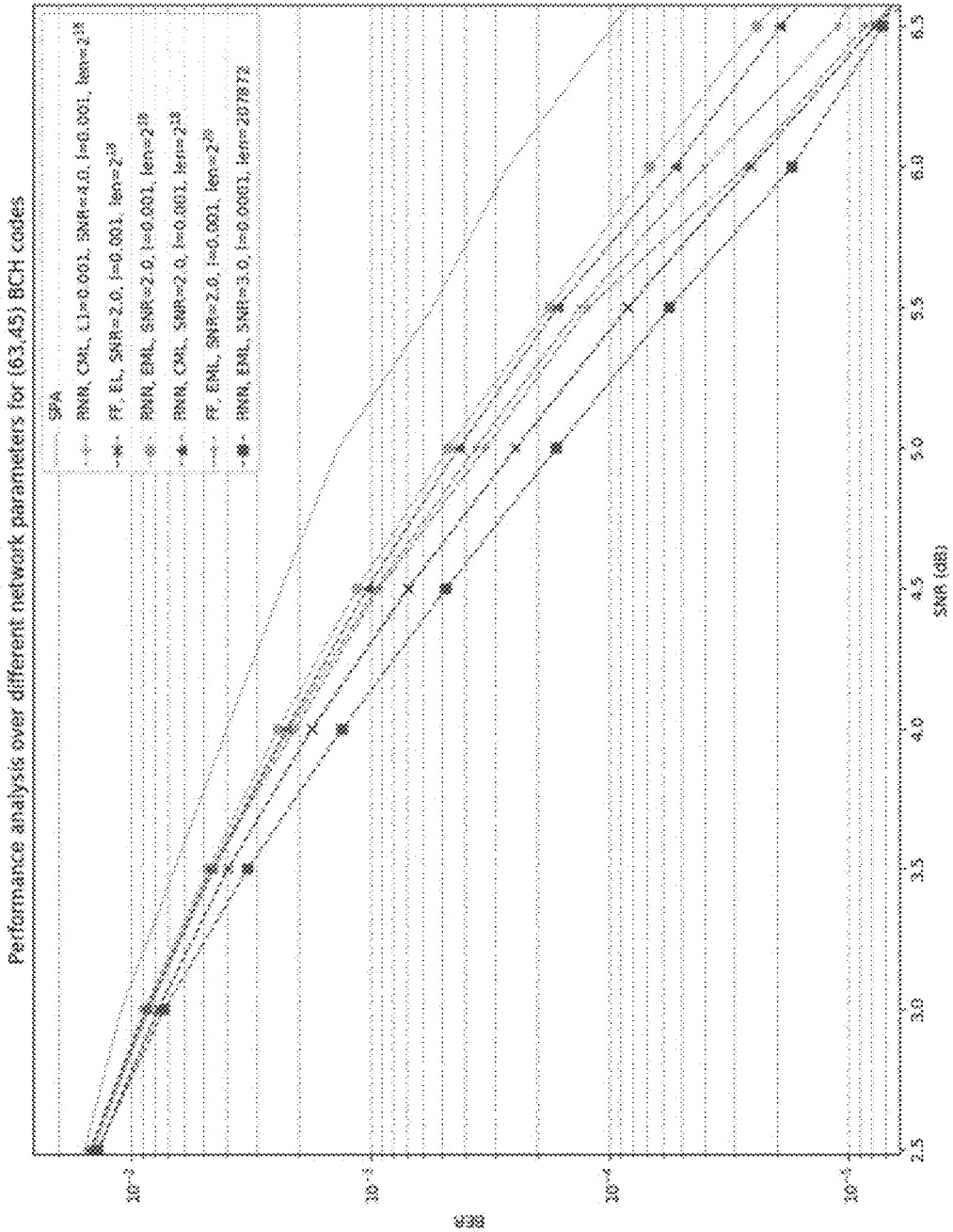
(b) Comparison of performance for different parameter settings for (63,45) BCH code.
Figure 3.4

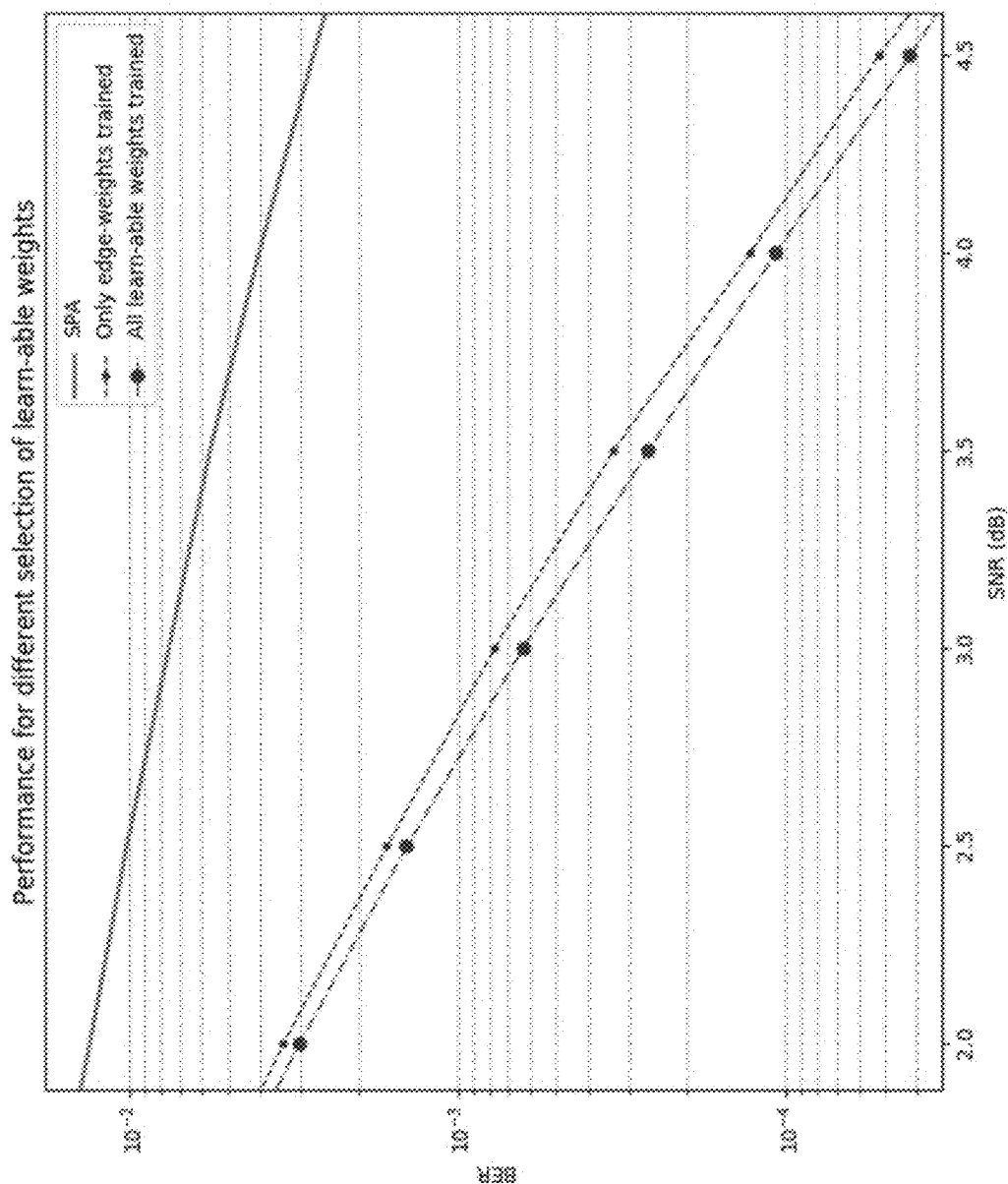
Figure 3.5

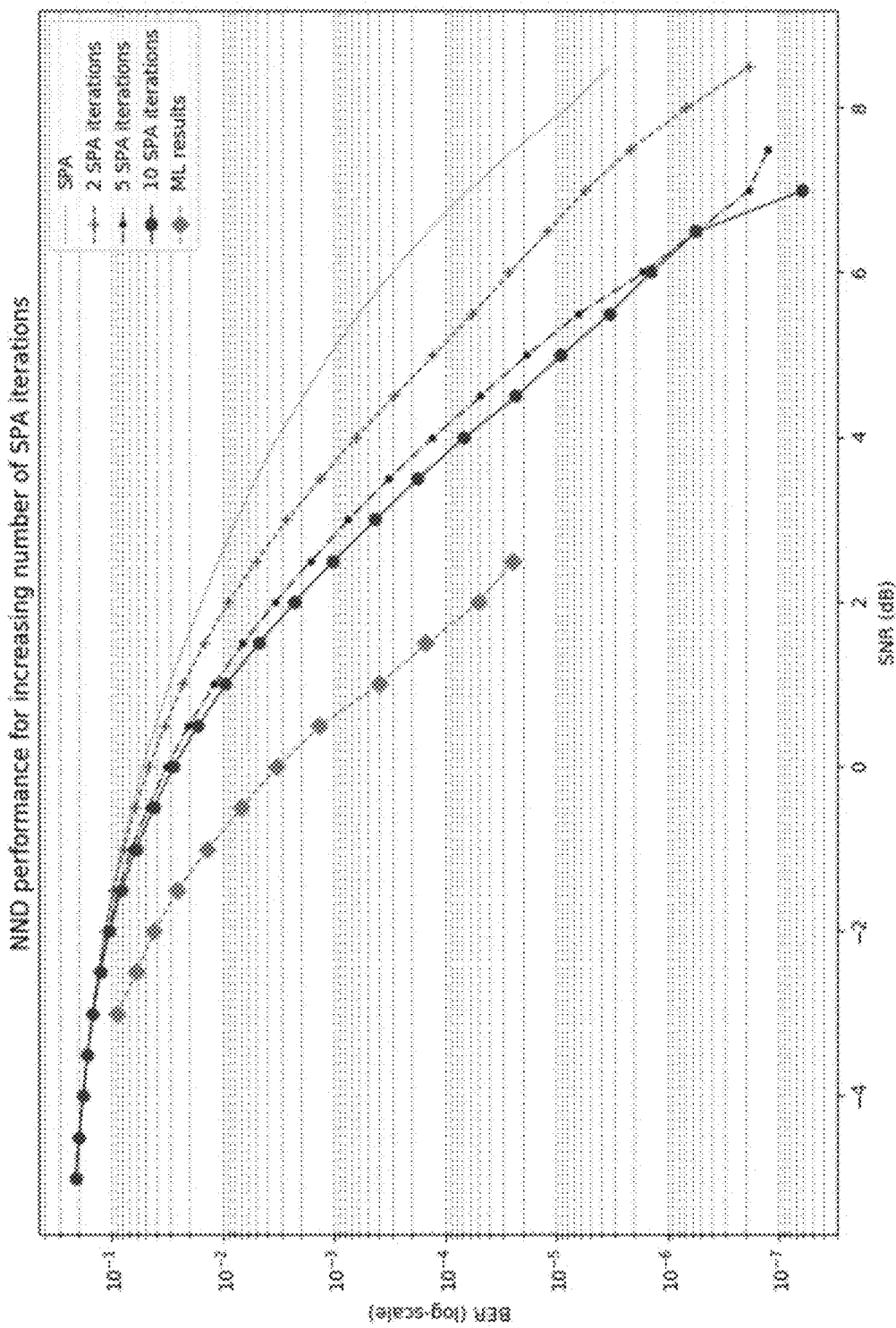
Figure 3.6

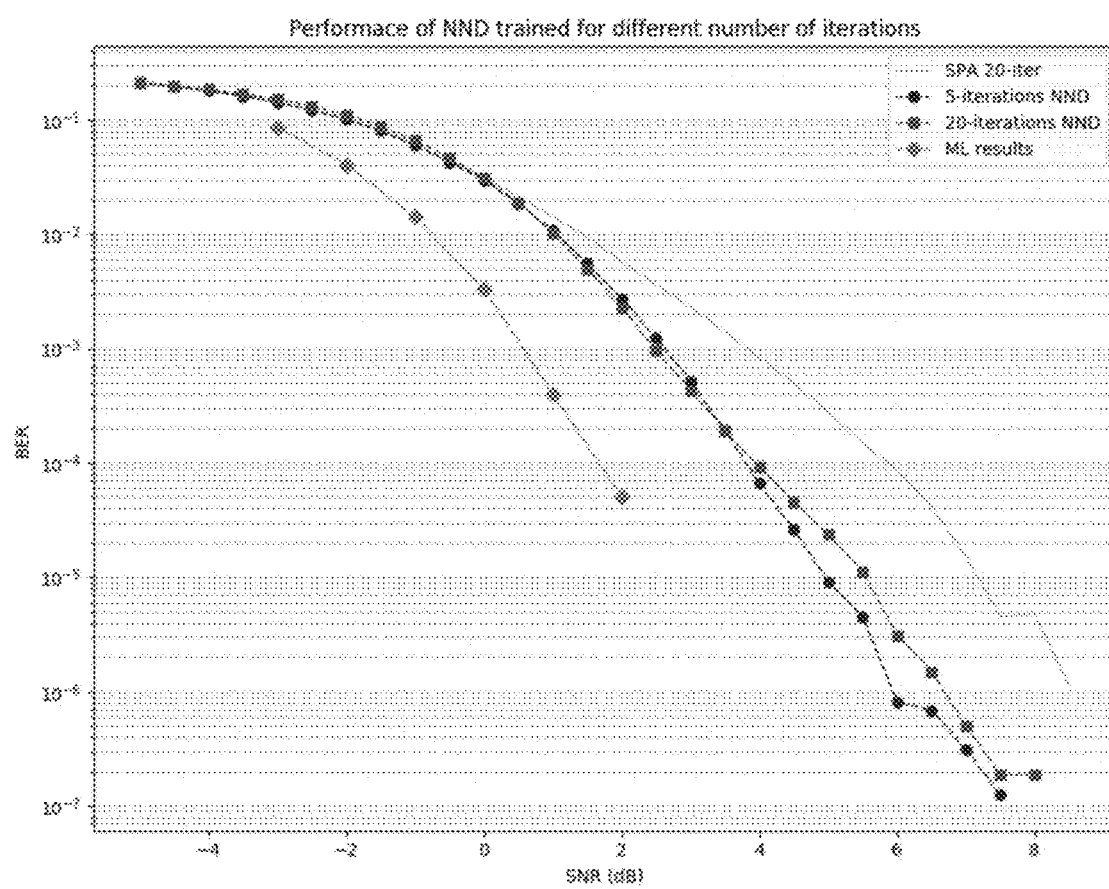
Figure 3.7

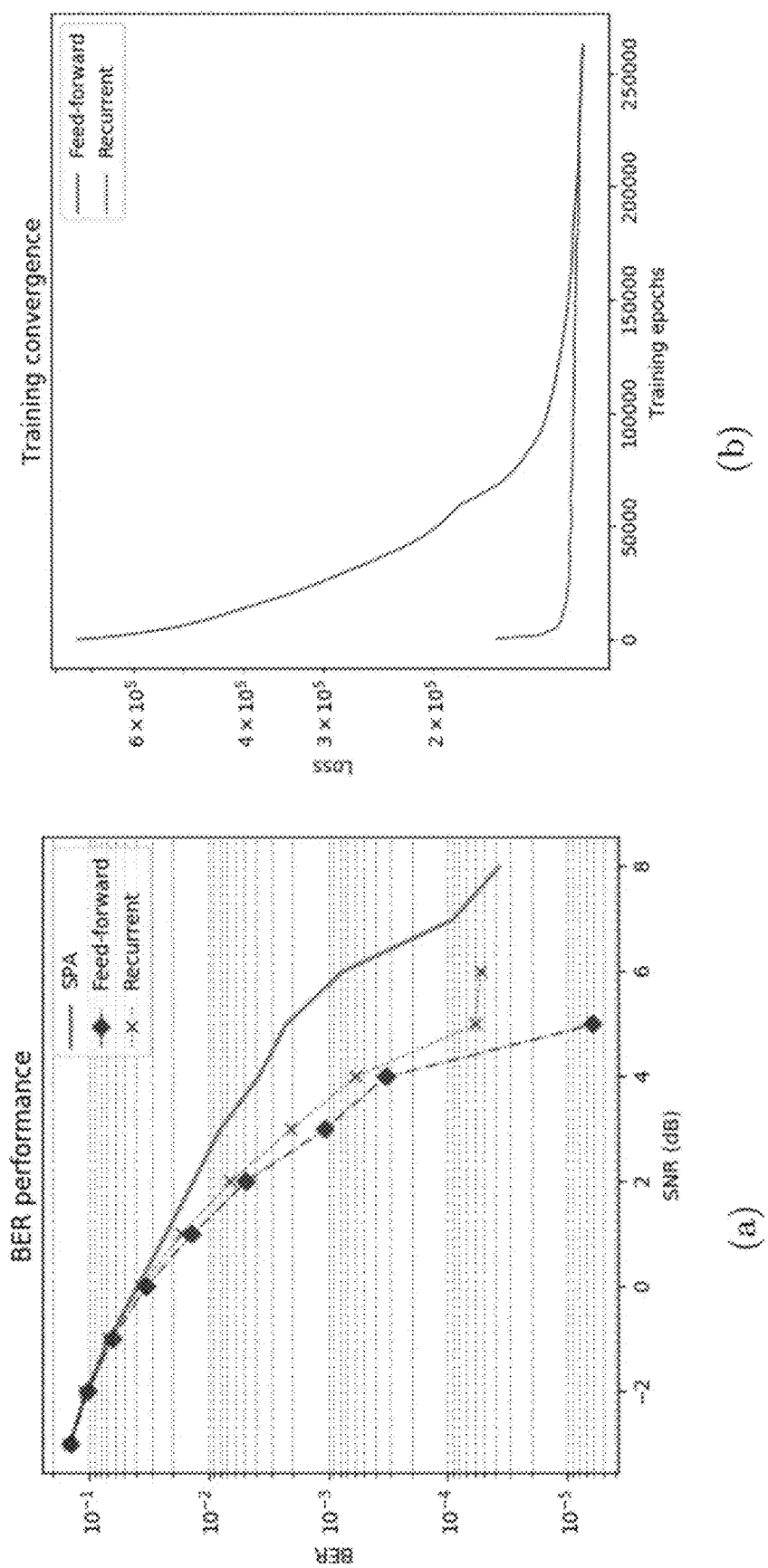
Figure 3.8

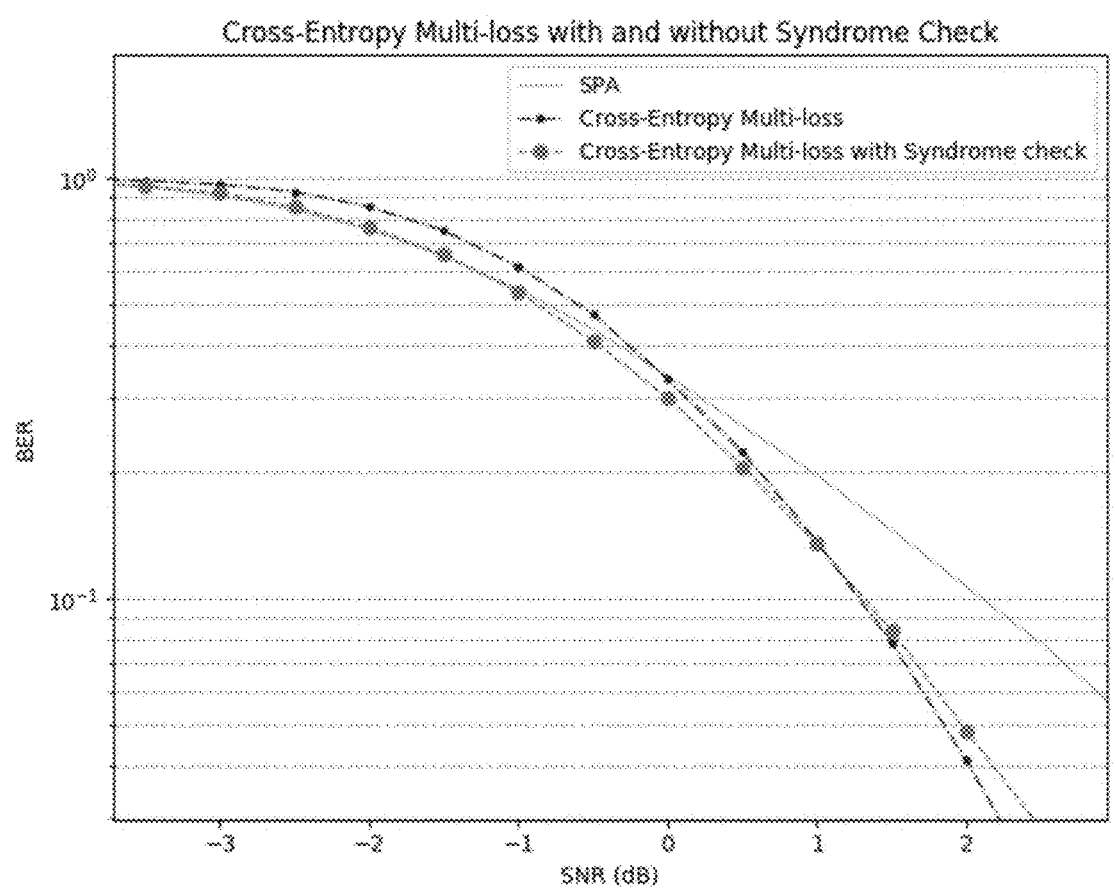
Figure 3.9

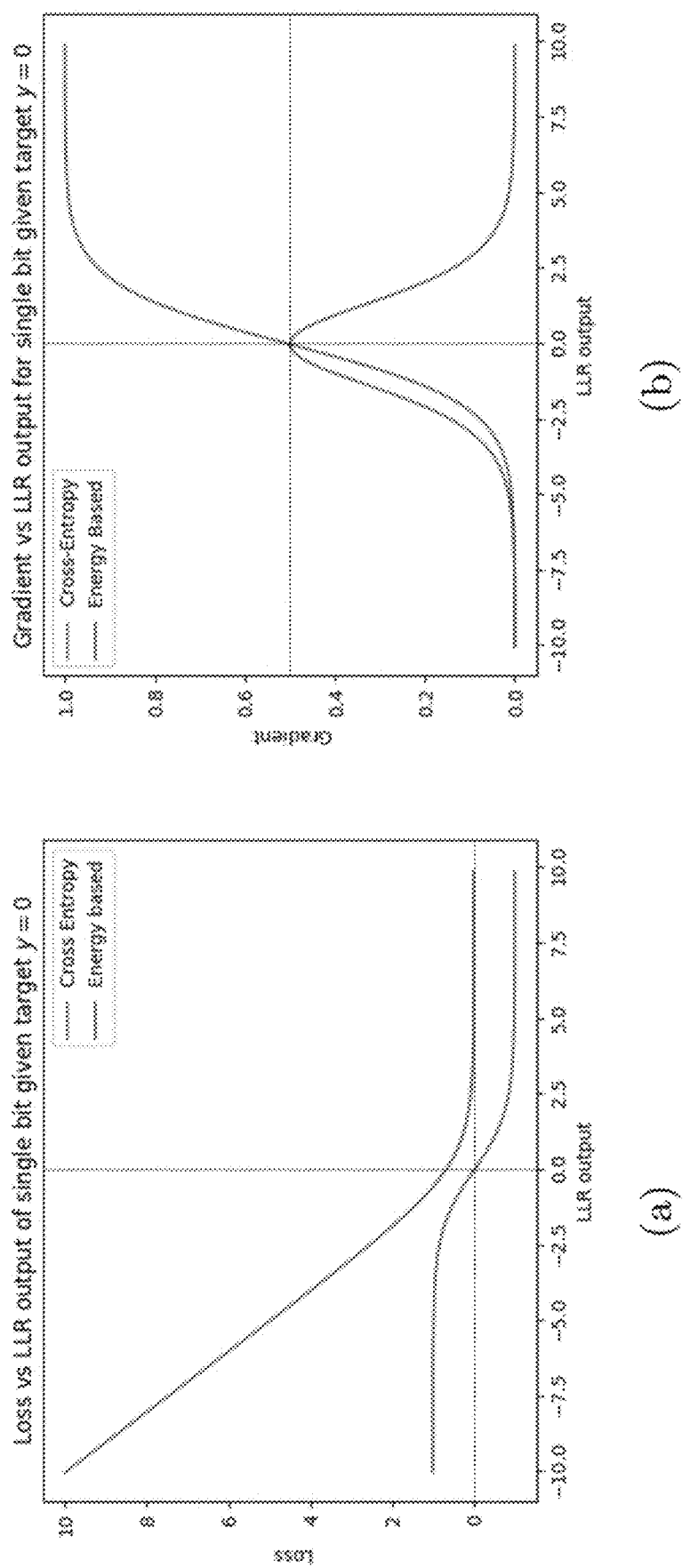
Figure 3.10

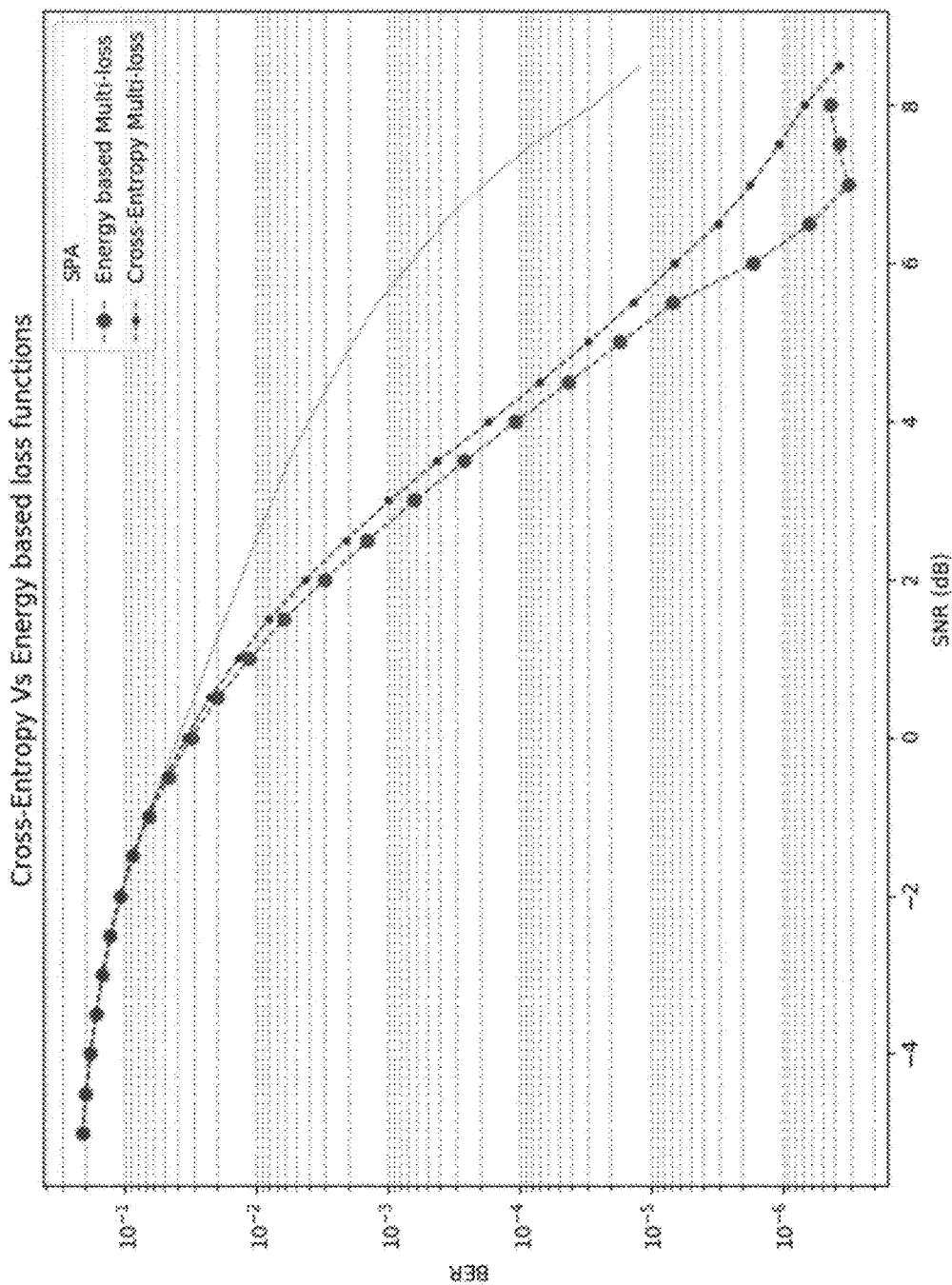
Figure 3.11

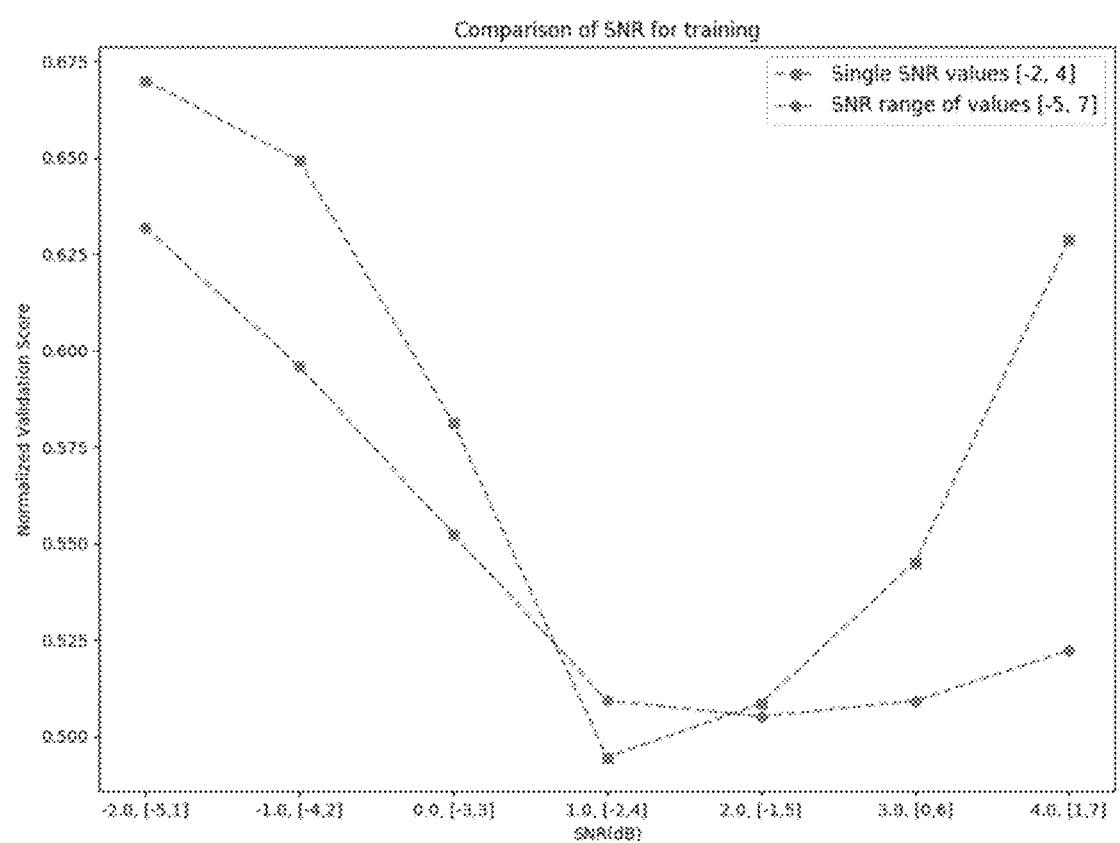
Figure 3.12

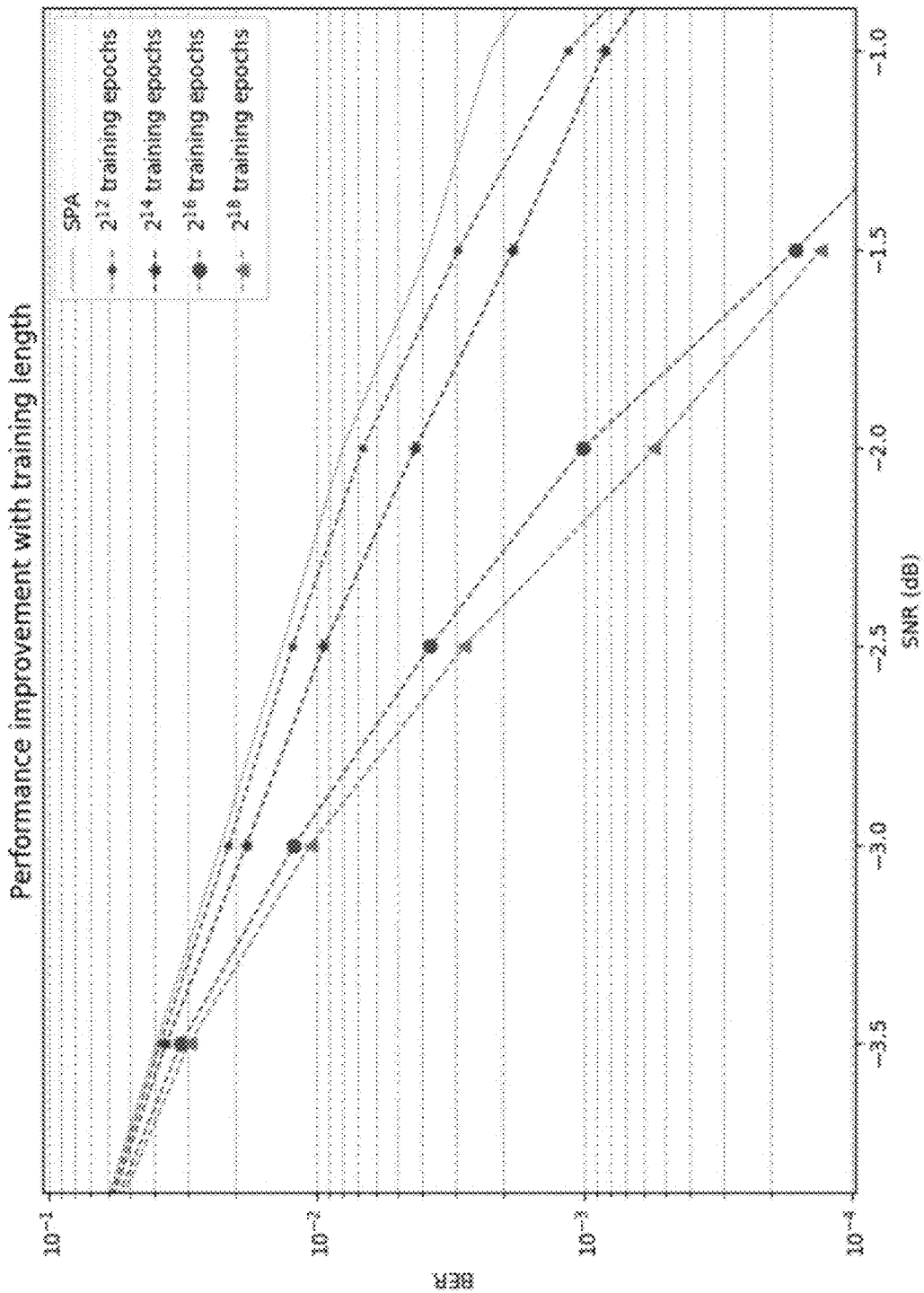
Figure 3.13

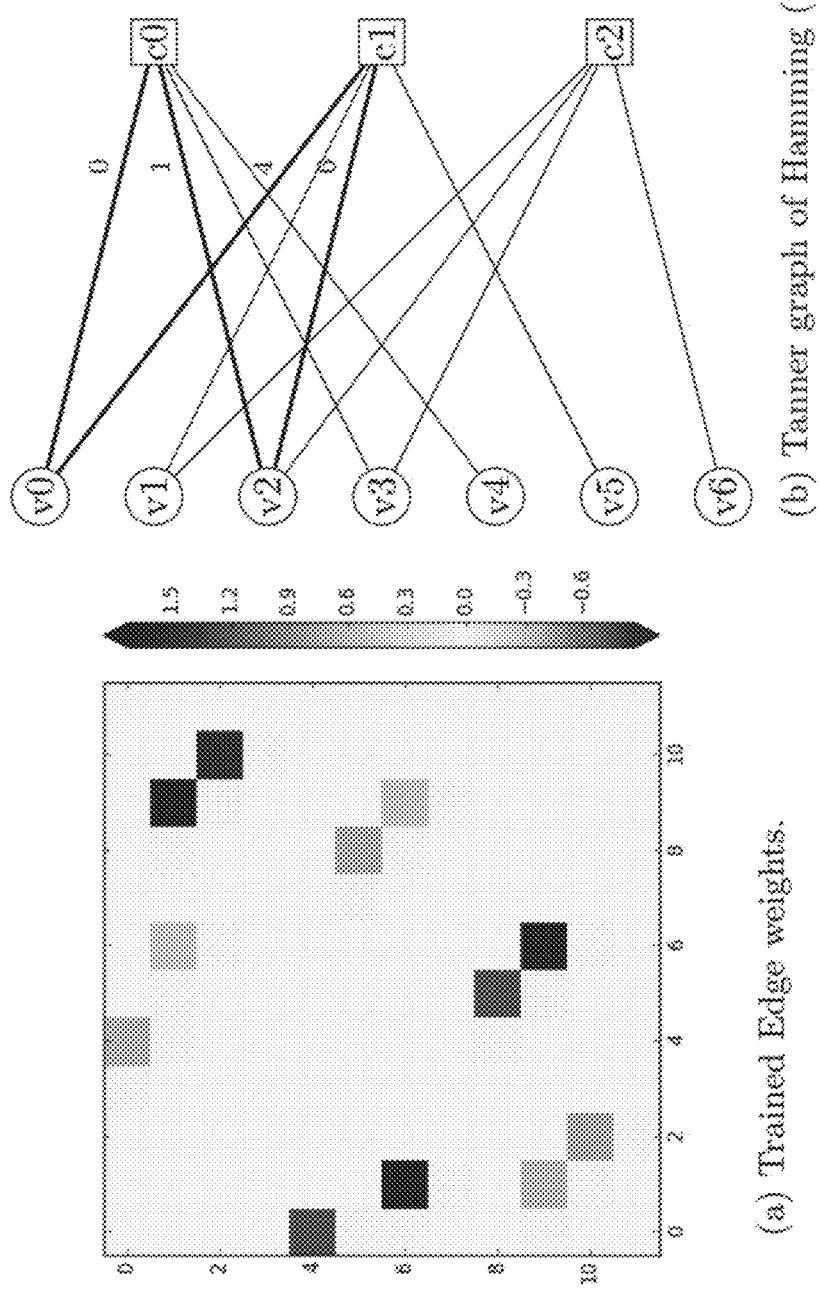
Figure 4.1

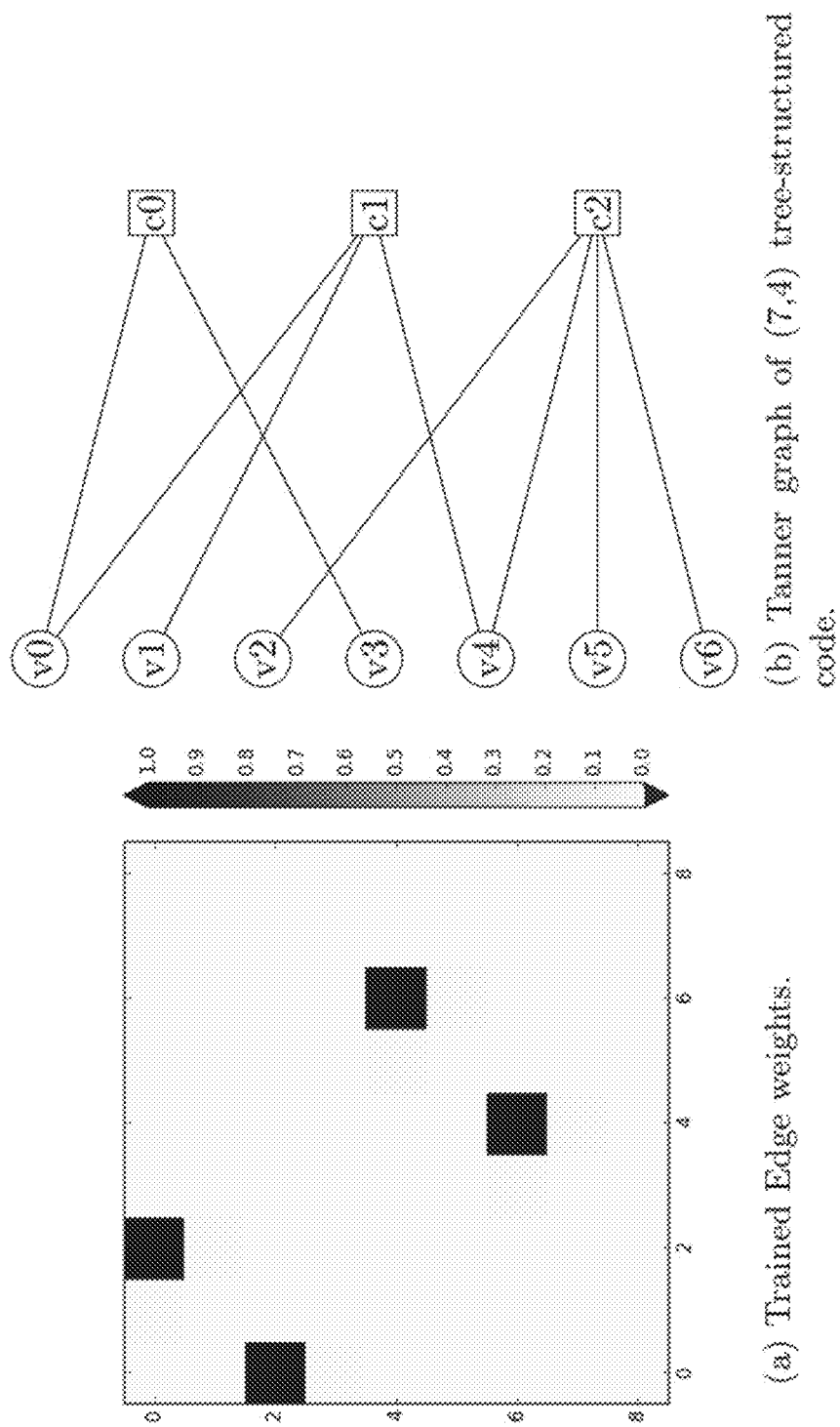
Figure 4.2

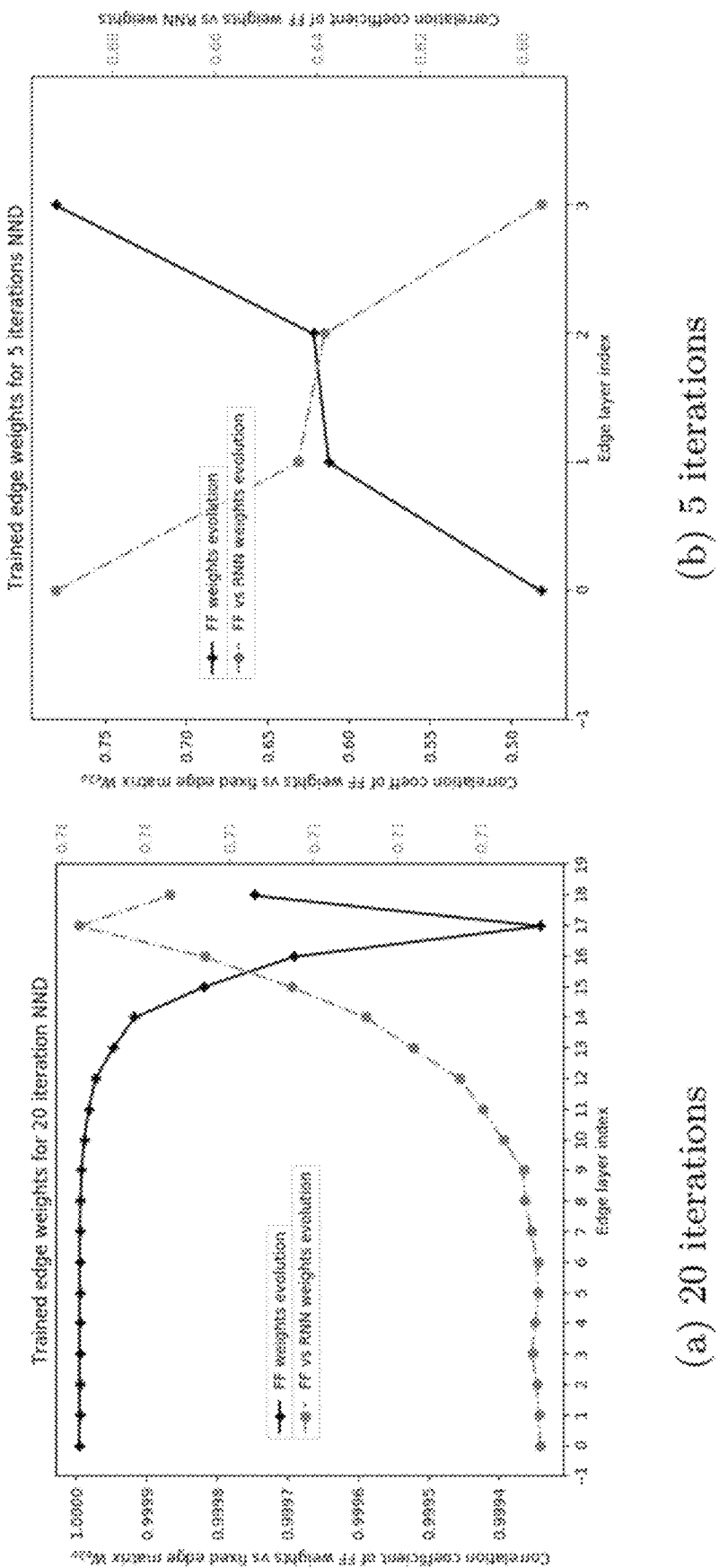
Figure 4.3

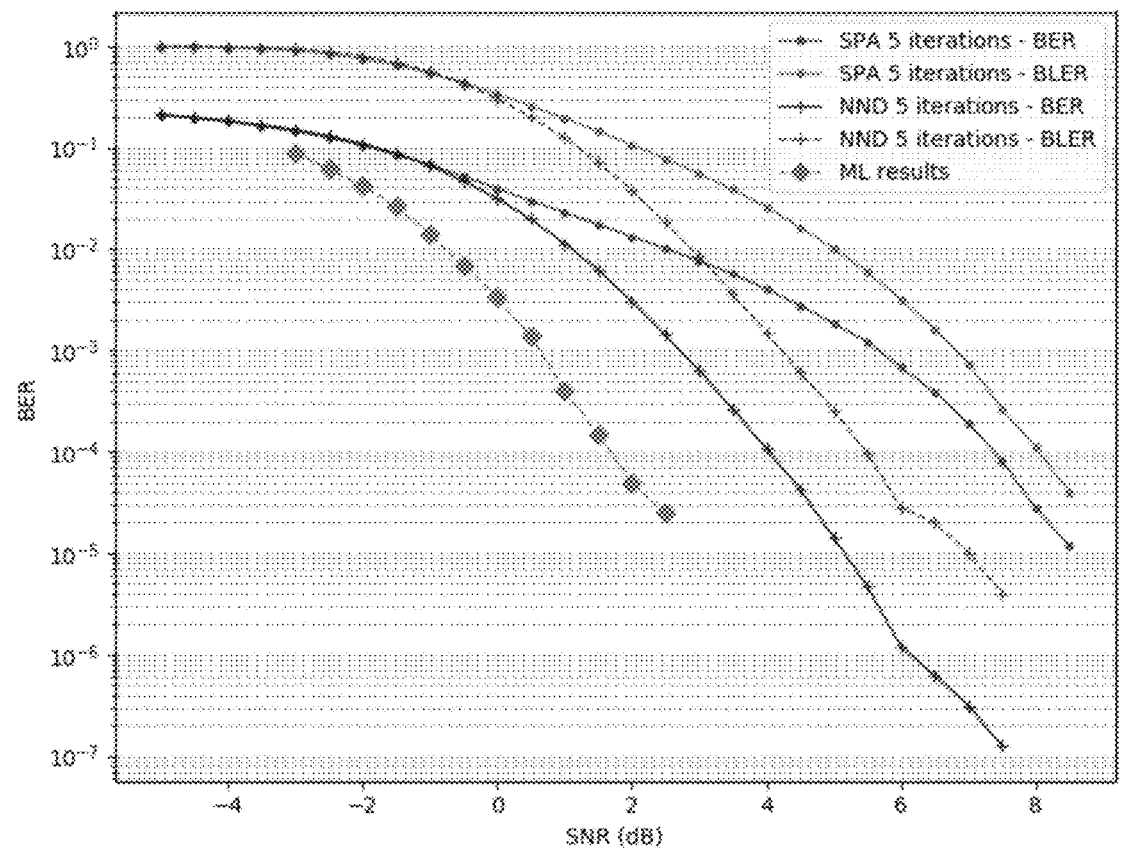
(a) BER and BLER decoding results for (32, 16) polar codes.
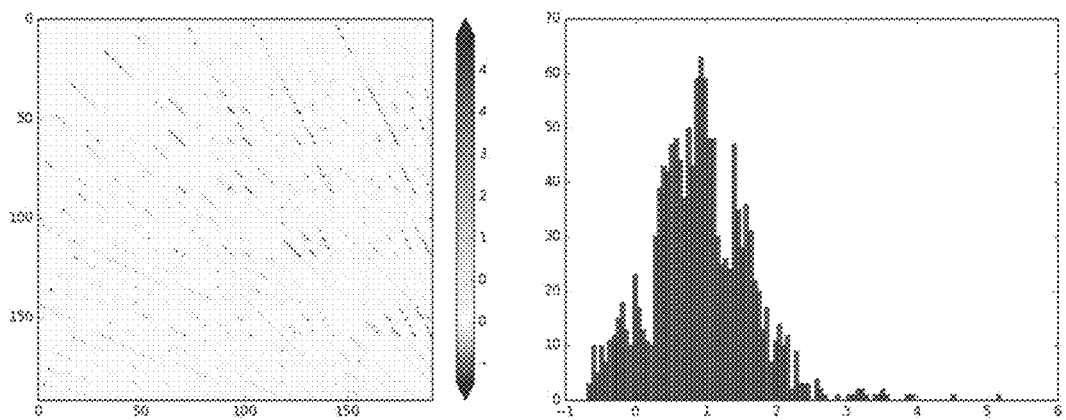
(b) Edge-Weight distribution heat-map.   (c) Edge-Weight distribution histogram.
Figure 4.4

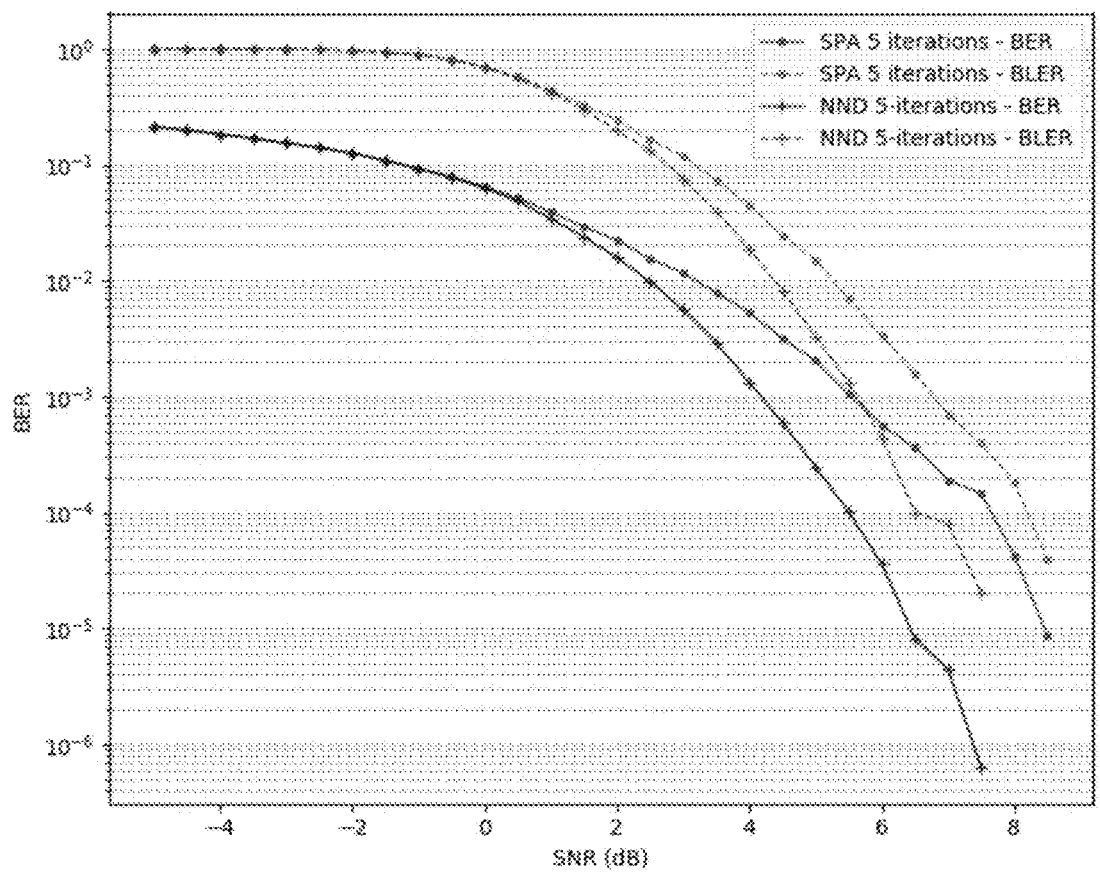
(a) BER and BLER decoding results for (32,24) polar code.
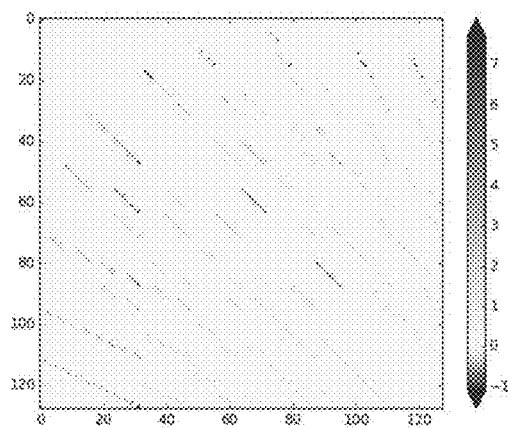
(b) Edge-Weight distribution heat-map.
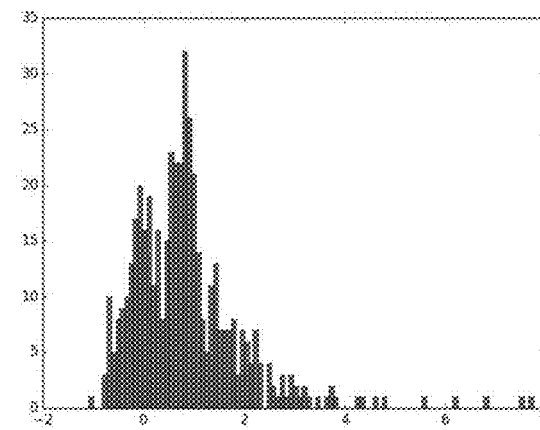
(c) Edge-Weight distribution histogram.
Figure 4.5

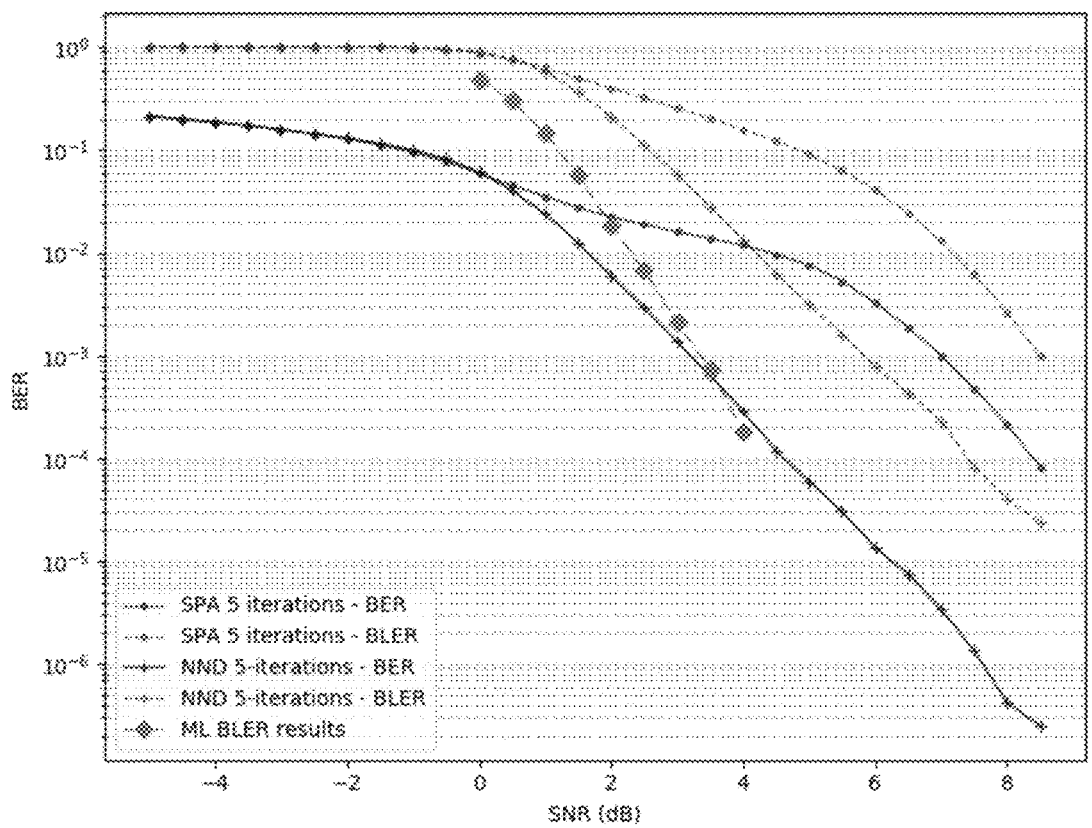
(a) BER and BLER decoding results for (128,64) polar code.
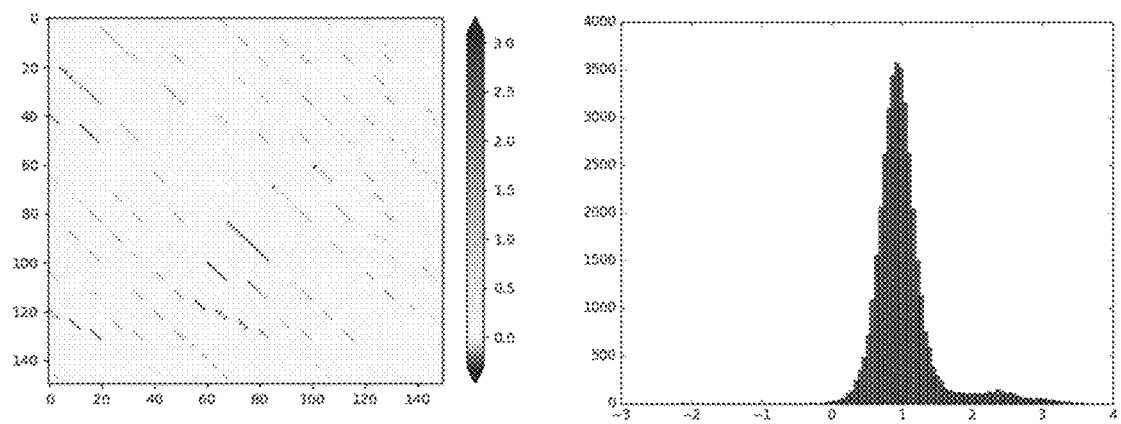
(b) Edge-Weight distribution heat-map for a 150 × 150 section.
(c) Edge-Weight distribution histogram.
Figure 4.6

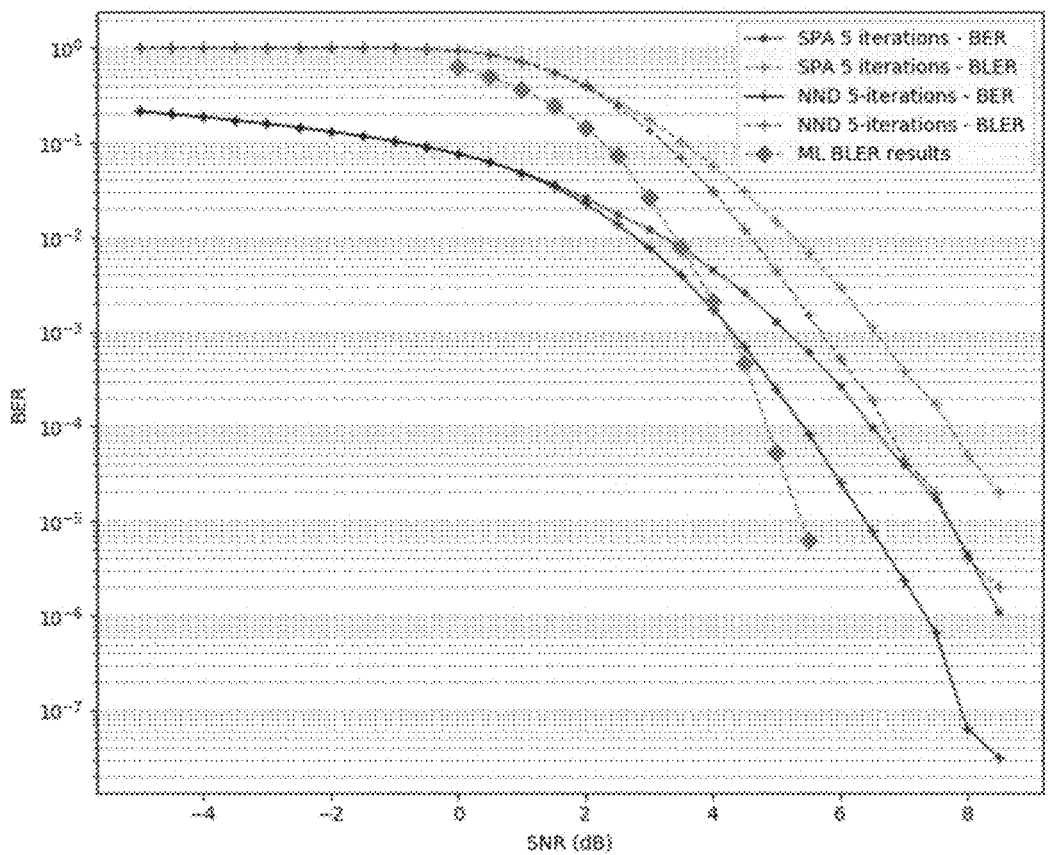
(a) BER and BLER decoding results for (63, 54) BCH code.
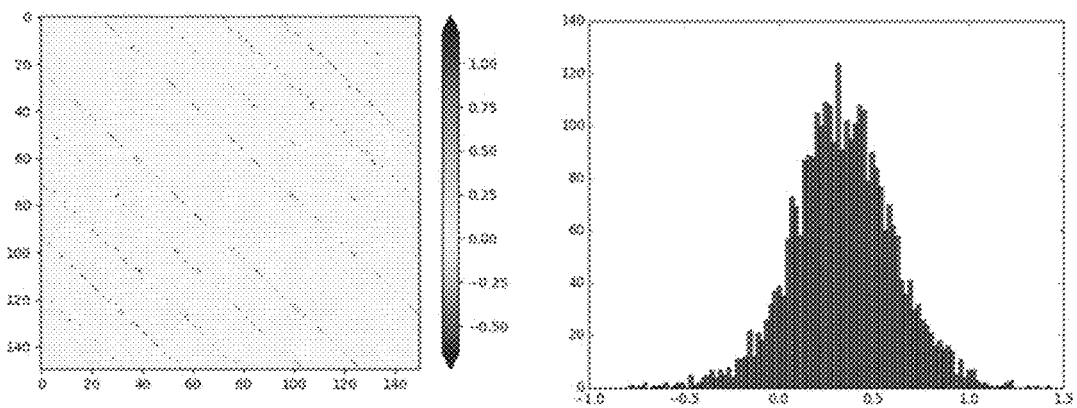
(b) Edge-Weight distribution heat-map for a 150 × 150 section.
(c) Edge-Weight distribution histogram.
Figure 4.7

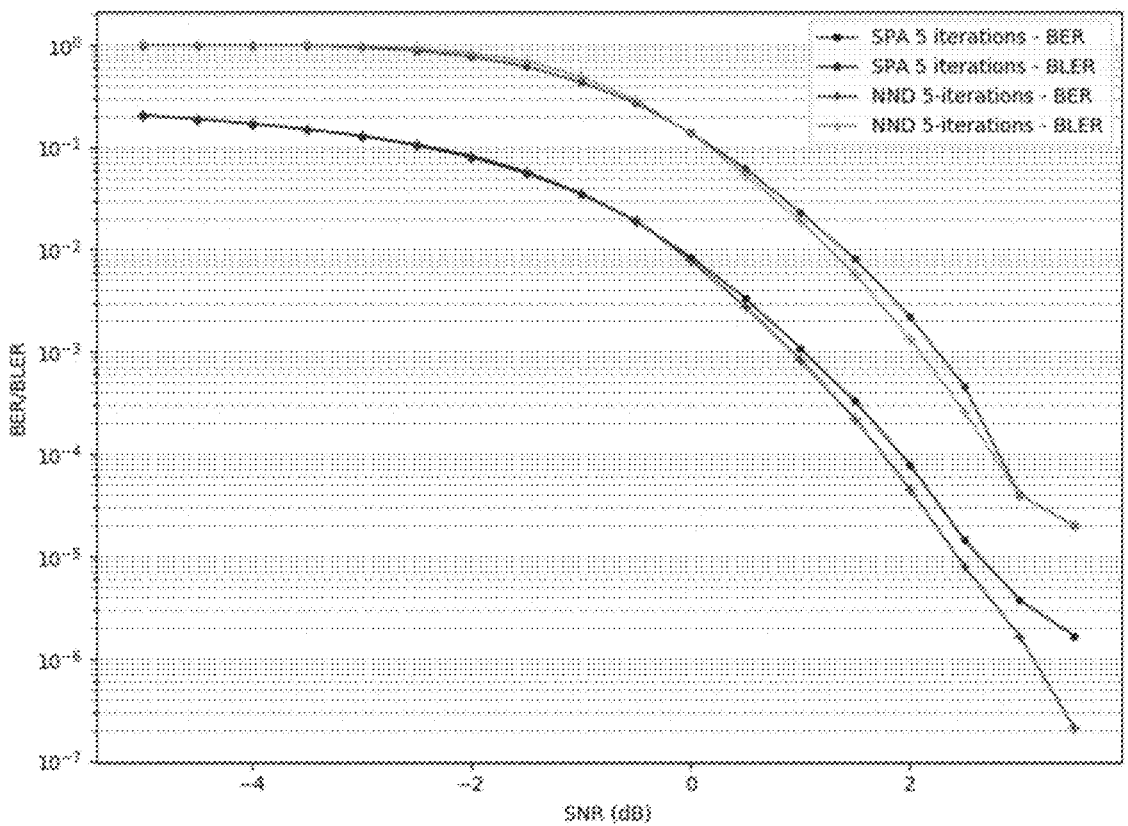
(a) BER and BLER decoding results for (96,48) LDPC code.
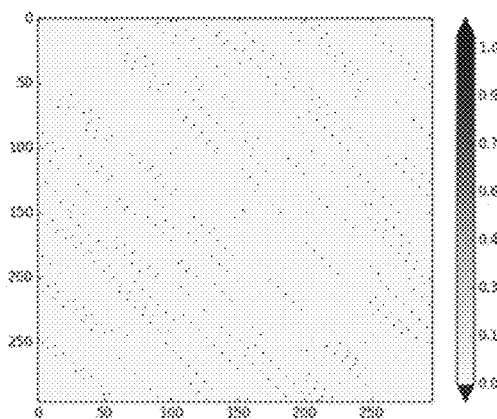
(b) Edge-Weight distribution heat-map.
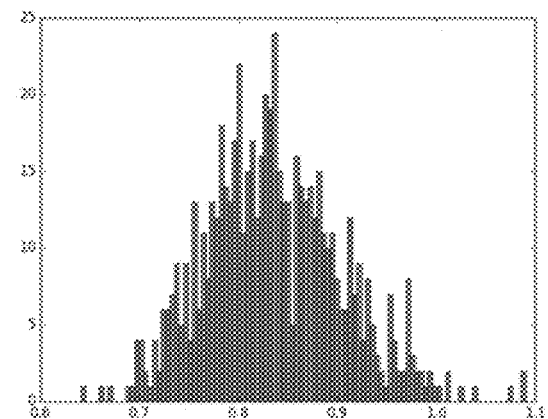
(c) Edge-Weight distribution histogram.
Figure 4.8

| Class | Parameter | Value | Typical |
|---|---|---|---|
| Design | Code | (n, k) type | (32,16) polar |
| | Parity Check Matrix | Binary Matrix | - |
| | Number of SPA iterations | Integer | 5 |
| | Network Architecture | FF or RNN | RNN |
| Weights | Train input weights ($W_{cbs}$) | True or False | False |
| | Train output weights ($W_{obs}$) | True or False | False |
| | Weights Initialization | Random or Fixed | Fixed |
| Optimization | Loss Function | Cross-entropy, Syndrome or Energy | Cross-entropy |
| | Loss Function type | Single or Multiple | Multiple |
| | Optimizer | RMSProp | RMSProp |
| | Learning Rate | float (< 1.0) | 0.001 |
| Training | Training codeword type | 0 or random | 0 |
| | SNR Training (dB) | float or array | [2.0] |
| | SNR validation (dB) | float or array | (−3, −2, ..., 8) |
| | Training Batch length | Integer | 120 |
| | Validation Batch length | Integer | 600 |
| | Total training epochs | Integer | $2^{18}$ |
| | Validate after n epochs | Integer | 500 |
| | LLR Clipping | Integer | 20 |

Figure 5

NEURAL NETWORKS FOR DECODING

CROSS REFERENCE TO RELATED APPLICATIONS

This application is a 35 U.S.C. § 371 national stage application of PCT International Application No. PCT/IB2018/056360 filed on Aug. 22, 2018, which in turns claims domestic priority to U.S. Provisional Patent Application No. 62/549,026, filed on Aug. 23, 2017, the disclosures and content of which are incorporated by reference herein in their entirety.

TECHNICAL FIELD

The present disclosure relates to a method for training a Neural Network to recover a codeword of a Forward Error Correction code from a received signal. The present disclosure also relates to a controller for training a Neural Network to recover a codeword of a Forward Error Correction code from a received signal and to a computer program for carrying out methods for training a Neural Network

BACKGROUND

Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. The steps of any methods disclosed herein do not have to be performed in the exact order disclosed, unless a step is explicitly described as following or preceding another step and/or where it is implicit that a step must follow or precede another step. Any feature of any of the embodiments disclosed herein may be applied to any other embodiment, wherever appropriate. Likewise, any advantage of any of the embodiments may apply to any other embodiments, and vice versa. Other objectives, features, and advantages of the enclosed embodiments will be apparent from the following description.

Channel coding is used in communication systems to correct errors that occur during transmission. Modern coding techniques such as turbo codes, used in 3G and 4G, and Low-Density Parity-Check (LDPC) and Polar codes, proposed for 5G, have powerful error-correcting capabilities. Linear block codes can be described by factor graphs, and such graphs are useful in devising iterative decoding algorithms.

Deep Neural networks may be used for the decoding of codes such as linear block codes. An example of existing approaches for decoding of linear block codes using deep neural networks is set out in Eliya Nachmani, Yair Be'ery, and David Burshtein, "Learning to Decode Linear Codes Using Deep Learning" (Reference 1). This approach implements Factor graph-based Sum Product Algorithm (SPA) as discussed in F. R. Kschischang, B. J. Frey, and H.-A. Loeliger. 2006, Factor graphs and the sum-product algorithm. IEEE Trans. Inf. Theor. 47, 2 (September 2006), 498-519 (Reference 3). For certain families of codes (such as BCH or Polar codes) of small to medium length (~10 to ~100 bits), the SPA performs poorly owing to the presence of many cycles and trapping sets in the code's factor graph. A Neural Network Decoder (NND) performs better than SPA for such codes. The NND learns to reduce the effect of artifacts, such as cycles or trapping sets in the graph structure, by applying complimentary weights to the messages passed over edges of the graph which form cycles. Weights are learned through a training process. Training parameters such as Input variables, Target variables, Loss function, Regularization, and Optimizer etc., affect the performance of the network during its online phase. In existing approaches, training is performed using "Cross entropy" loss function. Jehoshua Bruck and Mario Blaum, "Neural Networks, error-correcting codes, and polynomials over the binary n-cube", IEEE Transactions on Information Theory, 35(5):976-987, 1988 (Reference 2) introduces the idea of decoding linear block codes using an energy function.

There currently exist certain challenges in the training of NNDs, including, but not limited to, the following. The NND introduced in Reference 1 uses the cross-entropy loss function in its training process. The cross-entropy loss function performs Maximum Likelihood (ML) estimation of the model parameters, such that the estimated probability distribution of the model output reaches close to the empirical probability distribution of the training data (in terms of Kullback-Leibler distance, see also Ian Goodfellow, Yoshua Benigo, and Aaron Courville, "Deep Learning", Cambridge, Mass.: MIT, 2016). However, the training process in NND only allows the network to be trained on a sub-set of data. This leads to loss in performance over a set of data not yet seen by the network. Training also comprises a certain range of values of Signal to Noise Ratio (SNR). At very high SNR, the effect of Added White Gaussian Noise (AWGN) is negligible, leading to no or minor errors in received codeword. At very low SNR, noise will corrupt most of the codewords. When training NND it is important that the network only sees corrupted input codewords that are resolvable to correct codewords by using the redundancies implicit in the factor graph structure but could not be resolved by SPA alone due to its artefacts. Such inputs can only be obtained (with high probability) in a moderate SNR regime. The NND shows loss in performance at low SNR, when trained using cross-entropy loss function on data generated using high SNR. In addition, the cross-entropy loss function trains the weights of the NND in such a way that some weights might be "pinned" to an extreme value. This occurs as a consequence of the steep gradient of the cross entropy loss function (as discussed in greater detail below with reference to FIG. 4). This potential for pinning to extreme values is a disadvantage of the cross-entropy loss function. Existing approaches to training additionally propose training parameters that lead to reduction in Bit-Error-Rate (BER), but do not provide any explicit method for reducing Block-Error-Rate (BLER). In general, for successful decoding, complete an entire block needs to be correctly decoded.

Certain aspects of the present disclosure and their embodiments may provide solutions to these or other challenges. According to certain embodiments, a new loss function (also referred to as a loss metric) for training a neural network decoder is proposed. The loss metric is based on the idea of decoding linear block codes using an energy function, which was introduced by Reference 2. Maximizing the energy function leads to a ML decoding solution for a linear block code. In application to neural networks, some of the constraints on variables of this energy function are relaxed. The loss function is designed by approximating the estimated binary values of the bits of a recovered codeword with their probabilities in a real number domain.

Thus, according to certain embodiments, there is proposed a novel loss metric to train the neural network algorithm designed for decoding using SPA. As compared to standard loss metrics described in prior approaches such as those referenced above, examples of the metric proposed herein seek to improve performance for an entire range of SNR values, including SNR values not yet seen by the NN. Although cross-entropy loss function provides ML solution for model parameters, it does so for the training data provided. The loss metric proposed herein is more problem-specific, and provides a solution that is more generally-applicable to the problem at hand.

There are, proposed herein, various embodiments which address one or more of the issues disclosed herein. The solutions proposed herein may be embodied in any radio receiver, including, for instance, eNB, UE, or cloud implementation, in particular for short message communications.

According to a first aspect of the present disclosure, there is provided a method for training a Neural Network (NN) to recover a codeword of a Forward Error Correction (FEC) code from a received signal, wherein layers of the NN implement sequential iterations of the Sum Product Algorithm (SPA) and wherein the received signal comprises a transmitted codeword and channel impairments. The method comprises inputting to an input layer of the NN a representation of message bits of a transmitted codeword obtained from a received signal and propagating the representation through the NN. The method further comprises calculating a loss function, and optimising trainable parameters of the NN to minimise the loss function. Calculating a loss function according to this aspect of the present disclosure comprises, for bits in the transmitted codeword, representing an estimated value of the message bit output from the NN as a probability of the value of the bit in a predetermined real number domain, and multiplying the representation of the estimated value of the message bit by a representation of a target value of the message bit.

According to examples of the present disclosure, the channel impairments may comprise added noise, such as for example Added White Gaussian Noise (AWGN), fading and/or interference.

According to examples of the present disclosure a target value of the message bit may comprise the actual value (1 or 0 in the binary case) of the message bit of the transmitted codeword.

According to examples of the present disclosure, calculating a loss function may further comprise averaging, over all bits in the transmitted codeword, the values obtained from multiplying, for bits in the transmitted codeword, the representation of the estimated value of the message bit by a representation of a target value of the message bit.

According to examples of the present disclosure, representing an estimated value of the message bit output from the NN as a probability of the value of the bit in a real number domain may comprise obtaining a probability of the value of the bit from a layer of the NN, and transforming the obtained probability to a value within the predetermined real number domain.

According to examples of the present disclosure, the predetermined real number domain may be [−1, 1] and transforming the obtained probability to a value within the predetermined real number domain may comprise performing a linear transformation on the obtained probability.

According to examples of the present disclosure, the representation of the target value of the message bit may comprise a value of the message bit after modulation using a modulation technique applied to the transmitted codeword.

According to examples of the present disclosure, calculating a loss function may comprises calculating the loss function on the basis of an estimated value of the message bit output from an output layer of the NN.

According to examples of the present disclosure, the loss function may comprise:

$$L_f^E(p, y) = \frac{-1}{N} \sum_{n=1}^{N} ((1 - 2p(n))(-1)^{y(n)})$$

wherein:
N is the number of bits in the transmitted codeword;
p(n) is the probability of the value of the $n^{th}$ bit of the transmitted codeword output by the NN being 1; and
y(n) is the target value of the $n^{th}$ bit of the transmitted codeword.

According to examples of the present disclosure, calculating a loss function may comprise calculating the loss function on the basis of estimated values of the message bit output from even layers of the NN.

According to examples of the present disclosure, the loss function may comprise:

$$L_M^E(p, y) = \frac{-1}{MN} \sum_{l=2,4,\ldots}^{2M} \left( \sum_{n=1}^{N} ((1 - 2p(l, n))(-1)^{y(n)}) \right)$$

wherein:
N is the number of bits in the transmitted codeword;
2M is the number of hidden layers in the NN;
p(n) is the probability of the value of the nth bit of the transmitted codeword output by the l-th layer of the NN being 1; and
y(n) is the target value of the nth bit of the transmitted codeword.

According to examples of the present disclosure, the training codeword may comprise a codeword of a binary linear block code.

According to examples of the present disclosure, the representation of message bits obtained from a received signal that is input to the input layer of the NN may comprise an array of Log-Likelihood Ratios (LLRs) of the individual message bits obtained from the received signal. According to examples of the present disclosure, the LLRs of the individual message bits obtained from the received signal may be calculated using the formula: log(p(b[n]=0) p(b[n]=1)).

According to examples of the present disclosure, the NN may comprise a Neural Network Decoder (NND).

According to another aspect of the present disclosure, there is provided a computer program comprising instructions which, when executed on at least one processor, cause the at least one processor to carry out a method according to any one of the preceding aspects or examples of the present disclosure.

According to another aspect of the present disclosure, there is provided a carrier containing a computer program according to the preceding aspect of the present disclosure, wherein the carrier comprises one of an electronic signal, optical signal, radio signal or computer readable storage medium.

According to another aspect of the present disclosure, there is provided a computer program product comprising non transitory computer readable media having stored thereon a computer program according to a preceding aspect of the present disclosure.

According to another aspect of the present disclosure, there is provided a controller for training a Neural Network (NN) to recover a codeword of a Forward Error Correction (FEC) code from a received signal, wherein layers of the NN implement sequential iterations of the Sum Product Algorithm (SPA), and wherein the received signal comprises a transmitted codeword and channel impairments. The controller comprises a processor and a memory. The memory contains instructions executable by the processor such that the controller is operable to input to an input layer of the NN a representation of message bits of a transmitted codeword obtained from a received signal and propagate the representation through the NN. The controller is further operable to calculate a loss function and optimise trainable parameters of the NN to minimise the loss function. Calculating a loss function according to this aspect of the present disclosure comprises, for bits in the transmitted codeword, representing an estimated value of the message bit output from the NN as a probability of the value of the bit in a predetermined real number domain and multiplying the representation of the estimated value of the message bit by a representation of a target value of the message bit.

According to examples of the present disclosure, the channel impairments may comprise added noise, such as for example Added White Gaussian Noise (AWGN), fading and/or interference.

According to examples of the present disclosure, the controller may be further operable to carry out a method according to any one of the preceding aspects or examples of the present disclosure.

According to another aspect of the present disclosure, there is provided a controller for training a Neural Network (NN) to recover a codeword of a Forward Error Correction (FEC) code from a received signal, wherein layers of the NN implement sequential iterations of the Sum Product Algorithm (SPA) and wherein the received signal comprises a transmitted codeword and channel impairments. The controller is adapted to input to an input layer of the NN a representation of message bits of a transmitted codeword obtained from a received signal and to propagate the representation through the NN. The controller is further adapted to calculate a loss function and optimise trainable parameters of the NN to minimise the loss function. Calculating a loss function according to this aspect of the present disclosure comprises, for bits in the transmitted codeword, representing an estimated value of the message bit output from the NN as a probability of the value of the bit in a predetermined real number domain, and multiplying the representation of the estimated value of the message bit by a representation of a target value of the message bit.

According to examples of the present disclosure, the channel impairments may comprise added noise, such as for example Added White Gaussian Noise (AWGN), fading and/or interference.

According to examples of the present disclosure, the controller may be further adapted to carry out a method according to any one of the preceding aspects or examples of the present disclosure.

According to examples of the present disclosure, the controller may comprise a virtualized network function.

According to another aspect of the present disclosure, there is provided a base station comprising a controller according to any one of the preceding aspects or examples of the present disclosure.

According to another aspect of the present disclosure, there is provided a wireless device comprising a controller according to any one of the preceding aspects or examples of the present disclosure.

Certain embodiments may provide one or more of the following technical advantages. Examples of the proposed loss metric may lead to improvement in performance of the NND in its online phase (i.e., when the NND is used for decoding transmitted information) across all SNR values. Examples of the proposed loss metric may also lead to faster training. Other technical advantages may also be provided, and certain embodiments may provide some, none, or all of the advantages listed above.

BRIEF DESCRIPTION OF THE DRAWINGS

For a better understanding of the present invention, and to show more clearly how it may be carried into effect, reference will now be made, by way of example, to the following drawings, in which;

FIG. 5 is a chart illustrating training parameters;

DETAILED DESCRIPTION

Some of the embodiments contemplated herein will now be described more fully with reference to the accompanying drawings. Other embodiments, however, are contained within the scope of the subject matter disclosed herein, the disclosed subject matter should not be construed as limited to only the embodiments set forth herein; rather, these embodiments are provided by way of example to convey the scope of the subject matter to those skilled in the art.

The solutions proposed herein may be embodied in any radio receiver, including, for instance, eNB, UE, or cloud implementation. More specifically, the proposed solutions are applicable to any communication channel and any error-correcting code, though examples are given for adds Additive White Gaussian Noise (AWGN) channels, and Hamming and Polar codes.

An example communication system and neural network decoder are briefly introduced below. There then follows a discussion of a method of training a neural network and according to examples of the present disclosure. Further discussion of an example communication system, linear block codes, decoding, the Sum Product Algorithm, and the SPA over Neural Networks, is included in an additional discussion section at the end of the detailed description.

System Model

Figure 1:
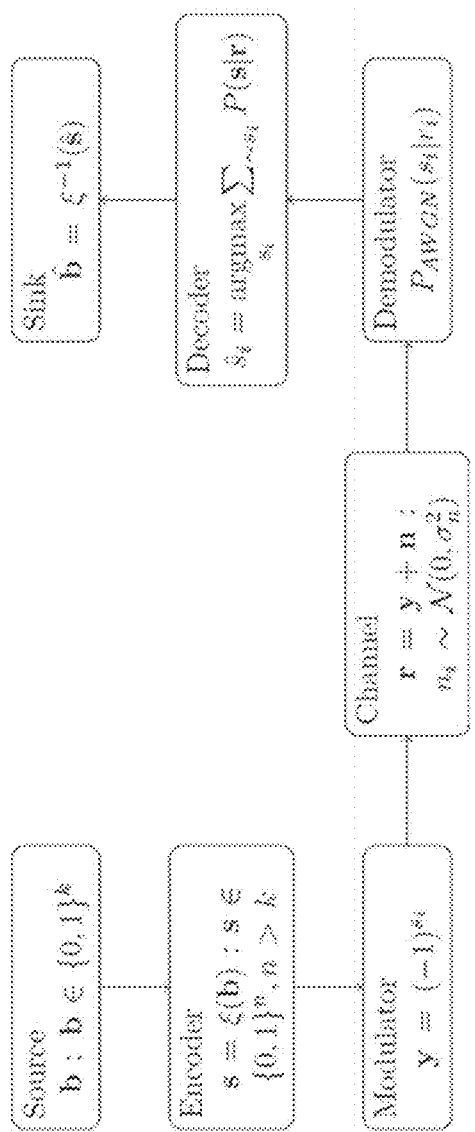
FIG. 1 illustrates a communication system model.

According to certain embodiments, a transmitter transmits binary codewords over a channel modulated with Binary Phase-Shift Keying (BPSK) signal and Additive White Gaussian Noise (AWGN). A receiver demodulates the signal to get Log-Likelihood values, which are used by an iterative decoder to correct any errors. A basic communication system model including these elements is shown in FIG. 1. Although this system is described at a very basic level, it will be appreciated that the various elements may be embodied in the network of FIG. 12, as described later herein. The proposed solution relates to the decoding algorithm.

Neural Network Decoder

The Neural Network decoder (NND) is based on SPA, but implements it on Neural Networks, as described in Reference 1. A desired characteristic of the NND is that it should be able to perform optimally for any plausible input data, obtained from any arbitrary value of channel SNR, during the online execution. However, we have observed that the SNR values, used for generating data during the training phase, have a significant effect on the online performance of the NNE). Training at low SNR leads to too many errors in the input, preventing the NND from learning from the structure of coded constraints in the Tanner graph. Conversely, training at very high SNR leads to too few errors, which does not expose the network to enough errors that cannot be corrected by SPA alone. Hence, it is important to find correct SNR values for the training process, such that the network is exposed to different error patterns, and learns to correct all of them.

The loss function used in Reference 1 is the cross-entropy loss function, which trains the network in a Maximum Likelihood sense over the training data. The cross-entropy loss function pushes the learning towards high success in correcting error patterns that were observed during training, but leads to higher failure rate in patterns that were not shown to the network during training. Examples of a loss function proposed herein are problem specific, and hence do not degrade NND performance in patterns not yet seen by the network.

Examples of the present disclosure provide methods for training a neural network, wherein layers of the neural network implement sequential iterations of the SPA. The neural network may in some examples be a neural network such as is discussed above and in greater detail below.

Figure 2:
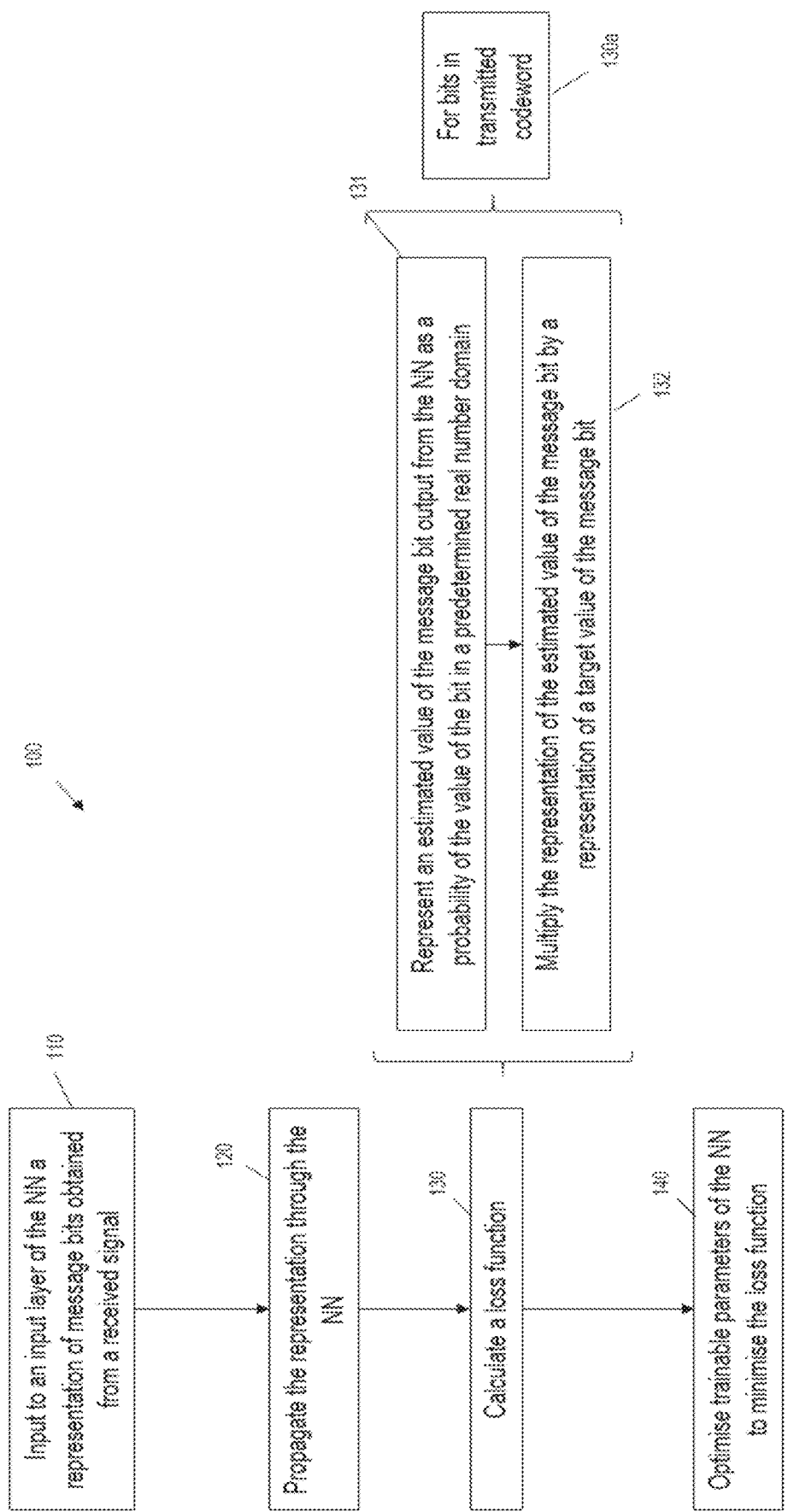
FIG. 2 is a is a flow chart illustrating process steps in a method for training a neural network according to an example of the present disclosure.

FIG. 2 illustrates process steps in a first example of a method 100 for training a Neural Network (NN) to recover a codeword of a Forward Error Correction (FEC) code from a received signal. As discussed above and in greater detail below, layers of the NN implement sequential iterations of the SPA. The received signal comprises a transmitted codeword and channel impairments. As discussed above, the channel impairments may comprise added noise, fading and/or interference. In some examples, the added noise may be AWGN, which may in some examples be artificially added to imitate a wireless communication channel. Referring to FIG. 2, in a first step 110, the method comprises inputting to an input layer of the NN a representation of message bits obtained from a received signal. The method then comprises, at step 120, propagating the representation through the NN, and, at step 130, calculating a loss function. At step 140, the method comprises optimising trainable parameters of the NN to minimise the loss function. Calculating a loss function according to the method 200 of FIG. 2 comprises, in a first step 131, representing an estimated value of a message bit output from the NN as a probability of the value of the bit in a predetermined real number domain, and, in step 132, multiplying the representation of the estimated value of the message bit by a representation of a target value of the message bit. As illustrated in FIG. 2, the steps 131 and 132 may be performed for bits in the transmitted codeword, and may be performed for all bits in the transmitted codeword. As discussed above, a target value of a message bit may comprise the actual value of the message bit in the transmitted codeword. It will be appreciated that during a training phase, the actual message bits of the transmitted codeword are known.

It will be appreciated that in general, a loss function comprises a continuous function of outputs of the network, along with the given target values, such that the optimal set of weights of NND exists that minimizes the loss function for all set of inputs. The steps 131 and 132 discussed above allow for the calculation of a loss function according to aspects of the present disclosure.

Examples of the present disclosure thus propose an energy-based loss function, in which an estimated value of a message bit output from the NN is represented as a probability of the value of the bit in a predetermined real number domain. Examples of the present invention may be applied to the training of a neural network for recovery of a codeword from a range of different FEC codes, including both binary and non-binary codes.

Figure 3:
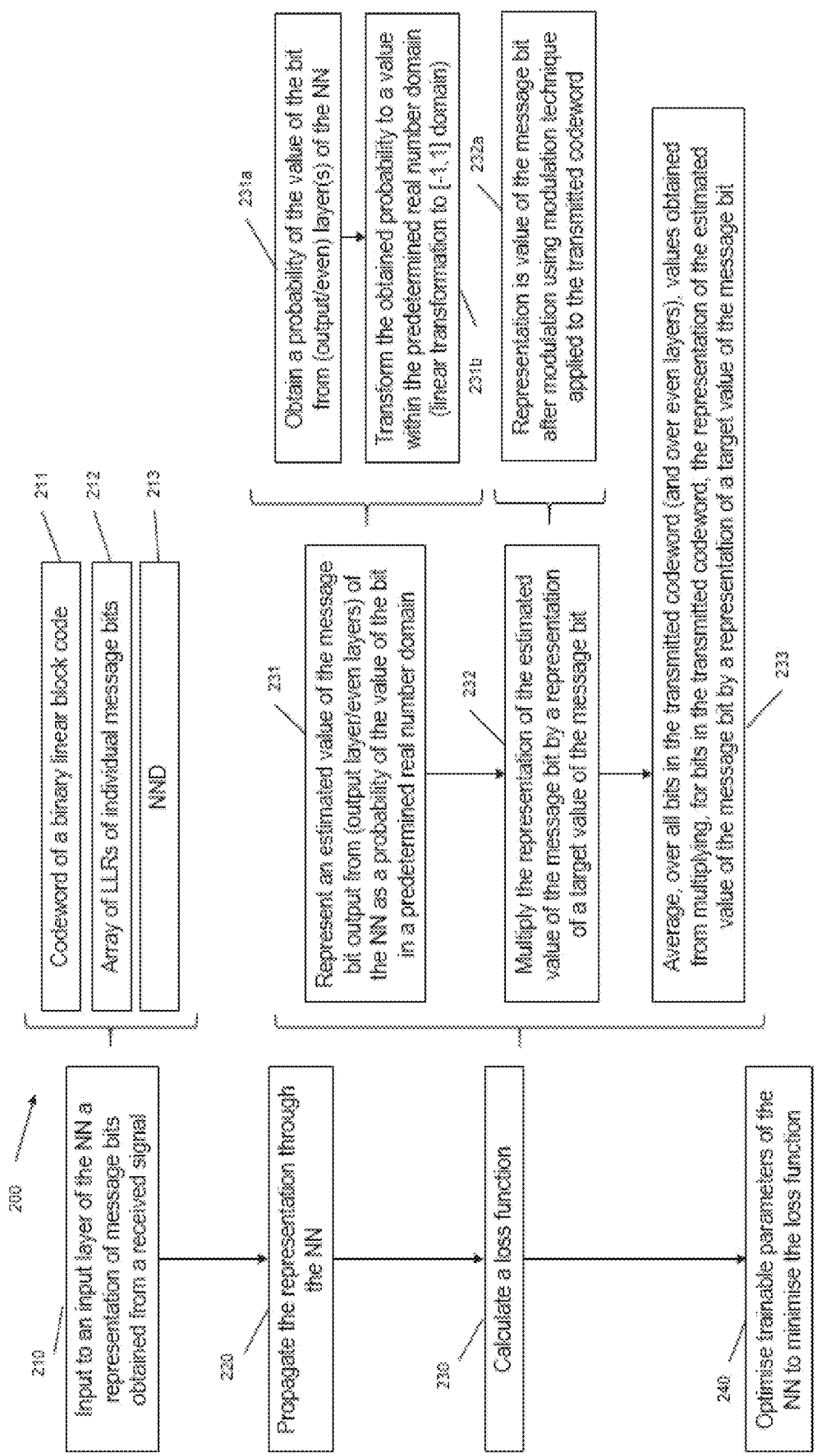
FIG. 3 is a flow chart illustrating process steps in another example of method for training a neural network according to an example of the present disclosure.

FIG. 3 is a flow chart illustrating another example of a method 200 for training a Neural Network (NN) to recover a codeword of a Forward Error Correction (FEC) code from a received signal. The method 200 of FIG. 3 provides one example of how the steps of the method 100 of FIG. 2 may be implemented and supplemented. As discussed above, layers of the NN of the method of FIG. 3 implement sequential iterations of the SPA. The received signal comprises a transmitted codeword and channel impairments. As discussed above, the channel impairments may comprise added noise, fading and/or interference. In some examples, the added noise may be AWGN, which may in some examples be artificially added to imitate a wireless communication channel. Referring to FIG. 3, in a first step 210, the method comprises inputting to an input layer of the NN a representation of message bits obtained from a received signal. As illustrated at step 211, the received signal may include a codeword of a binary linear block code, which the NN may be trained to recover. As illustrated at 212, the representation of message bits obtained from the received signal may comprise an array of Log-Likelihood Ratios (LLRs) of the individual message bits obtained from the received signal. As discussed in further detail below, in the case of a binary code, the LLRs provide the logarithm of the ratio between probabilities that a particular transmitted bit was a 0 and that it was 1. The ratio may be arranged such that the probability that a particular bit was 0 is divided by the probability that the bit was 1, or such that the probability that a particular bit was 1 is divided by the probability that the bit was 0. As illustrated at 213, in some examples, the NN may comprise a Neural Network Decoder, which as discussed above is based on a closed form analytical expression of SPA obtained for binary codes. For non-binary codes, requiring simultaneous operation over multiple variations at a time, translation to a neural network has not yet been documented, however the steps of the method 100 and/or 200 are equally applicable to the non-binary case.

The method 200 further comprises propagating the representation of message bits through the NN at step 220, calculating a loss function at step 230 and optimising trainable parameters of the NN to minimise the loss function at step 240. As discussed in further detail below, propagating the representation through the NN may comprise forwarding the representation (for example the LLRs) through the layers of the NN, such that the representations are updated according to the operations performed at the different layers of the NN.

Calculating a loss function comprises, in a first step 231, representing an estimated value of a message bit output from the NN as a probability of the value of the bit in a predetermined real number domain. The estimated value that is represented as a probability may be the estimated value output from an output layer of the NN, or may be estimated values output from multiple event layers of the NN, as discussed in further detail below.

As illustrated in FIG. 3, representing an estimated value of the message bit output from the output layer or even layers of the NN as a probability of the value of the bit in a real number domain may comprise obtaining a probability of the value of the bit from a layer of the NN in step 231a and transforming the obtained probability to a value within the predetermined real number domain in step 231b. The predetermined real number domain in the illustrated example method 200 is [−1, 1], and transforming the obtained probability to a value within the predetermined real number domain comprises performing a linear transformation on the obtained probability. Other examples of predetermined real number domain may be envisaged.

In step 232, calculating a loss function comprises multiplying the representation of the estimated value of the message bit by a representation of a target value of the message bit. The representation of the target value of the message bit may comprise a value of the message bit after modulation using a modulation technique applied to the transmitted codeword, as illustrated at step 232a.

Calculating a loss function may further comprise, in step 233, averaging over all bits in the transmitted codeword, the values obtained from multiplying, for bits in the transmitted codeword, the representation of the estimated value of the message bit by a representation of a target value of the message bit.

As discussed above, calculating a loss function may comprise calculating the loss function on the basis of an estimated value of the message bit output from an output layer of the NN. In such examples, the loss function may be the function set out below:

$$L_F^E(p, y) = \frac{-1}{N} \sum_{n=1}^{N} \left((1 - 2p(n))(-1)^{y(n)}\right)$$

wherein:
N is the number of bits in the transmitted codeword;
p(n) is the probability of the value of the $n^{th}$ bit of the transmitted codeword output by the NN being 1; and
y(n) is the target value of the $n^{th}$ bit of the transmitted codeword. As discussed above, the target value for the bit is the actual value (1 or 0 in the binary case) of that bit in the transmitted codeword. In a training phase of a NND, the actual values of the message bits in the training codeword that is transmitted are known.

Also as discussed above, calculating a loss function may comprise calculating the loss function on the basis of estimated values of the message bit output from even layers of the NN. In such examples, the loss function may be the multi-loss function set out below:

$$L_M^E(p, y) = \frac{-1}{MN} \sum_{l=2,4,\ldots}^{2M} \left(\sum_{n=1}^{N}\left((1 - 2p(l, n))(-1)^{y(n)}\right)\right)$$

wherein:
N is the number of bits in the transmitted codeword;
2M is the number of hidden layers in the NN;
p(n) is the probability of the value of the nth bit of the transmitted codeword output by the l-th layer of the NN being 1; and
y(n) is the target value of the nth bit of the transmitted codeword.

The example loss functions disclosed above are motivated by the Energy function introduced in Reference 2, maximizing which has been proved to give ML decoding solution. It was shown in Reference 2 that the Maximum Likelihood decoding (MLD) solution of a word Y with respect to code $C_G$ is equivalent to finding the maximum of the energy function E, defined as follows:

$$E_w(x) = \sum_{j=1}^{n} w_j y_j(x)$$

where w=$(-1)^r$, r∈ {0, 1} is the received codeword, y∈ {−1, +1} is the encoding function and x is the information bits.

However, maximizing this energy function is a non-deterministic polynomial-time (NP)-hard problem, and hence some heuristics are required to get a solution in polynomial time. It is proposed in the present disclosure to use a relaxation on the binary valued constraints over the estimated variables. Instead, estimated bits can be represented by their probabilities, which makes the energy function smooth and differentiable.

In order to apply this energy function to the NND, it is therefore proposed to relax the condition w∈ {−1, +1} to w∈ [−1, +1]. This is achieved by taking tan h of the Log-Likelihood values received at the output of the decoder. The loss function is then the negative of the Energy function, given by $$\text{Loss} = E_w^*(x) = -\sum_{j=1}^{n} \tanh(LLR_j) y_j$$

where $LLR_j$ is the final LLR value by the NND and $y_j=(-1)^{x_j}$, $x_j$ is the jth target bit value.

As discussed above, the loss function may be formulated as:

$$L_f^E(p, y) = -\frac{1}{N}\sum_{n=1}^{N}\left((1-2p(n))(-1)^{y(n)}\right)$$

where p(n) is the network output probability of the nth bit at the final output layer. The energy based loss function for a single bit can be written in terms of LLR output as:

$$\begin{aligned}L_f^E(n) &= (1-2p(n))\cdot(-1)^{y(n)}\\ &= \left(1-2(1+e^{-\beta(n)})^{-1}\right)\cdot(-1)^{y(n)}\\ &= -\frac{1-e^{-\beta(n)}}{1+e^{-\beta(n)}}\cdot(-1)^{y(n)}\\ &= -\tanh\left(\frac{\beta(n)}{2}\right)\cdot(-1)^{y_n}\end{aligned}$$

The first partial derivative of the above equation with respect to the LLR output is given by:

$$\frac{\delta L_f^E(n)}{\delta \beta(n)} = -\frac{1}{2}\left[1-\tanh^2\left(\frac{\beta(n)}{2}\right)\right]\cdot(-1)^{y(n)}$$

The energy based loss function trains the NND to output probabilities close to 0.5 towards the correct side of 0.5.

Comparison of Cross Entropy and Energy Loss Functions

The cross entropy loss function puts large weights on the edges to the hidden units that "pin" their activation towards extreme values of LLR (−∞ or ∞). This makes it impossible to propagate errors back towards these hidden units. The energy-based loss function, on the contrary, tries to keep the output LLR close to 0. Strong LLR outputs from the SPA generally gives correct estimates. The false estimates usually end up in a region of uncertainty, close to 0. The energy based loss function penalizes the NND severely when output probability of a bit is on the wrong side of actual target value. When the NND outputs a bit probability close to 0 or 1, the energy based loss function keeps the learning gradients close to 0 in order to not create any unnecessary bias. Such strong bias are tackled by connections in the Tanner graph and SPA iterations. In contrast, cross entropy loss function penalizes the NND severely for incorrect output, even if such output might "pin" weights to create a bias.

Figure 4:
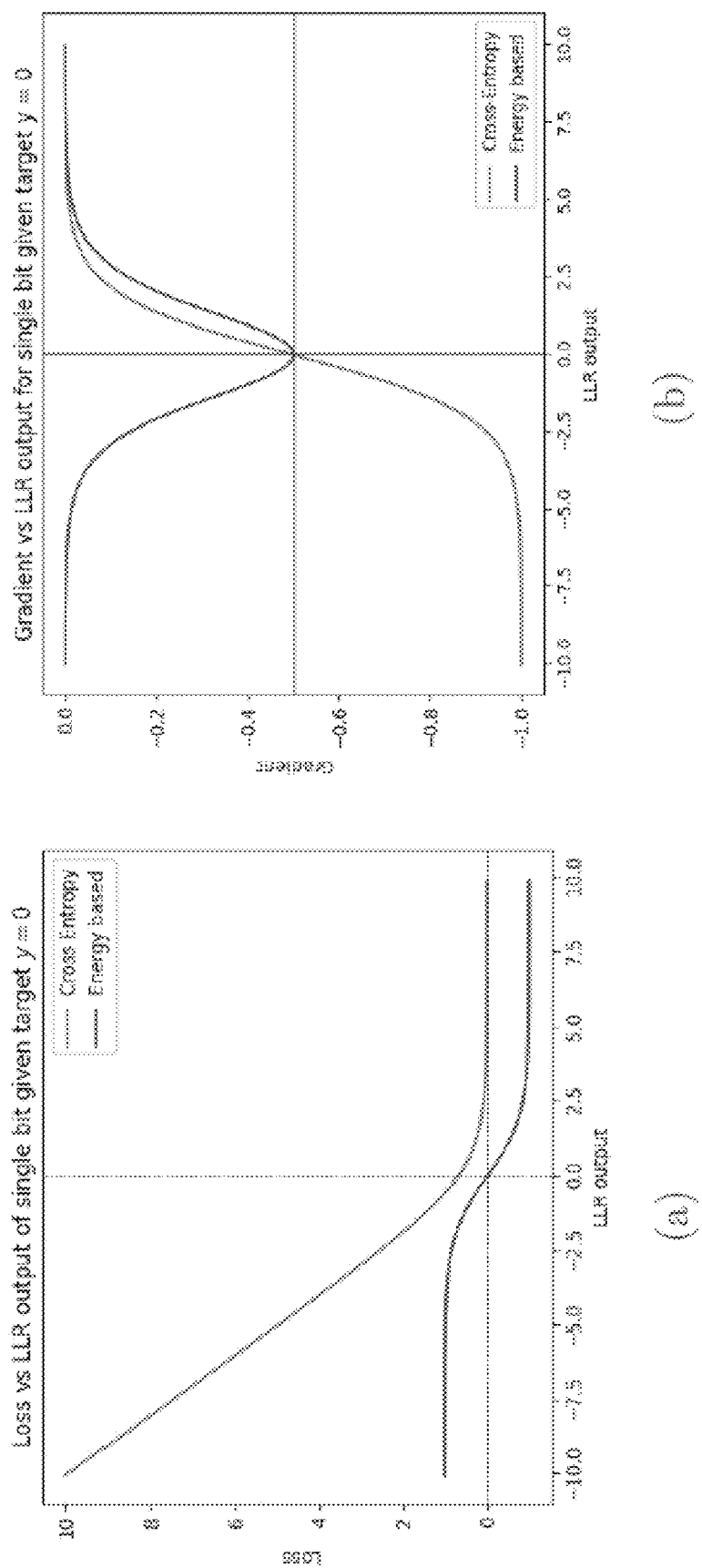
FIG. 4 illustrates graphs comparing loss and gradient for different loss functions.
Figure 6:
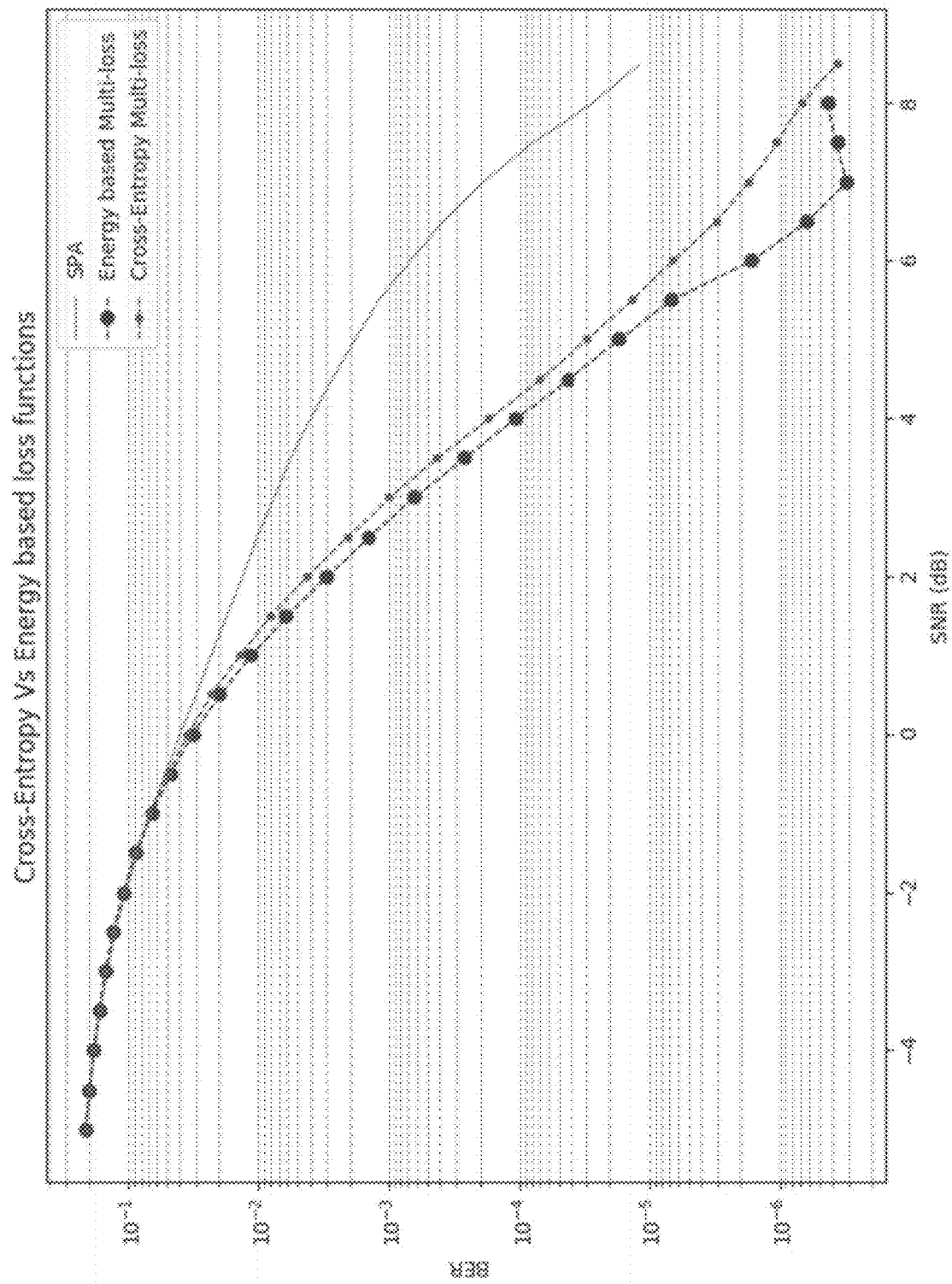
FIG. 6 is a graph comparing error rate for different loss functions.

FIG. 4 shows the loss and the gradient for both functions, for a target bit y=0. In FIG. 4, LLR is defined as log(p(b[n]=0)/p(b[n]=1)). The correct estimate for the target bit y=0 will be obtained if the NND outputs a positive LLR value. Cross entropy loss function adds a heavy penalty for wrong estimates, while energy based loss function keeps the penalty constant above a certain LLR magnitude. From the gradient plot we can infer that the cross entropy loss function makes a significant change in the parameters that leads to strongly incorrect estimates. The energy based loss function keeps the gradient constant for strongly estimated outputs. This leads to an overall improvement in the performance of the NND trained using the energy based loss functions as compared to the cross entropy loss functions. Experiments conducted on (32,16) polar code, as shown in FIG. 6 and discussed in further detail below, confirm this hypothesis.

Discussion of energy functions can be found in the literature of neural networks such as Hopfield networks (see http://www.scholarpedia.org/article/Hopfield_network) or restricted Boltzmann machines (see http://www.scholarpedia.org/article/Boltzmann_machine). The idea behind training a neural network model to learn to represent the data is the same in all these networks. However, the specific usage of loss function is different in each case.

Training Parameters

FIG. 5 lists the training parameters used for experimental training of a NND. An example is given for (32,16) polar code, used for training the NND for the experimental results shown later.

Testing

Tests have been performed using the trained network weights and architecture. FIG. 6 compares results for Polar (32,16) code. The results show that there is improvement in block error rate (BLER) in SNR range [−2,2] for a network trained with the proposed loss function.

Figure 7:
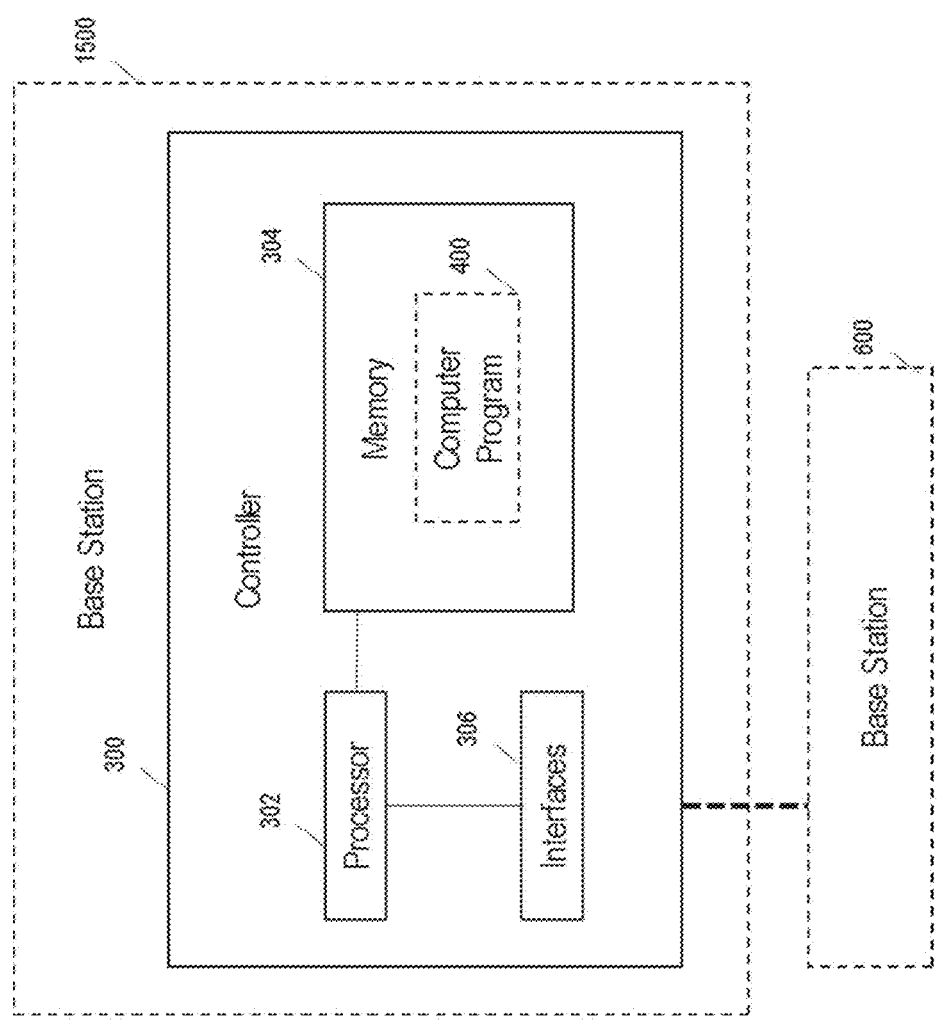
FIG. 7 is a block diagram illustrating functional units in a controller according to an example of the present disclosure.

The methods 100, 200, may be performed by a controller which may be hosted within a base station or a wireless device. In some examples, the controller may be virtualised and may be hosted on the Cloud in a centralised or distributed manner as appropriate. FIG. 7 is a block diagram illustrating an example controller 300 which may implement the methods 100, 200 according to examples of the present disclosure, for example on receipt of suitable instructions from a computer program 400. Referring to FIG. 7, the controller comprises a processor or processing circuitry 302, a memory 304 and interfaces 306. The memory 304 contains instructions, for example in the form of computer program 400, executable by the processor 302 such that the controller is operative to conduct the steps of the method 100, and/or 200. As illustrated in FIG. 7, the controller may in some examples be comprised within a base station 500, or wireless device (not shown). In other examples, the controller may be hosted within another network node such as a processing node, and/or on the cloud, and may be operable for communication with a base station 600 or wireless device (not shown). In such examples, the base station or wireless device may be operable to receive a signal comprising a codeword and to forward the received signal to the controller. The controller may be operable to perform the steps of the method 100 and/or 200 to recover the codeword from the received signal and to forward the recovered codeword to the base station or wireless device or to another node within a communication network.

Figure 8:
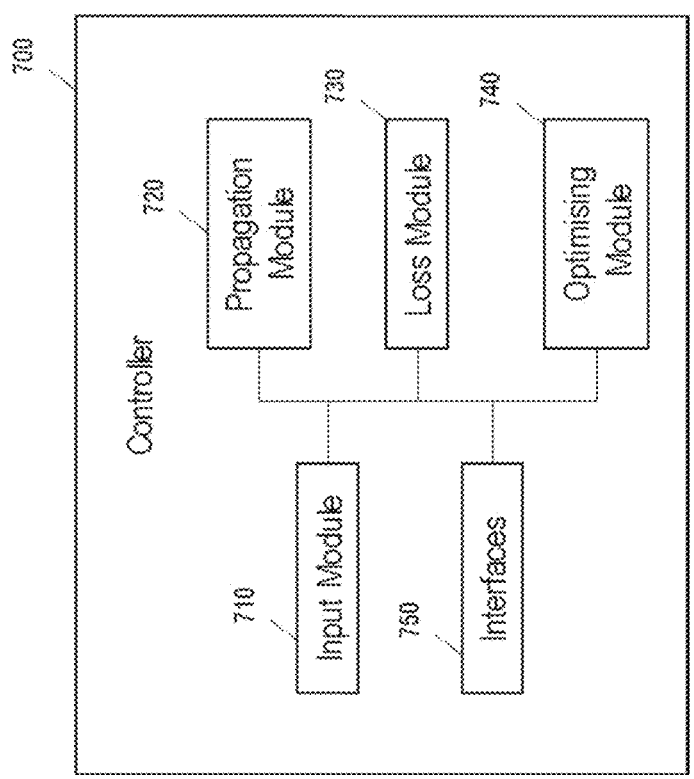
FIG. 8 is a block diagram illustrating functional units in another example of controller according to an example of the present disclosure.

FIG. 8 illustrates functional modules in another example of controller 700 which may execute examples of the methods 100 and/or 200 of the present disclosure, for example according to computer readable instructions received from a computer program. It will be understood that the modules illustrated in FIG. 8 are functional modules and may be realised in any appropriate combination of hardware and/or software. The modules may comprise one or more processors and may be integrated to any degree.

Referring to FIG. 8, the controller 700 comprises an input module 710 for inputting to an input layer of a NN a representation of message bits obtained from a received signal. The controller 700 further comprises a propagation module 720 for propagating the representation through the NN. The controller 700 further comprises a loss module 730 for calculating a loss function and an optimising module 740 for optimise trainable parameters of the NN to minimise the loss function. The loss module 730 is for calculating a loss function by, for bits in the transmitted codeword, representing an estimated value of the message bit output from the NN as a probability of the value of the bit in a predetermined real number domain, and multiplying the representation of the estimated value of the message bit by a representation of a target value of the message bit.

Figure 9:
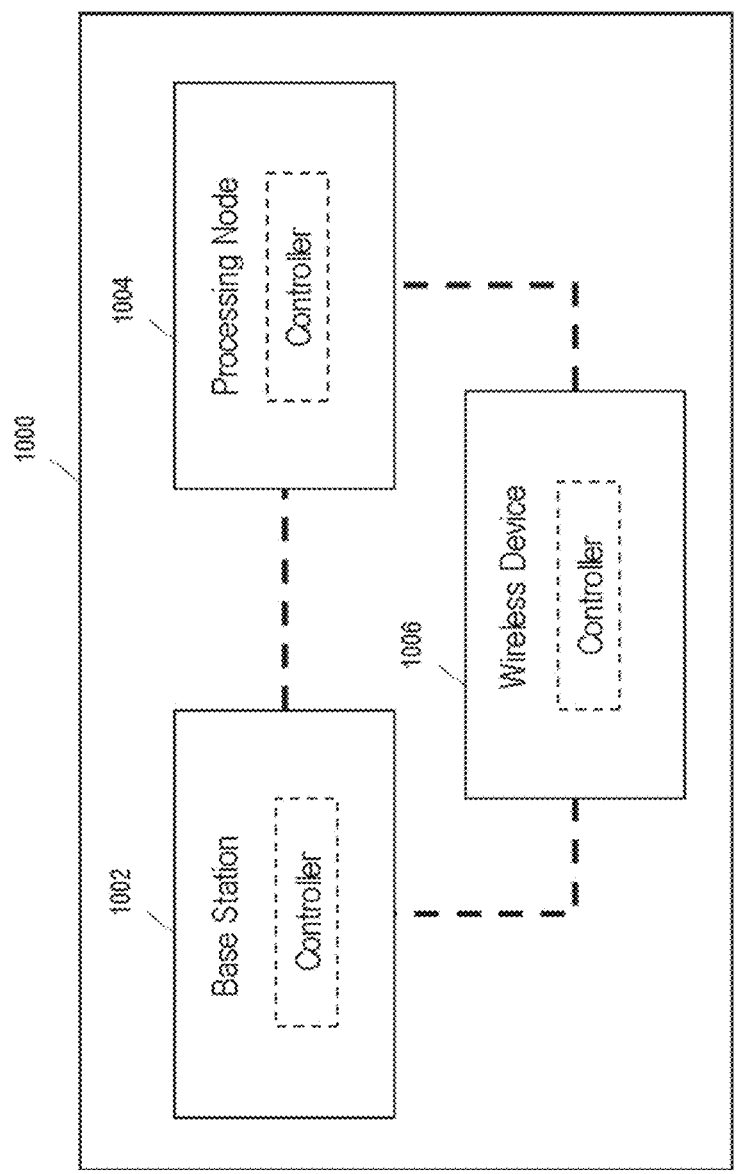
FIG. 9 is a block diagram illustrating nodes in a system according to an example of the present disclosure.

FIG. 9 illustrates a system 1000 comprising a base station 1002, a processing node 1004 and a wireless device 1006. The processing node 1004 may be a physical or virtual processing node. Any one or more of the base station 1002, processing node 1004 and/or wireless device 1006 may comprise a controller such as a controller 300 and/or 700 as described above. According to examples of the system 1000, the base station 1002 and/or wireless device 1006 may be operable to receive a signal comprising a codeword and to forward the received signal to the processing node. The controller within the processing node may be operable to perform the steps of the method 100 and/or 200 to recover the codeword from the received signal and to forward the recovered codeword to the base station or wireless device or to another node within a communication network.

Additional Discussion

The following additional information discusses machine intelligence in FEC decoding, including using a neural network which may be trained and used for decoding according to examples of the present disclosure. The additional information discusses an example communication system and neural network as introduced above. The additional discussion is drawn from an early version of the Thesis: "Machine Intelligence in Decoding of Forward Error Correction Codes" by Navneet Agrawal, the text of which is included at the end of the present disclosure.

Communication System

The communication model described herein is based on the Binary Additive White Gaussian Noise (BI-AWGN) channel and Binary Phase Shift Keying (BPSK) modulation. The rate of the code is defined as R, and codeword and source lengths as (n, k) respectively, where n>k. A binary message m=[m1, ..., mk]: mi∈ {0, 1} is encoded to a binary codewords=[s1, ..., sn]: si∈ {0, 1}, and BPSK modulated to signal x=[(−1)s]: xi∈ {−1, 1}. Noise of the channel is given as Signal to Noise Ratio (SNR) in decibels (dB). Standard deviation (sigma) of the Gaussian noise in AWGN channel with BPSK modulation, is obtained by the following formula.

$$\sigma = \sqrt{\left(2*10\frac{SNRdb}{10}\right)^{-1}} \quad (1.1)$$

The log-likelihood ratio (LLR) for received bits after demodulation is given by:

$$LLR(y_i) = \frac{P(x_i = +1 \mid y_i)}{P(x_i = -1 \mid y_i)} \quad (1.2)$$

$$= \exp - \frac{1}{2\sigma^2}(y_i - 1)^2 - (y_i + 1)^2$$

$$= \frac{2*y_i}{\sigma^2}$$

where xi and yi are the ith bits of transmitted and received signal x and y respectively. The LLR of received bits thus provides the likelihood that a received hit is 0 as opposed to 1. For convenience, in the following discussion LLR (yi) is written as $l_i$.

As shown in FIG. 1, the channel adds AWGN to the transmitted signal. The decoder uses the structure of the linear block code to recover information received in error.

Decoder Design

The following text discusses methods used for recovering bits through the decoding process.

Tanner Graph Representation of Code

The decoder takes the LLR values as input, and returns decision on corrected bits. The decoding follows the renowned Belief Propagation (BP) algorithm. The messages (or beliefs) are updated by passing the messages over the edges of the graph representation of the code called the Tanner graph. Tanner graph is a bipartite graph of parity check matrix H of the code, where the columns of parity check matrix are the variable nodes v, and the rows are the check nodes c in the graph. An edge connects the variable node vj to check node ci when there is a 1, instead of 0, at (i, j) position in H. Any linear block code can be represented as a Tanner graph.

For example, consider [7,4] hamming code with parity check matrix H as shown below and illustrated in the upper part of FIG. 10.

$$H = \begin{bmatrix} 1 & 0 & 1 & 1 & 1 & 0 & 0 \\ 1 & 1 & 1 & 0 & 0 & 1 & 0 \\ 0 & 1 & 1 & 1 & 0 & 0 & 1 \end{bmatrix} \quad (1.3)$$

Figure 10:
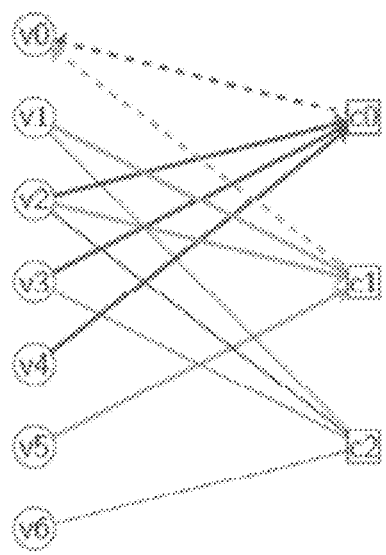
FIG. 10 illustrates a parity check matrix for a (7,4) Hamming code and a corresponding graph representation used for SPA.
Figure 11:
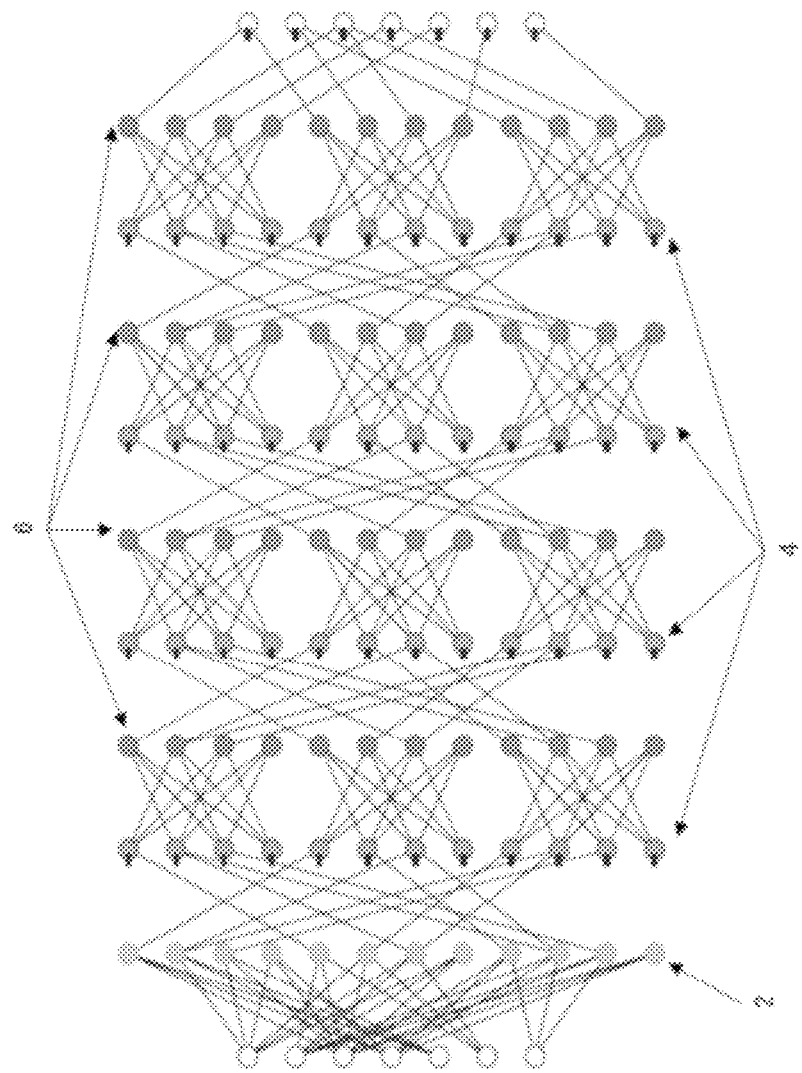
FIG. 11 illustrates a NND for the (7,4) Hamming code of FIG. 10.

The tanner graph given by this matrix is shown in the lower half of FIG. 10. The edges of the Tanner graph may be numbered from 1 to 12, corresponding to the ones in the parity check matrix counted row-wise. Edges {1, 5; 2, 7} form a cycle between variable nodes {v0, v2} and check nodes {c0, c1}, and edges {1, 5; 6, 9; 2, 7, 10} form a trapping set between variable nodes {v0, v1, v2} and check nodes {c0, c1, c2}.

Sum Product Algorithm (SPA)

The decoder uses a soft-iterative decoding technique called SPA. SPA operates on sum-product semi-ring for iterative decoding, which leads to bit-wise Maximum a posteriori probability (MAP) decoding. The messages are passed over the factor graph represented by the Tanner graph, to update the likelihood ratios. In general, the method utilizes the fact that at any particular check node, the sum of the bit values (0 or 1) coming from all connecting nodes must be 0 modulo 2 (in GF(2) field), That is:

$$\bigoplus_{i \in D_g}(y_i) = 0 \quad (1.4)$$

where ⊕ represents the binary sum over GF(2) field, and $D_g$ is the set of all variable nodes connected to $c_g$ check node.

The LLR value of any variable nodes is the belief of that node being 0 rather than 1.

$$P(y_i = 0) = \frac{1}{1 + \exp(-l_i)} \quad (1.5)$$

Considering a variable node $v_k$ connected to check node $c_g$, let $D_g$ denote the set of all the variable nodes connected to check node $c_g$. Using check node $c_g$ (equation 1.4), we can find $P_e(vk=0, c_g|li)$ $\forall i \in (D_g \backslash v_k)$. (The notation $i \in D_g \dagger v_k$ to denote that i belongs to the set $D_g$ excluding $v_k$.) $P_e(v_k, c_G)$ is called the extrinsic probability of variable node $v_k$ given by the check performed at check node $c_g$. To ease the notations, $v_k$ and $c_g$ are denoted as k and g respectively in the following discussion. Taking an example of check node with 3 incident variable nodes ($v_1$, $v_2$, $v_3$):

$$P_e(v_3 = 0) = P_e(v_1 \oplus v_2 = 0) \quad (1.6)$$
$$= P(v_1 = 0) \cdot P(v_2 = 0) + (1 - P(v_1 = 0)) \cdot (1 - P(v_2 = 0))$$
$$= \frac{1}{2} + \frac{1}{2} \prod_{k' \in (1,2)} (2P(v_{k'}) - 1)$$

It can be proved by induction that for any set $D_g$, the extrinsic information, $E(k, g) = P_e(k, g)$ is given by:

$$E(k, g) = \frac{1}{2} + \frac{1}{2} \prod_{k' \in D_g} (2P(k', g) - 1) \quad (1.7)$$

where $P_e(k, g)$ and $P(kt, g)$ are probabilities of variable (bit) node k and k' being zero, respectively, and $E(k, g)$ is the extrinsic information (LLR) passed from check node g to variable node k.

Converting to LLR instead of probabilities, and using the relationship, $$\tanh \frac{1}{2} \log\left(\frac{1-p}{p}\right) = 1 - 2p \quad (1.8)$$

we get from 1.7, $$E(k, g) = 2\tanh^{-1} \prod_{k' \in D_{g/k}} \tanh\left(\frac{M(k', g)}{2}\right) \quad (1.9)$$

where M (k', g) is the information (LLR) passed by variable node kt to check node g, without the information E(kt, g) that is already present at the check node g. That is, $$M(k', g) = \sum_{g' \in B_{k'}\backslash g} E(k', g') + l_{k'} \quad (1.10)$$

where $B_k$ is the set of all check nodes connected to variable node k and $l_{k'}$ is the initial LLR value at variable node k'.
SPA Algorithm
The following is an example of the SPA algorithm:
Initialize:
Set M (k, g)=$l_k \forall$k, g.
Step 1:
Check if parity is satisfied for a hard decision using current LLR values, Hard decision vector ŝ is given by:

$$s_k = \begin{cases} 0, & l_k > 0 \\ 1, & \text{otherwise} \end{cases} \quad (1.11)$$

Syndrome check vector S is given by:

$$S = \hat{s} \cdot H^T \quad (1.12)$$

*Check⇒If S=0, then the codeword ŝ, is returned as output by the decoder. Else, continue to next step.
Step 2:
Pass information on edge from variable node k to check node g The LLR values are passed to check nodes, where we find the probability that a check is satisfied, if the corresponding variable node is 0 or 1.
Calculate E(k, g) as per equation 1.9.
Step 3:
Update Variable Nodes
The extrinsic information is passed back to variable nodes, and LLRs are variable nodes are updated as:

$$L_k = l_k + \sum_{i \in B_k} E_{k,i} \quad (1.13)$$

where $B_k$ is a set of all check nodes connected to k variable node. The information passed by variable node to check node in step 2 does not contain extrinsic information that is already available at the check node. The value of M (k, g) is updated using equation 1.10.
Loop:
Move to Step 1
Cycles and Trapping Sets SPA works optimally for codes with Tanner graphs that form a tree when represented as a factor graph. In tree structured factor graphs, variable relationships can be factored exactly, hence leading to optimal solution through iterative message-passing over marginalization of joint probabilities. However, codes represented by graphs with no-cycles have low minimum distance, and hence perform poorly. This can be explained through the following argument.

Lemma: A binary linear code C, with rate r and the Tanner graph forming a tree, contains at least $$\frac{2r-1}{2}n$$

codewords of hamming weight 2.
Proof: The graph of C contains n variable nodes (corresponding to each codeword), and (1−r)n check nodes. Total number of nodes in the tree is 2n−nr. Hence average number of edges connected to each variable node is upper bounded by 2−r. Each internal variable node (variable node that are not leaf nodes) has degree at least 2. It follows that the number of leaf variable nodes must be greater than nr (proof: x+2(n−x)≤2n−nr⇒x≥nr). Since every leaf variable node is connected to only one check node, we have at least rn−(1−r)n=(2r−1)n leaf variable nodes that are connected to check nodes with multiple adjacent variable nodes. Each of these (2r−1)n leaf variable nodes has a pair of another leaf variable node, which give rise to a codeword of weight 2 for rates above one-half. Even for codes with rate less than one-half, tree structured Tanner graph based codes contain low-weight codewords.

SPA, or more general Belief Propagation (BP) algorithms, tend to show a rapid decrease in performance at higher SNR values, quantified as error-floor. This characteristic of codes is due to two major artifacts of the code or Tanner graphs. One is the minimum distance of the code, and other is the Trapping sets or Stopping sets. A trapping set T is a subset of variable nodes V such that all neighbors of T, i.e. all check nodes connected to T, are connected to Tat least twice. Trapping sets leads to situations from which SPA fails to recover. The support set of a codeword (set of locations where xi=1, i∈1, . . . , n) is a trapping set. However, a trapping set does not always correspond to the support set of a codeword. An example of cycle and trapping set is shown in FIG. 2.

SPA thus provides a sub-optimal method to implement the decoder of FIG. 1. Owing to the presence of cycles in the graphical structure of good linear block codes, performance of SPA is unsatisfactory. Codes represented by graphs with no-cycles have low minimum distance, and hence perform poorly. Deep Neural Network-based solutions have been proposed to improve performance of SPA for codes with cycles. A brief description of algorithms for neural network decoder implementation is provided below.

Neural Network Decoder

The following discussion provides a brief explanation of the working of neural networks, and of a neural network decoder based on SPA.

SPA Based Neural Network Decoder

In order to mitigate the effect of cycles or trapping sets in the Tanner graphs, the discriminative data-driven approach of Neural Networks may be used. The iterative graph based SPA algorithm is implemented using neural networks by defining the hidden nodes of the neural network as the edges of the tanner graph. Hence each hidden layer in the neural network corresponds to a message passing from either variable node to check node (odd layer), or check node to variable node (even layer). The message is passed over the edges a fixed number of times, which corresponds to the maximum number of iterations in the SPA. Each odd hidden layer computes extrinsic information using (1.9), and each even layer updates L and M values using (1.13) and (1,10), respectively. According to examples of the present disclosure, a check may be performed at even layer to verify the syndrome matching.

A Neural network decoder (NND) works in a very similar manner to the SPA algorithm, except that the operations are performed on an edge instead of a node of the tanner graph. The basic operations can be divided into operations at odd and even hidden layers of the network. In the following section we will discuss the SPA based NND (SPA-NND) algorithm. The notations used in SPA algorithm are continued here as well. Additional notations will be defined as they are used.

SPA-NND Architecture

Given, Parity check matrix H of size [n−k, n], where n, k∈1.

$D_g$: Set of all variable nodes connected to check node g.
$B_k$: Set of all check nodes connected to variable node k.
E ($S_1$, $S_2$): Set of edges between elements of $S_1$ and $S_2$.
V (E): Set of variable nodes connected to E.
C(E): Set of check nodes connected to E.

Layer sizes:
Input layer size=no. of variable nodes=n
Hidden (odd, even) layer size=no, of 1 s in H=$n_e$=$\Sigma_{row, col}$H
Output layer size=no. of variable nodes=n Sparse matrices defining connections between nodes Input to First hidden (even) layer=$W_{i2e}$ of size [n, ne] (Connect a variable node with edge nodes in the first hidden layer corresponding to those edges which are emanating from the check nodes adjacent to the variable node, except the edge that directly connects the variable node and the check node.)

$$W_{i2e}(i, j) = \begin{cases} 1, & \text{if } i \in \{D_g\} \forall\ g \in C(j \notin \varepsilon(i, C(j))) \\ 0, & \text{otherwise} \end{cases} \quad (1.14)$$

Hidden (even) to (odd) layer=$W_{e2o}$ of size [ne, ne] (Connecting an edge emanating from a check node, and another edge emanating from the variable node that is adjacent to the check node, except the edge that directly connects the check node and the variable node.)

$$W_{e2o}(i, j) = \begin{cases} 1, & \text{if } j \in \varepsilon(D_{C(i)} \setminus C(i)) \\ 0, & \text{otherwise} \end{cases} \quad (1.15)$$

Hidden (odd) to (even) layer=$W_{o2e}$ of size [ne, ne] (Connecting an edge emanating from a variable node, and another edge emanating from the check node that is adjacent to the variable node, except the edge that directly connects the variable node and the check node.)

$$W_{2e}(i, j) = \begin{cases} 1, & \text{if } j \in \varepsilon(B_{V(i)} \setminus V(i)) \\ 0, & \text{otherwise} \end{cases} \quad (1.16)$$

Hidden (even) to Output layer=$W_{e2x}$ of size [ne, n] (Connecting an edge emanating from a check node, and a variable node that is adjacent to the check node)

$$W_{e2x}(i, j) = \begin{matrix} 1, & \text{if } i \in \varepsilon(B_{V_\mu(j)}) \\ 0, & \text{otherwise} \end{matrix} \quad (1.17)$$

Input to hidden (even) layer $W_{i2h}$=$W^T_{e2x}$ of size [n, ne] (Connecting a variable input node and an edge emanating from the check node adjacent to the variable node.)

$$W_{i2h}(i, j) = \begin{cases} 1, & \text{if } j \in \varepsilon(B_{V(i)}) \\ 0, & \text{otherwise} \end{cases} \quad (1.18)$$

Having set the parameters for designing the NND, the operations in Neural network are described below.

Odd layer Output at jth node at layer m:

$$x^m_{odd}[j] = \tanh\left(\frac{1}{2}\tilde{W}^m_{i2h}(v, j) \times l[v] + \sum_{j' \in \varepsilon} \tilde{W}^m_{o2e}[j, j'] \times x^{m-1}_{even}[j']\right) \quad (1.19)$$

where v=V (j).
Even layer output at jth node at layer m.

$$x^m_{even}[j] = 2\tanh^{-1}\left(\prod_{j' \in \varepsilon(B_{v(j)} \setminus V(j))} x^m_{odd}[j']\right) \quad (1.20)$$

The final output layer operation is given by:

$$x_{last}[i] = \tilde{W}_{i2h}[i, j] \times l[i] + \sum_{i' \in \varepsilon} \tilde{W}_{e2x}[i, i'] \times x_{even}[j'] \quad (1.21)$$

where j,j' are edges that connect the variable nodes i,i', respectively. The weights $\tilde{W}$ denote the weights trained by the neural network.

An example of the above described SPA-NND neural network structure and design for a (7,4) Hamming code is shown in FIG. 3. The neural network has nine hidden layers, corresponding to five full iterations of the SPA. The first hidden layer 2 applies operations of odd and even layers at a single node. The hidden layers labelled 4 are odd hidden layers, and layers labelled 6 are even hidden layers. The bold black rectangles besides the odd layer nodes represent the addition of input LLRs at this iteration.

As described above, examples of the present disclosure concern a loss function/loss metric to be used in the training of a neural network decoder. The training can either take place before the NND is used or during use, known as "online training". In the first case, the training can either be done in a network node such as an eNB or in a central location. In the second case, it is possible to do the training in a central location, if latency constraints can be met and the sufficient bandwidth is available to transmit training examples. Thus, certain embodiments may be implemented in a cloud or other distributed configuration. These various embodiments and the networks in which they are implemented will now be described in more detail.

Figure 12:
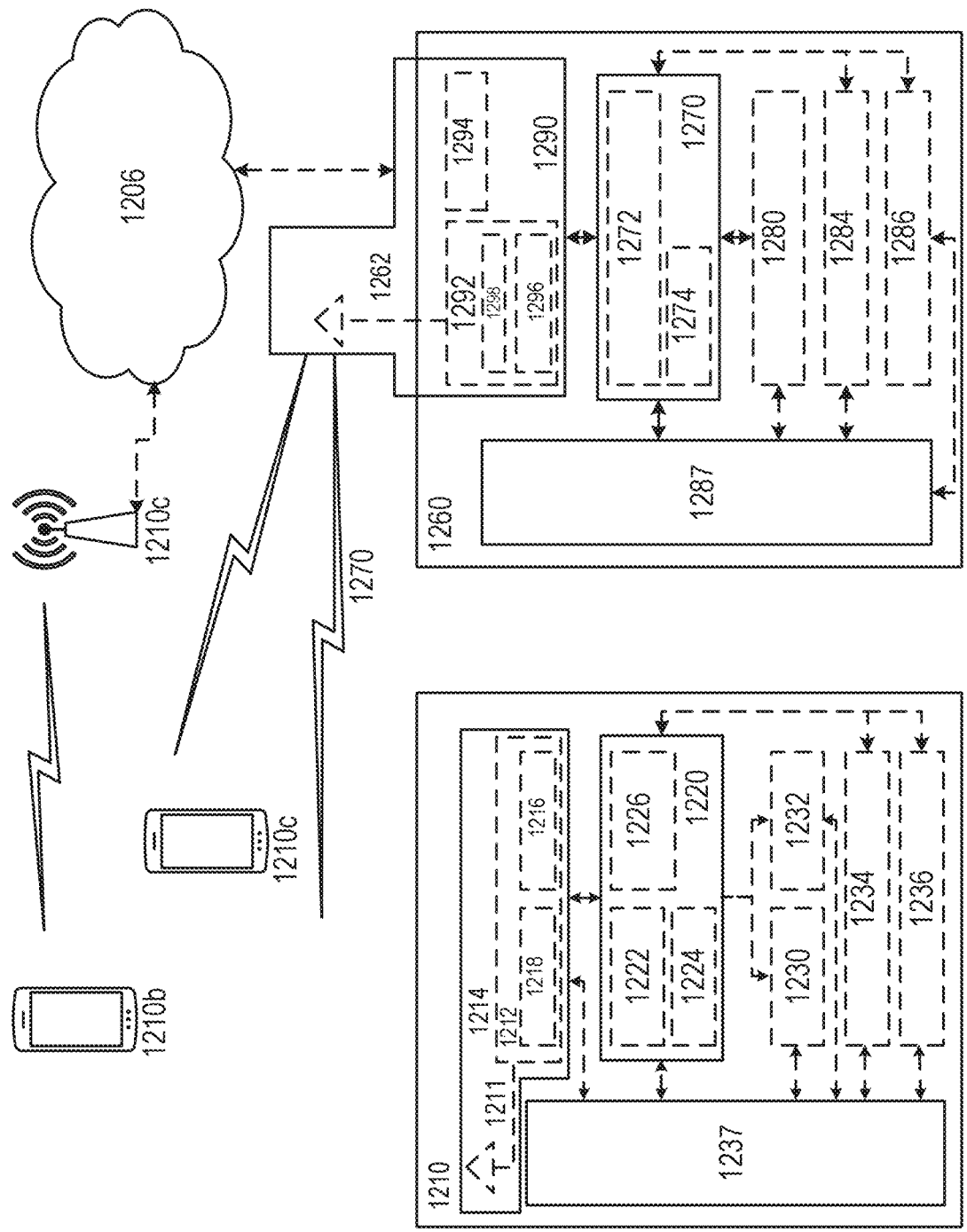
FIG. 12 is a schematic block diagram illustrating a wireless network.

Although the subject matter described herein may be implemented in any appropriate type of system using any suitable components, the embodiments disclosed herein are described in relation to a wireless network, such as the example wireless network illustrated in FIG. 12, which shows a wireless network in accordance with some embodiments. For simplicity, the wireless network of FIG. 12 only depicts network 1206, network nodes 1260 and 1260b, and Wireless Devises (WDs) 1210, 1210b, and 1210c. In practice, a wireless network may further include any additional elements suitable to support communication between wireless devices or between a wireless device and another communication device, such as a landline telephone, a service provider, or any other network node or end device. Of the illustrated components, network node 1260 and wireless device (WD) 1210 are depicted with additional detail. The wireless network may provide communication and other types of services to one or more wireless devices to facilitate the wireless devices' access to and/or use of the services provided by, or via, the wireless network.

The wireless network may comprise and/or interface with any type of communication, telecommunication, data, cellular, and/or radio network or other similar type of system. In some embodiments, the wireless network may be configured to operate according to specific standards or other types of predefined rules or procedures. Thus, particular embodiments of the wireless network may implement communication standards, such as Global System for Mobile Communications (GSM), Universal Mobile Telecommunications System (UMTS), Long Term Evolution (LTE), and/or other suitable 2G, 3G, 4G, or 5G standards; wireless local area network (WLAN) standards, such as the IEEE 802.11 standards; and/or any other appropriate wireless communication standard, such as the Worldwide Interoperability for Microwave Access (WiMax), Bluetooth, Z-Wave and/or ZigBee standards.

Network 1206 may comprise one or more backhaul networks, core networks, IP networks, public switched telephone networks (PSTNs), packet data networks, optical networks, wide-area networks (WANs), local area networks (LANs), wireless local area networks (WLANs), wired networks, wireless networks, metropolitan area networks, and other networks to enable communication between devices.

Network node 1260 and WD 1210 comprise various components described in more detail below. These components work together in order to provide network node and/or wireless device functionality, such as providing wireless connections in a wireless network. In different embodiments, the wireless network may comprise any number of wired or wireless networks, network nodes, base stations, controllers, wireless devices, relay stations, and/or any other components or systems that may facilitate or participate in the communication of data and/or signals whether via wired or wireless connections.

As used herein, network node refers to equipment capable, configured, arranged and/or operable to communicate directly or indirectly with a wireless device and/or with other network nodes or equipment in the wireless network to enable and/or provide wireless access to the wireless device and/or to perform other functions (e.g., administration) in the wireless network. Examples of network nodes include, but are not limited to, access points (APs) (e.g., radio access points), base stations (BSs) (e.g., radio base stations, Node Bs, and evolved Node Bs (eNBs)). Base stations may be categorized based on the amount of coverage they provide (or, stated differently, their transmit power level) and may then also be referred to as femto base stations, pico base stations, micro base stations, or macro base stations. A base station may be a relay node or a relay donor node controlling a relay. A network node may also include one or more (or all) parts of a distributed radio base station such as centralized digital units and/or remote radio units (RRUs), sometimes referred to as Remote Radio Heads (RRHs). Such remote radio units may or may not be integrated with an antenna as an antenna integrated radio. Parts of a distributed radio base station may also be referred to as nodes in a distributed antenna system (DAS). Yet further examples of network nodes include multi-standard radio (MSR) equipment such as MSR BSs, network controllers such as radio network controllers (RNCs) or base station controllers (BSCs), base transceiver stations (BTSs), transmission points, transmission nodes, multi-cell/multicast coordination entities (MCEs), core network nodes (e.g., MSCs, MMEs), O&M nodes, OSS nodes, SON nodes, positioning nodes (e.g., E-SMLCs), and/or MDTs. As another example, a network node may be a virtual network node as described in more detail below. More generally, however, network nodes may represent any suitable device (or group of devices) capable, configured, arranged, and/or operable to enable and/or provide a wireless device with access to the wireless network or to provide some service to a wireless device that has accessed the wireless network.

In FIG. 12, network node 1260 includes processing circuitry 1270, device readable medium 1280, interface 1290, auxiliary equipment 1284, power source 1286, power circuitry 1287, and antenna 1262. Although network node 1260 illustrated in the example wireless network of FIG. 12 may represent a device that includes the illustrated combination of hardware components, other embodiments may comprise network nodes with different combinations of components. It is to be understood that a network node comprises any suitable combination of hardware and/or software needed to perform the tasks, features, functions and methods disclosed herein. Moreover, while the components of network node 1260 are depicted as single boxes located within a larger box, or nested within multiple boxes, in practice, a network node may comprise multiple different physical components that make up a single illustrated component (e.g., device readable medium 1280 may comprise multiple separate hard drives as well as multiple RAM modules).

Similarly, network node 1260 may be composed of multiple physically separate components (e.g., a NodeB component and a RNC component, or a BTS component and a BSC component, etc.), which may each have their own respective components. In certain scenarios in which network node 1260 comprises multiple separate components (e.g., BTS and BSC components), one or more of the separate components may be shared among several network nodes. For example, a single RNC may control multiple NodeB's. In such a scenario, each unique NodeB and RNC pair, may in some instances be considered a single separate network node. In some embodiments, network node 1260 may be configured to support multiple radio access technologies (RATs). In such embodiments, some components may be duplicated (e.g., separate device readable medium 1280 for the different RATs) and some components may be reused (e.g., the same antenna 1262 may be shared by the RATs). Network node 1260 may also include multiple sets of the various illustrated components for different wireless technologies integrated into network node 1260, such as, for example, GSM, WCDMA, LTE, NR, WiFi, or Bluetooth wireless technologies. These wireless technologies may be integrated into the same or different chip or set of chips and other components within network node 1260.

Processing circuitry 1270 is configured to perform any determining, calculating, or similar operations (e.g., certain obtaining operations) described herein as being provided by a network node. These operations performed by processing circuitry 1270 may include processing information obtained by processing circuitry 1270 by, for example, converting the obtained information into other information, comparing the obtained information or converted information to information stored in the network node, and/or performing one or more operations based on the obtained information or converted information, and as a result of said processing making a determination.

Processing circuitry 1270 may comprise a combination of one or more of a microprocessor, controller, microcontroller, central processing unit, digital signal processor, application-specific integrated circuit, field programmable gate array, or any other suitable computing device, resource, or combination of hardware, software and/or encoded logic operable to provide, either alone or in conjunction with other network node 1260 components, such as device readable medium 1280, network node 1260 functionality. For example, processing circuitry 1270 may execute instructions stored in device readable medium 1280 or in memory within processing circuitry 1270. Such functionality may include providing any of the various wireless features, functions, or benefits discussed herein. In some embodiments, processing circuitry 1270 may include a system on a chip (SOC).

In some embodiments, processing circuitry 1270 may include one or more of radio frequency (RF) transceiver circuitry 1272 and baseband processing circuitry 1274, In some embodiments, radio frequency (RF) transceiver circuitry 1272 and baseband processing circuitry 1274 may be on separate chips (or sets of chips), boards, or units, such as radio units and digital units. In alternative embodiments, part or all of RF transceiver circuitry 1272 and baseband processing circuitry 1274 may be on the same chip or set of chips, boards, or units In certain embodiments, some or all of the functionality described herein as being provided by a network node, base station, eNB or other such network device may be performed by processing circuitry 1270 executing instructions stored on device readable medium 1280 or memory within processing circuitry 1270. In alternative embodiments, some or all of the functionality may be provided by processing circuitry 1270 without executing instructions stored on a separate or discrete device readable medium, such as in a hard-wired manner. In any of those embodiments, whether executing instructions stored on a device readable storage medium or not, processing circuitry 1270 can be configured to perform the described functionality. The benefits provided by such functionality are not limited to processing circuitry 1270 alone or to other components of network node 1260, but are enjoyed by network node 1260 as a whole, and/or by end users and the wireless network generally.

Device readable medium 1280 may comprise any form of volatile or non-volatile computer readable memory including, without limitation, persistent storage, solid-state memory, remotely mounted memory, magnetic media, optical media, random access memory (RAM), read-only memory (ROM), mass storage media (for example, a hard disk), removable storage media (for example, a flash drive, a Compact Disk (CD) or a Digital Video Disk (DVD)), and/or any other volatile or non-volatile, non-transitory device readable and/or computer-executable memory devices that store information, data, and/or instructions that may be used by processing circuitry 1270. Device readable medium 1280 may store any suitable instructions, data or information, including a computer program, software, an application including one or more of logic, rules, code, tables, etc. and/or other instructions capable of being executed by processing circuitry 1270 and, utilized by network node 1260. Device readable medium 1280 may be used to store any calculations made by processing circuitry 1270 and/or any data received via interface 1290. In some embodiments, processing circuitry 1270 and device readable medium 1280 may be considered to be integrated.

Interface 1290 is used in the wired or wireless communication of signalling and/or data between network node 1260, network 1206, and/or WDs 1210. As illustrated, interface 1290 comprises port(s)/terminal(s) 1294 to send and receive data, for example to and from network 1206 over a wired connection. Interface 1290 also includes radio front end circuitry 1292 that may be coupled to, or in certain embodiments a part of, antenna 1262. Radio front end circuitry 1292 comprises filters 1298 and amplifiers 1296. Radio front end circuitry 1292 may be connected to antenna 1262 and processing circuitry 1270. Radio front end circuitry may be configured to condition signals communicated between antenna 1262 and processing circuitry 1270. Radio front end circuitry 1292 may receive digital data that is to be sent out to other network nodes or WDs via a wireless connection. Radio front end circuitry 1292 may convert the digital data into a radio signal having the appropriate channel and bandwidth parameters using a combination of filters 1298 and/or amplifiers 1296. The radio signal may then be transmitted via antenna 1262. Similarly, when receiving data, antenna 1262 may collect radio signals which are then converted into digital data by radio front end circuitry 1292. The digital data may be passed to processing circuitry 1270. In other embodiments, the interface may comprise different components and/or different combinations of components.

In certain alternative embodiments, network node 1260 may not include separate radio front end circuitry 1292, instead, processing circuitry 1270 may comprise radio front end circuitry and may be connected to antenna 1262 without separate radio front end circuitry 1292. Similarly, in some embodiments, all or some of RF transceiver circuitry 1272 may be considered a part of interface 1290. In still other embodiments, interface 1290 may include one or more ports or terminals 1294, radio front end circuitry 1292, and RF transceiver circuitry 1272, as part of a radio unit (not shown), and interface 1290 may communicate with baseband processing circuitry 1274, which is part of a digital unit (not shown).

Antenna 1262 may include one or more antennas, or antenna arrays, configured to send and/or receive wireless signals. Antenna 1262 may be coupled to radio front end circuitry 1290 and may be any type of antenna capable of transmitting and receiving data and/or signals wirelessly. In some embodiments, antenna 1262 may comprise one or more omni-directional, sector or panel antennas operable to transmit/receive radio signals between, for example, 2 GHz and 66 GHz. An omni-directional antenna may be used to transmit/receive radio signals in any direction, a sector antenna may be used to transmit/receive radio signals from devices within a particular area, and a panel antenna may be a line of sight antenna used to transmit/receive radio signals in a relatively straight line. In some instances, the use of more than one antenna may be referred to as MIMO. In certain embodiments, antenna 1262 may be separate from network node 1260 and may be connectable to network node 1260 through an interface or port.

Antenna 1262, interface 1290, and/or processing circuitry 1270 may be configured to perform any receiving operations and/or certain obtaining operations described herein as being performed by a network node. Any information, data and/or signals may be received from a wireless device, another network node and/or any other network equipment. Similarly, antenna 1262, interface 1290, and/or processing circuitry 1270 may be configured to perform any transmitting operations described herein as being performed by a network node. Any information, data and/or signals may be transmitted to a wireless device, another network node and/or any other network equipment.

Power circuitry 1287 may comprise, or be coupled to, power management circuitry and is configured to supply the components of network node 1260 with power for performing the functionality described herein. Power circuitry 1287 may receive power from power source 1286. Power source 1286 and/or power circuitry 1287 may be configured to provide power to the various components of network node 1260 in a form suitable for the respective components (e.g., at a voltage and current level needed for each respective component). Power source 1286 may either be included in, or external to, power circuitry 1287 and/or network node 1260. For example, network node 1260 may be connectable to an external power source (e.g., an electricity outlet) via an input circuitry or interface such as an electrical cable, whereby the external power source supplies power to power circuitry 1287. As a further example, power source 1286 may comprise a source of power in the form of a battery or battery pack which is connected to, or integrated in, power circuitry 1287. The battery may provide backup power should the external power source fail. Other types of power sources, such as photovoltaic devices, may also be used.

Alternative embodiments of network node 1260 may include additional components beyond those shown in FIG. 12 that may be responsible for providing certain aspects of the network node's functionality, including any of the functionality described herein and/or any functionality necessary to support the subject matter described herein. For example, network node 1260 may include user interface equipment to allow input of information into network node 1260 and to allow output of information from network node 1260. This may allow a user to perform diagnostic, maintenance, repair, and other administrative functions for network node 1260.

As used herein, wireless device (WD) refers to a device capable, configured, arranged and/or operable to communicate wirelessly with network nodes and/or other wireless devices. Unless otherwise noted, the term WD may be used interchangeably herein with user equipment (UE). Communicating wirelessly may involve transmitting and/or receiving wireless signals using electromagnetic waves, radio waves, infrared waves, and/or other types of signals suitable for conveying information through air. In some embodiments, a WD may be configured to transmit and/or receive information without direct human interaction. For instance, a WD may be designed to transmit information to a network on a predetermined schedule, when triggered by an internal or external event, or in response to requests from the network. Examples of a WD include, but are not limited to, a smart phone, a mobile phone, a cell phone, a voice over IP (VoIP) phone, a wireless local loop phone, a desktop computer, a personal digital assistant (PDA), a wireless cameras, a gaming console or device, a music storage device, a playback appliance, a wearable terminal device, a wireless endpoint, a mobile station, a tablet, a laptop, a laptop-embedded equipment (LEE), a laptop-mounted equipment (LME), a smart device, a wireless customer-premise equipment (CPE). a vehicle-mounted wireless terminal device, etc. A WD may support device-to-device (D2D) communication, for example by implementing a 3GPP standard for sidelink communication, and may in this case be referred to as a D2D communication device. As yet another specific example, in an Internet of Things (IoT) scenario, a WD may represent a machine or other device that performs monitoring and/or measurements, and transmits the results of such monitoring and/or measurements to another WD and/or a network node. The WD may in this case be a machine-to-machine (M2M) device, which may in a 3GPP context be referred to as a machine-type communication (MTC) device. As one particular example, the WD may be a UE implementing the 3GPP narrow band internet of things (NB-IoT) standard. Particular examples of such machines or devices are sensors, metering devices such as power meters, industrial machinery, or home or personal appliances (e.g. refrigerators, televisions, etc.) personal wearables (e.g., watches, fitness trackers, etc.). In other scenarios, a WD may represent a vehicle or other equipment that is capable of monitoring and/or reporting on its operational status or other functions associated with its operation. A WD as described above may represent the endpoint of a wireless connection, in which case the device may be referred to as a wireless terminal. Furthermore, a WD as described above may be mobile, in which case it may also be referred to as a mobile device or a mobile terminal.

As illustrated, wireless device 1210 includes antenna 1211, interface 1214, processing circuitry 1220, device readable medium 1230, user interface equipment 1232, auxiliary equipment 1234, power source 1236 and power circuitry 1237. WD 1210 may include multiple sets of one or more of the illustrated components for different wireless technologies supported by WD 1210, such as, for example, GSM, WCDMA, LTE, NR, WiFi, WiMAX, or Bluetooth wireless technologies, just to mention a few. These wireless technologies may be integrated into the same or different chips or set of chips as other components within WD 1210.

Antenna 1211 may include one or more antennas or antenna arrays, configured to send and/or receive wireless signals, and is connected to interface 1214. In certain alternative embodiments, antenna 1211 may be separate from WD 1210 and be connectable to WD 1210 through an interface or port. Antenna 1211, interface 1214, and/or processing circuitry 1220 may be configured to perform any receiving or transmitting operations described herein as being performed by a WD. Any information, data and/or signals may be received from a network node and/or another WD. In some embodiments, radio front end circuitry and/or antenna 1211 may be considered an interface.

As illustrated, interface 1214 comprises radio front end circuitry 1212 and antenna 1211. Radio front end circuitry 1212 comprise one or more filters 1218 and amplifiers 1216. Radio front end circuitry 1214 is connected to antenna 1211 and processing circuitry 1220, and is configured to condition signals communicated between antenna 1211 and processing circuitry 1220. Radio front end circuitry 1212 may be coupled to or a part of antenna 1211. In some embodiments, WD 1210 may not include separate radio front end circuitry 1212; rather, processing circuitry 1220 may comprise radio front end circuitry and may be connected to antenna 1211. Similarly, in some embodiments, some or all of RF transceiver circuitry 1222 may be considered a part of interface 1214. Radio front end circuitry 1212 may receive digital data that is to be sent out to other network nodes or WDs via a wireless connection. Radio front end circuitry 1212 may convert the digital data into a radio signal having the appropriate channel and bandwidth parameters using a combination of filters 1218 and/or amplifiers 1216. The radio signal may then be transmitted via antenna 1211. Similarly, when receiving data, antenna 1211 may collect radio signals which are then converted into digital data by radio front end circuitry 1212. The digital data may be passed to processing circuitry 1220. In other embodiments, the interface may comprise different components and/or different combinations of components.

Processing circuitry 1220 may comprise a combination of one or more of a microprocessor, controller, microcontroller, central processing unit, digital signal processor, application-specific integrated circuit, field programmable gate array, or any other suitable computing device, resource, or combination of hardware, software, and/or encoded logic operable to provide, either alone or in conjunction with other WD 1210 components, such as device readable medium 1230, WD 1210 functionality. Such functionality may include providing any of the various wireless features or benefits discussed herein. For example, processing circuitry 1220 may execute instructions stored in device readable medium 1230 or in memory within processing circuitry 1220 to provide the functionality disclosed herein.

As illustrated, processing circuitry 1220 includes one or more of RF transceiver circuitry 1222, baseband processing circuitry 1224, and application processing circuitry 1226. In other embodiments, the processing circuitry may comprise different components and/or different combinations of components. In certain embodiments processing circuitry 1220 of WD 1210 may comprise a SOC. In some embodiments, RF transceiver circuitry 1222, baseband processing circuitry 1224, and application processing circuitry 1226 may be on separate chips or sets of chips. In alternative embodiments, part or all of baseband processing circuitry 1224 and application processing circuitry 1226 may be combined into one chip or set of chips, and RE transceiver circuitry 1222 may be on a separate chip or set of chips. In still alternative embodiments, part or all of RF transceiver circuitry 1222 and baseband processing circuitry 1224 may be on the same chip or set of chips, and application processing circuitry 1226 may be on a separate chip or set of chips. In yet other alternative embodiments, part or all of RE transceiver circuitry 1222, baseband processing circuitry 1224, and application processing circuitry 1226 may be combined in the same chip or set of chips. In some embodiments, RE transceiver circuitry 1222 may be a part of interface 1214. RF transceiver circuitry 1222 may condition RE signals for processing circuitry 1220.

In certain embodiments, some or all of the functionality described herein as being performed by a WD may be provided by processing circuitry 1220 executing instructions stored on device readable medium 1230, which in certain embodiments may be a computer-readable storage medium. In alternative embodiments, some or all of the functionality may be provided by processing circuitry 1220 without executing instructions stored on a separate or discrete device readable storage medium, such as in a hard-wired manner. In any of those particular embodiments, whether executing instructions stored on a device readable storage medium or not, processing circuitry 1220 can be configured to perform the described functionality. The benefits provided by such functionality are not limited to processing circuitry 1220 alone or to other components of WD 1210, but are enjoyed by WD 1210 as a whole, and/or by end users and the wireless network generally.

Processing circuitry 1220 may be configured to perform any determining, calculating, or similar operations (e.g., certain obtaining operations) described herein as being performed by a WD, These operations, as performed by processing circuitry 1220, may include processing information obtained by processing circuitry 1220 by, for example, converting the obtained information into other information, comparing the obtained information or converted information to information stored by WD 1210, and/or performing one or more operations based on the obtained information or converted information, and as a result of said processing making a determination.

Device readable medium 1230 may be operable to store a computer program, software, an application including one or more of logic, rules, code, tables, etc. and/or other instructions capable of being executed by processing circuitry 1220. Device readable medium 1230 may include computer memory (e.g., Random Access Memory (RAM) or Read Only Memory (ROM)), mass storage media (e.g., a hard disk), removable storage media (e.g., a Compact Disk (CD) or a Digital Video Disk (DVD)), and/or any other volatile or non-volatile, non-transitory device readable and/or computer executable memory devices that store information, data, and/or instructions that may be used by processing circuitry 1220. In some embodiments, processing circuitry 1220 and device readable medium 1230 may be considered to be integrated.

User interface equipment 1232 may provide components that allow for a human user to interact with WD 1210. Such interaction may be of many forms, such as visual, audial, tactile, etc. User interface equipment 1232 may be operable to produce output to the user and to allow the user to provide input to WD 1210. The type of interaction may vary depending on the type of user interface equipment 1232 installed in WD 1210, For example, if WD 1210 is a smart phone, the interaction may be via a touch screen; if WD 1210 is a smart meter, the interaction may be through a screen that provides usage (e.g., the number of gallons used) or a speaker that provides an audible alert (e.g., if smoke is detected). User interface equipment 1232 may include input interfaces, devices and circuits, and output interfaces, devices and circuits. User interface equipment 1232 is configured to allow input of information into WD 1210, and is connected to processing circuitry 1220 to allow processing circuitry 1220 to process the input information. User interface equipment 1232 may include, for example, a microphone, a proximity or other sensor, keys/buttons, a touch display, one or more cameras, a USB port, or other input circuitry. User interface equipment 1232 is also configured to allow output of information from WD 1210, and to allow processing circuitry 1220 to output information from WD 1210. User interface equipment 1232 may include, for example, a speaker, a display, vibrating circuitry, a USB port, a headphone interface, or other output circuitry. Using one or more input and output interfaces, devices, and circuits, of user interface equipment 1232, WD 1210 may communicate with end users and/or the wireless network, and allow them to benefit from the functionality described herein.

Auxiliary equipment 1234 is operable to provide more specific functionality which may not be generally performed by WDs. This may comprise specialized sensors for doing measurements for various purposes, interfaces for additional types of communication such as wired communications etc. The inclusion and type of components of auxiliary equipment 1234 may vary depending on the embodiment and/or scenario.

Power source 1236 may, in some embodiments, be in the form of a battery or battery pack. Other types of power sources, such as an external power source (e.g., an electricity outlet), photovoltaic devices or power cells, may also be used. WD 1210 may further comprise power circuitry 1237 for delivering power from power source 1236 to the various parts of WD 1210 which need power from power source 1236 to carry out any functionality described or indicated herein. Power circuitry 1237 may in certain embodiments comprise power management circuitry. Power circuitry 1237 may additionally or alternatively be operable to receive power from an external power source; in which case WD 1210 may be connectable to the external power source (such as an electricity outlet) via input circuitry or an interface such as an electrical power cable. Power circuitry 1237 may also in certain embodiments be operable to deliver power from an external power source to power source 1236. This may be, for example, for the charging of power source 1236. Power circuitry 1237 may perform any formatting, converting, or other modification to the power from power source 1236 to make the power suitable for the respective components of WD 1210 to which power is supplied.

Figure 13:
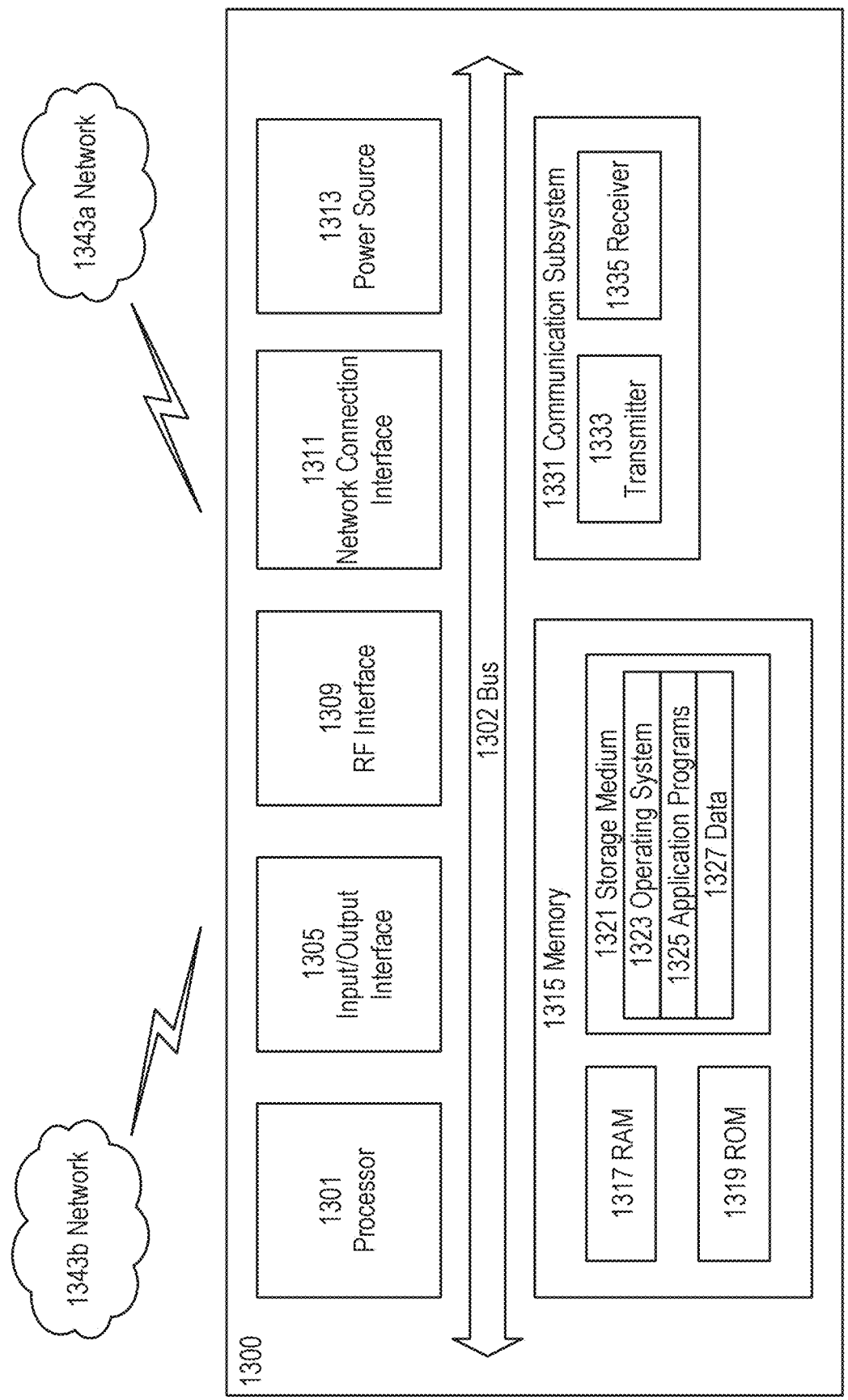
FIG. 13 is a schematic block diagram illustrating a UE.

FIG. 13 illustrates one embodiment of a UE in accordance with various aspects described herein. As used herein, a user equipment or UE may not necessarily have a user in the sense of a human user who owns and/or operates the relevant device. Instead, a UE may represent a device that is intended for sale to, or operation by, a human user but which may not, or which may not initially, be associated with a specific human user. A UE may also comprise any UE identified by the $3^{rd}$ Generation Partnership Project (3GPP), including a NB-IoT UE that is not intended for sale to, or operation by, a human user. UE 1300, as illustrated in FIG. 13, is one example of a WD configured for communication in accordance with one or more communication standards promulgated by the $3^{rd}$ Generation Partnership Project (3GPP), such as 3GPP's GSM, UMTS, LTE, and/or 5G standards. As mentioned previously, the term WD and UE may be used interchangeable. Accordingly, although FIG. 13 is a UE, the components discussed herein are equally applicable to a WD, and vice-versa.

In FIG. 13, UE 1300 includes processing circuitry 1301 that is operatively coupled to input/output interface 1305, radio frequency (RF) interface 1309, network connection interface 1311, memory 1315 including random access memory (RAM) 517, read-only memory (ROM) 1319, and storage medium 1321 or the like, communication subsystem 1331, power source 1333, and/or any other component, or any combination thereof. Storage medium 1321 includes operating system 1323, application program 1325, and data 1327. In other embodiments, storage medium 1321 may include other similar types of information, Certain UEs may utilize all of the components shown in FIG. 13, or only a subset of the components. The level of integration between the components may vary from one UE to another UE. Further, certain UEs may contain multiple instances of a component, such as multiple processors, memories, transceivers, transmitters, receivers, etc.

In FIG. 13, processing circuitry 1301 may be configured to process computer instructions and data. Processing circuitry 1301 may be configured to implement any sequential state machine operative to execute machine instructions stored as machine-readable computer programs in the memory, such as one or more hardware-implemented state machines (e.g., in discrete logic, FPGA, ASIC, etc.); programmable logic together with appropriate firmware; one or more stored program, general-purpose processors, such as a microprocessor or Digital Signal Processor (DSP), together with appropriate software; or any combination of the above. For example, the processing circuitry 1301 may include two central processing units (CPUs). Data may be information in a form suitable for use by a computer.

In the depicted embodiment, input/output interface 1305 may be configured to provide a communication interface to an input device, output device, or input and output device, UE 1300 may be configured to use an output device via input/output interface 1305. An output device may use the same type of interface port as an input device. For example, a USB port may be used to provide input to and output from UE 1300. The output device may be a speaker, a sound card, a video card, a display, a monitor, a printer, an actuator, an emitter, a smartcard, another output device, or any combination thereof. UE 1300 may be configured to use an input device via input/output interface 1305 to allow a user to capture information into UE 1300. The input device may include a touch-sensitive or presence-sensitive display, a camera (e.g., a digital camera, a digital video camera, a web camera, etc.), a microphone, a sensor, a mouse, a trackball, a directional pad, a trackpad, a scroll wheel, a smartcard, and the like. The presence-sensitive display may include a capacitive or resistive touch sensor to sense input from a user. A sensor may be, for instance, an accelerometer, a gyroscope, a tilt sensor, a force sensor, a magnetometer, an optical sensor, a proximity sensor, another like sensor, or any combination thereof. For example, the input device may be an accelerometer, a magnetometer, a digital camera, a microphone, and an optical sensor.

In FIG. 13, RF interface 1309 may be configured to provide a communication interface to RF components such as a transmitter, a receiver, and an antenna. Network connection interface 1311 may be configured to provide a communication interface to network 1343a. Network 1343a may encompass wired and/or wireless networks such as a local-area network (LAN), a wide-area network (WAN), a computer network, a wireless network, a telecommunications network, another like network or any combination thereof. For example, network 1343a may comprise a Wi-Fi network. Network connection interface 1311 may be configured to include a receiver and a transmitter interface used to communicate with one or more other devices over a communication network according to one or more communication protocols, such as Ethernet, TCP/IP, SONET, ATM, or the like. Network connection interface 1311 may implement receiver and transmitter functionality appropriate to the communication network links (e.g., optical, electrical, and the like). The transmitter and receiver functions may share circuit components, software or firmware, or alternatively may be implemented separately.

RAM 1317 may be configured to interface via bus 1302 to processing circuitry 1301 to provide storage or caching of data or computer instructions during the execution of software programs such as the operating system, application programs, and device drivers. ROM 1319 may be configured to provide computer instructions or data to processing circuitry 1301. For example, ROM 1319 may be configured to store invariant low-level system code or data for basic system functions such as basic input and output (I/O), startup, or reception of keystrokes from a keyboard that are stored in a non-volatile memory. Storage medium 1321 may be configured to include memory such as RAM, ROM, programmable read-only memory (PROM), erasable programmable read-only memory (EPROM), electrically erasable programmable read-only memory (EEPROM), magnetic disks, optical disks, floppy disks, hard disks, removable cartridges, or flash drives. In one example, storage medium 1321 may be configured to include operating system 1323, application program 1325 such as a web browser application, a widget or gadget engine or another application, and data file 1327. Storage medium 1321 may store, for use by UE 1300, any of a variety of various operating systems or combinations of operating systems.

Storage medium 1321 may be configured to include a number of physical drive units, such as redundant array of independent disks (RAID), floppy disk drive, flash memory, USB flash drive, external hard disk drive, thumb drive, pen drive, key drive, high-density digital versatile disc (HD-DVD) optical disc drive, internal hard disk drive, Blu-Ray optical disc drive, holographic digital data storage (HDDS) optical disc drive, external mini-dual in-line memory module (DIMM), synchronous dynamic random access memory (SDRAM), external micro-DIMM SDRAM, smartcard memory such as a subscriber identity module or a removable user identity (SIM/RUIM) module, other memory, or any combination thereof. Storage medium 1321 may allow UE 1300 to access computer-executable instructions, application programs or the like, stored on transitory or non-transitory memory media, to off-load data, or to upload data. An article of manufacture, such as one utilizing a communication system may be tangibly embodied in storage medium 1321, which may comprise a device readable medium.

In FIG. 13, processing circuitry 1301 may be configured to communicate with network 1343*b* using communication subsystem 1331. Network 1343*a* and network 1343*b* may be the same network or networks or different network or networks. Communication subsystem 1331 may be configured to include one or more transceivers used to communicate with network 1343*b*. For example, communication subsystem 1331 may be configured to include one or more transceivers used to communicate with one or more remote transceivers of another device capable of wireless communication such as another WD, UE, or base station of a radio access network (RAN) according to one or more communication protocols, such as IEEE 802.5, CDMA, WCDMA, GSM, LTE, UTRAN, WiMax, or the like. Each transceiver may include transmitter 1333 and/or receiver 1335 to implement transmitter or receiver functionality, respectively, appropriate to the RAN links (e.g., frequency allocations and the like). Further, transmitter 1333 and receiver 1335 of each transceiver may share circuit components, software or firmware, or alternatively may be implemented separately.

In the illustrated embodiment, the communication functions of communication subsystem 1331 may include data communication, voice communication, multimedia communication, short-range communications such as Bluetooth, near-field communication, location-based communication such as the use of the global positioning system (GPS) to determine a location, another like communication function, or any combination thereof. For example, communication subsystem 1331 may include cellular communication, Wi-Fi communication, Bluetooth communication, and GPS communication. Network 1343*b* may encompass wired and/or wireless networks such as a local-area network (LAN), a wide-area network (WAN), a computer network, a wireless network, a telecommunications network, another like network or any combination thereof. For example, network 1343*b* may be a cellular network, a Wi-Fi network, and/or a near-field network. Power source 1313 may be configured to provide alternating current (AC) or direct current (DC) power to components of UE 1300.

The features, benefits and/or functions described herein may be implemented in one of the components of UE 1300 or partitioned across multiple components of UE 1300. Further, the features, benefits, and/or functions described herein may be implemented in any combination of hardware, software or firmware. In one example, communication subsystem 1331 may be configured to include any of the components described herein. Further, processing circuitry 1301 may be configured to communicate with any of such components over bus 1302. In another example, any of such components may be represented by program instructions stored in memory that when executed by processing circuitry 1301 perform the corresponding functions described herein. In another example, the functionality of any of such components may be partitioned between processing circuitry 1301 and communication subsystem 1331. In another example, the non-computationally intensive functions of any of such components may be implemented in software or firmware and the computationally intensive functions may be implemented in hardware.

Figure 14:
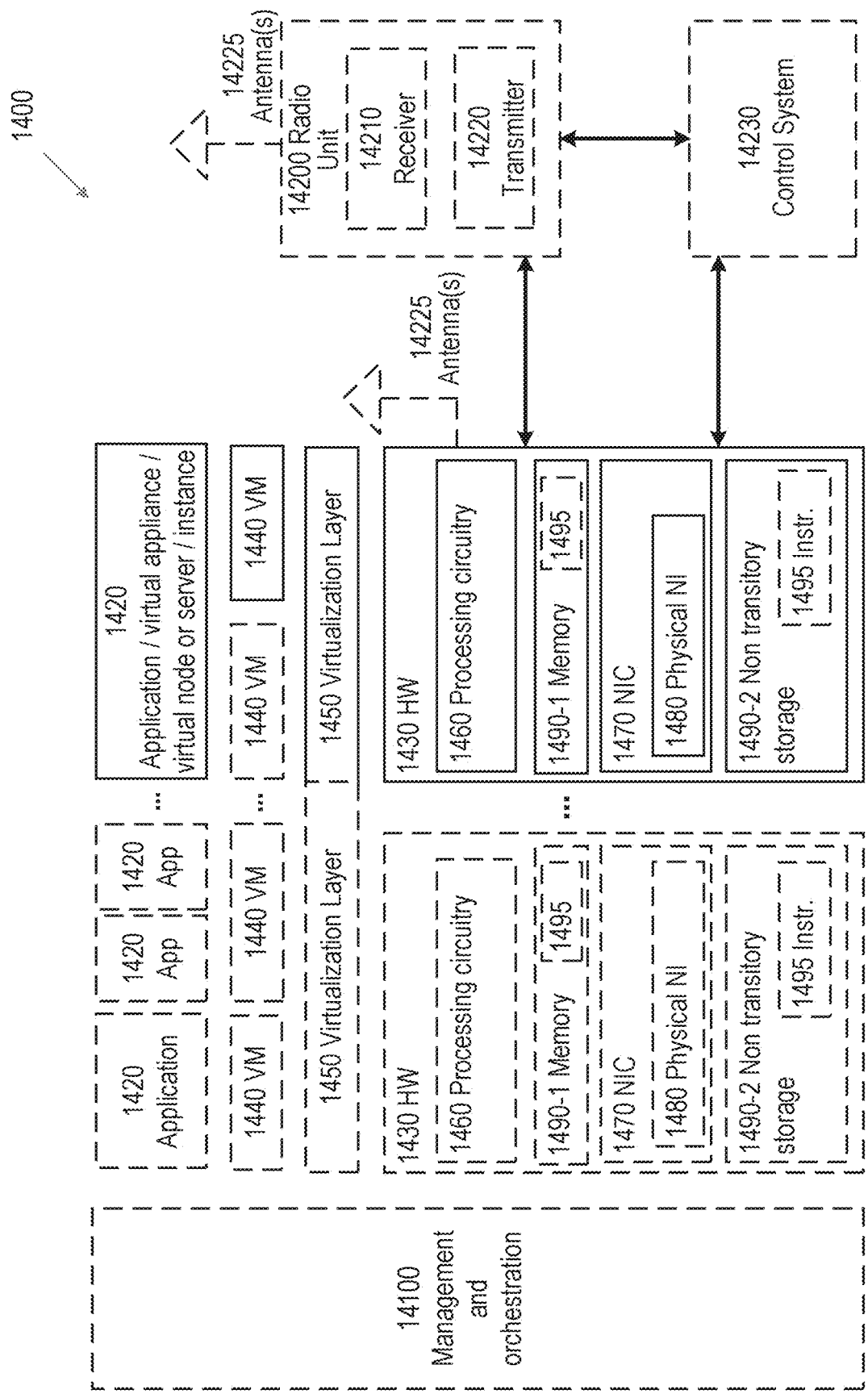
FIG. 14 is a schematic block diagram illustrating a virtualization environment.

FIG. 14 is a schematic block diagram illustrating a virtualization environment 1400 in which functions implemented by some embodiments may be virtualized. In the present context, virtualizing means creating virtual versions of apparatuses or devices which may include virtualizing hardware platforms, storage devices and networking resources. As used herein, virtualization can be applied to a node (e.g., a virtualized base station or a virtualized radio access node) or to a device (e.g., a UE, a wireless device or any other type of communication device) or components thereof and relates to an implementation in which at least a portion of the functionality is implemented as one or more virtual components (e.g., via one or more applications, components, functions, virtual machines or containers executing on one or more physical processing nodes in one or more networks).

In some embodiments, some or all of the functions described herein may be implemented as virtual components executed by one or more virtual machines implemented in one or more virtual environments 1400 hosted by one or more of hardware nodes 1430. Further, in embodiments in which the virtual node is not a radio access node or does not require radio connectivity (e.g., a core network node), then the network node may be entirely virtualized.

The functions may be implemented by one or more applications 1420 (which may alternatively be called software instances, virtual appliances, network functions, virtual nodes, virtual network functions, etc.) operative to implement some of the features, functions, and/or benefits of some of the embodiments disclosed herein. Applications 1420 are run in virtualization environment 1400 which provides hardware 1430 comprising processing circuitry 1460 and memory 1490. Memory 1490 contains instructions 1495 executable by processing circuitry 1460 whereby application 1420 is operative to provide one or more of the features, benefits, and/or functions disclosed herein.

Virtualization environment 1400, comprises general-purpose or special-purpose network hardware devices 1430 comprising a set of one or more processors or processing circuitry 1460, which may be commercial off-the-shelf (COTS) processors, dedicated Application Specific Integrated Circuits (ASICs), or any other type of processing circuitry including digital or analog hardware components or special purpose processors. Each hardware device may comprise memory 1490-1 which may be non-persistent memory for temporarily storing instructions 1495 or software executed by processing circuitry 1460. Each hardware device may comprise one or more network interface controllers (NICs) 1470, also known as network interface cards, which include physical network interface 1480. Each hardware device may also include non-transitory, persistent, machine-readable storage media 1490-2 having stored therein software 1495 and/or instructions executable by processing circuitry 1460. Software 1495 may include any type of software including software for instantiating one or more virtualization layers 1450 (also referred to as hypervisors), software to execute virtual machines 1440 as well as software allowing it to execute functions, features and/or benefits described in relation with some embodiments described herein.

Virtual machines 1440, comprise virtual processing, virtual memory, virtual networking or interface and virtual storage, and may be run by a corresponding virtualization layer 1450 or hypervisor. Different embodiments of the instance of virtual appliance 1420 may be implemented on one or more of virtual machines 1440, and the implementations may be made in different ways.

During operation, processing circuitry 1460 executes software 1495 to instantiate the hypervisor or virtualization layer 1450, which may sometimes be referred to as a virtual machine monitor (VMM). Virtualization layer 1450 may present a virtual operating platform that appears like networking hardware to virtual machine 1440.

As shown in FIG. 14, hardware 1430 may be a standalone network node with generic or specific components. Hardware 1430 may comprise antenna 14225 and may implement some functions via virtualization. Alternatively, hardware 1430 may be part of a larger cluster of hardware (e.g. such as in a data center or customer premise equipment (CPE)) where many hardware nodes work together and are managed via management and orchestration (MANO) 14100, which, among others, oversees lifecycle management of applications 1420.

Virtualization of the hardware is in some contexts referred to as network function virtualization (NFV). NFV may be used to consolidate many network equipment types onto industry standard high volume server hardware, physical switches, and physical storage, which can be located in data centers, and customer premise equipment.

In the context of NFV, virtual machine 1440 may be a software implementation of a physical machine that runs programs as if they were executing on a physical, non-virtualized machine. Each of virtual machines 1440, and that part of hardware 1430 that executes that virtual machine, be it hardware dedicated to that virtual machine and/or hardware shared by that virtual machine with others of the virtual machines 1440, forms a separate virtual network elements (VNE).

Still in the context of NFV, Virtual Network Function (VNF) is responsible for handling specific network functions that run in one or more virtual machines 1440 on top of hardware networking infrastructure 1430 and corresponds to application 1420 in FIG. 14.

In some embodiments, one or more radio units 14200 that each include one or more transmitters 14220 and one or more receivers 14210 may be coupled to one or more antennas 14225. Radio units 14200 may communicate directly with hardware nodes 1430 via one or more appropriate network interfaces and may be used in combination with the virtual components to provide a virtual node with radio capabilities, such as a radio access node or a base station.

In some embodiments, some signalling can be effected with the use of control system 14230 which may alternatively be used for communication between the hardware nodes 1430 and radio units 14200.

Figure 15:
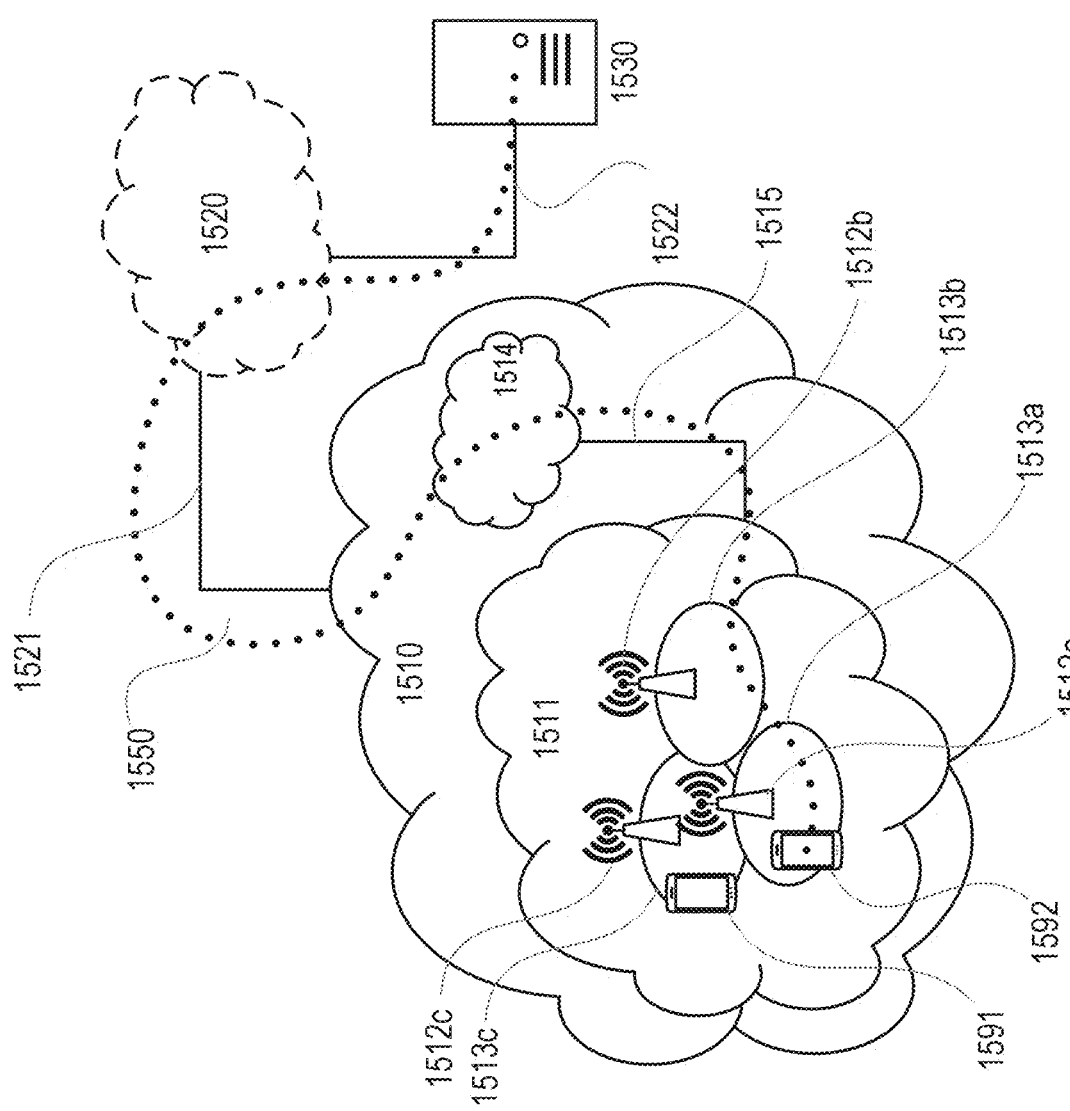
FIG. 15 is a schematic block diagram illustrating a telecommunication network connected via an intermediate network to a host computer.

FIG. 15 illustrates a telecommunication network connected via an intermediate network to a host computer in accordance with some embodiments. With reference to FIG. 15, in accordance with an embodiment, a communication system includes telecommunication network 1510, such as a 3GPP-type cellular network, which comprises access network 1511, such as a radio access network, and core network 1514. Access network 1511 comprises a plurality of base stations 1512a, 1512b, 1512c, such as NBs, eNBs, gNBs or other types of wireless access points, each defining a corresponding coverage area 1513a, 1513b, 1513c. Each base station 1512a, 1512b, 1512c is connectable to core network 1514 over a wired or wireless connection 1515. A first UE 1591 located in coverage area 1513c is configured to wirelessly connect to, or be paged by, the corresponding base station 1512c. A second UE 1592 in coverage area 1513a is wirelessly connectable to the corresponding base station 1512a. While a plurality of UEs 1591, 1592 are illustrated in this example, the disclosed embodiments are equally applicable to a situation where a sole UE is in the coverage area or where a sole UE is connecting to the corresponding base station 1512.

Telecommunication network 1510 is itself connected to host computer 1530, which may be embodied in the hardware and/or software of a standalone server, a cloud-implemented server, a distributed server or as processing resources in a server farm. Host computer 1530 may be under the ownership or control of a service provider, or may be operated by the service provider or on behalf of the service provider. Connections 1521 and 1522 between telecommunication network 1510 and host computer 1530 may extend directly from core network 1514 to host computer 1530 or may go via an optional intermediate network 1520. Intermediate network 1520 may be one of, or a combination of more than one of, a public, private or hosted network; intermediate network 1520, if any, may be a backbone network or the Internet; in particular, intermediate network 1520 may comprise two or more sub-networks (not shown).

The communication system of FIG. 15 as a whole enables connectivity between the connected UEs 1591, 1592 and host computer 1530. The connectivity may be described as an over-the-top (OTT) connection 1550. Host computer 1530 and the connected UEs 1591, 1592 are configured to communicate data and/or signaling via OTT connection 1550, using access network 1511, core network 1514, any intermediate network 1520 and possible further infrastructure (not shown) as intermediaries. OTT connection 1550 may be transparent in the sense that the participating communication devices through which OTT connection 1550 passes are unaware of routing of uplink and downlink communications. For example, base station 1512 may not or need not be informed about the past routing of an incoming downlink communication with data originating from host computer 1530 to be forwarded (e.g., handed over) to a connected UE 1591. Similarly, base station 1512 need not be aware of the future routing of an outgoing uplink communication originating from the UE 1591 towards the host computer 1530.

Figure 16:
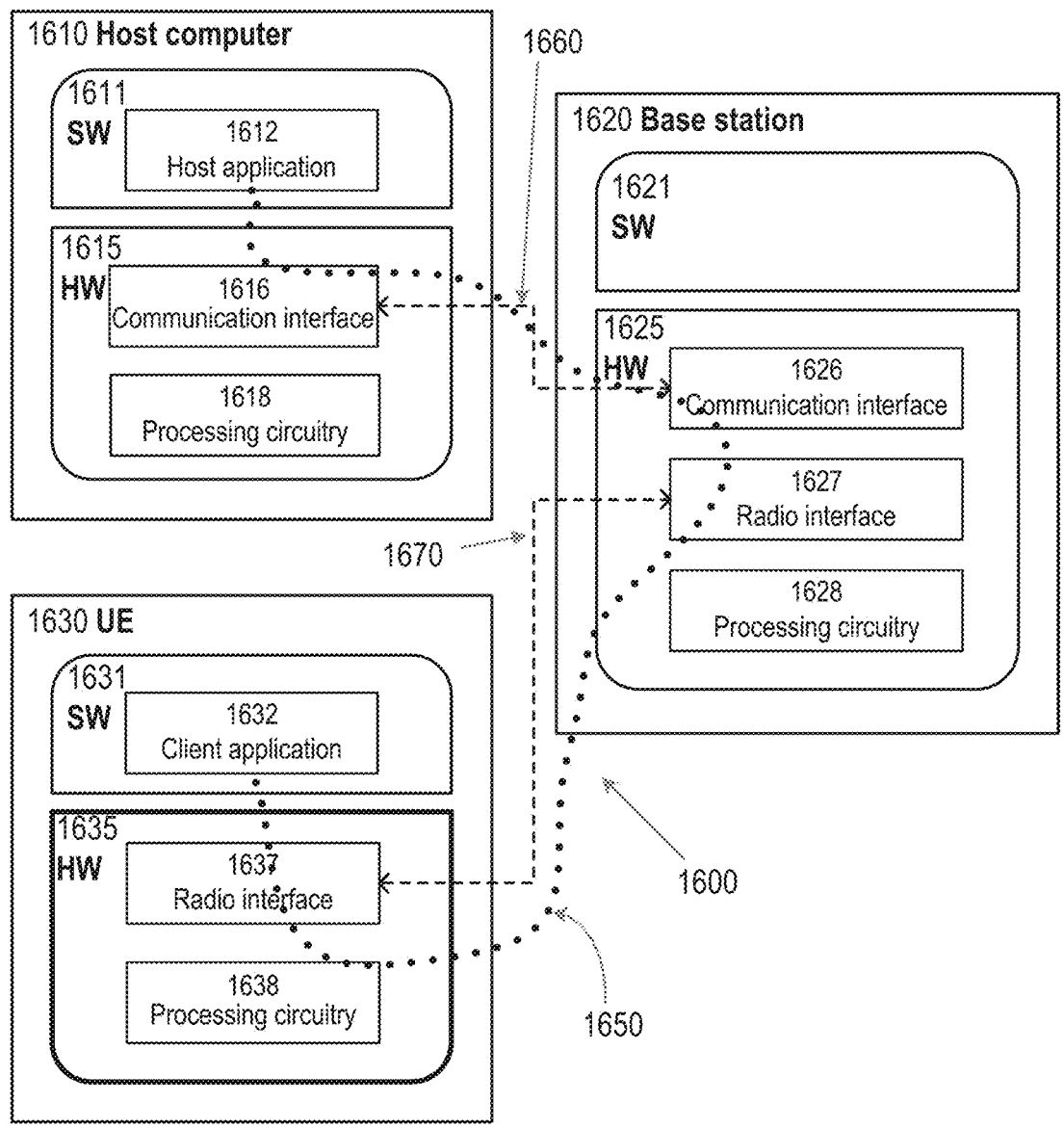
FIG. 16 is a schematic block diagram illustrating a host computer communicating via a base station with a user equipment over a partially wireless connection.

FIG. 16 illustrates a host computer communicating via a base station with a user equipment over a partially wireless connection in accordance with some embodiments. Example implementations, in accordance with an embodiment, of the UE, base station and host computer discussed in the preceding paragraphs will now be described with reference to FIG. 16. In communication system 1600, host computer 1610 comprises hardware 1615 including communication interface 1616 configured to set up and maintain a wired or wireless connection with an interface of a different communication device of communication system 1600. Host computer 1610 further comprises processing circuitry 1618, which may have storage and/or processing capabilities. In particular, processing circuitry 1618 may comprise one or more programmable processors, application-specific integrated circuits, field programmable gate arrays or combinations of these (not shown) adapted to execute instructions. Host computer 1610 further comprises software 1611, which is stored in or accessible by host computer 1610 and executable by processing circuitry 1618. Software 1611 includes host application 1612. Host application 1612 may be operable to provide a service to a remote user, such as UE 1630 connecting via OTT connection 1650 terminating at UE 1630 and host computer 1610. In providing the service to the remote user, host application 1612 may provide user data which is transmitted using OTT connection 1650.

Communication system 1600 further includes base station 1620 provided in a telecommunication system and comprising hardware 1625 enabling it to communicate with host computer 1610 and with UE 1630. Hardware 1625 may include communication interface 1626 for setting up and maintaining a wired or wireless connection with an interface of a different communication device of communication system 1600, as well as radio interface 1627 for setting up and maintaining at least wireless connection 1670 with UE 1630 located in a coverage area (not shown in FIG. 16) served by base station 1620. Communication interface 1626 may be configured to facilitate connection 1660 to host computer 1610. Connection 1660 may be direct or it may pass through a core network (not shown in FIG. 16) of the telecommunication system and/or through one or more intermediate networks outside the telecommunication system. In the embodiment shown, hardware 1625 of base station 1620 further includes processing circuitry 1628, which may comprise one or more programmable processors, application-specific integrated circuits, field programmable gate arrays or combinations of these (not shown) adapted to execute instructions. Base station 1620 further has software 1621 stored internally or accessible via an external connection.

Communication system 1600 further includes UE 1630 already referred to. Its hardware 1635 may include radio interface 1637 configured to set up and maintain wireless connection 1670 with a base station serving a coverage area in which UE 1630 is currently located. Hardware 1635 of UE 1630 further includes processing circuitry 1638, which may comprise one or more programmable processors, application-specific integrated circuits, field programmable gate arrays or combinations of these (not shown) adapted to execute instructions. UE 1630 further comprises software 1631, which is stored in or accessible by UE 1630 and executable by processing circuitry 1638. Software 1631 includes client application 1632. Client application 1632 may be operable to provide a service to a human or non-human user via UE 1630, with the support of host computer 1610. In host computer 1610, an executing host application 1612 may communicate with the executing client application 1632 via OTT connection 1650 terminating at UE 1630 and host computer 1610. In providing the service to the user, client application 1632 may receive request data from host application 1612 and provide user data in response to the request data. OTT connection 1650 may transfer both the request data and the user data. Client application 1632 may interact with the user to generate the user data that it provides.

It is noted that host computer 1610, base station 1620 and UE 1630 illustrated in FIG. 16 may be similar or identical to host computer 1530, one of base stations 1512a, 1512b, 1512c and one of UEs 1591, 1592 of FIG. 15, respectively. This is to say, the inner workings of these entities may be as shown in FIG. 16 and independently, the surrounding network topology may be that of FIG. 15.

In FIG. 16, OTT connection 1650 has been drawn abstractly to illustrate the communication between host computer 1610 and UE 1630 via base station 1620, without explicit reference to any intermediary devices and the precise routing of messages via these devices. Network infrastructure may determine the routing, which it may be configured to hide from UE 1630 or from the service provider operating host computer 1610, or both. While OTT connection 1650 is active, the network infrastructure may further take decisions by which it dynamically changes the routing (e.g., on the basis of load balancing consideration or reconfiguration of the network).

Wireless connection 1670 between UE 1630 and base station 1620 is in accordance with the teachings of the embodiments described throughout this disclosure. One or more of the various embodiments improve the performance of OTT services provided to UE 1630 using OTT connection 1650, in which wireless connection 1670 forms the last segment. More precisely, the teachings of these embodiments may improve the network performance, data accuracy, and training and thereby provide benefits such as better responsiveness and reduced user waiting time.

A measurement procedure may be provided for the purpose of monitoring data rate; latency and other factors on which the one or more embodiments improve. There may further be an optional network functionality for reconfiguring OTT connection 1650 between host computer 1610 and UE 1630, in response to variations in the measurement results. The measurement procedure and/or the network functionality for reconfiguring OTT connection 1650 may be implemented in software 1611 and hardware 1615 of host computer 1610 or in software 1631 and hardware 1635 of UE 1630, or both. In embodiments, sensors (not shown) may be deployed in or in association with communication devices through which OTT connection 1650 passes; the sensors may participate in the measurement procedure by supplying values of the monitored quantities exemplified above, or supplying values of other physical quantities from which software 1611, 1631 may compute or estimate the monitored quantities. The reconfiguring of OTT connection 1650 may include message format, retransmission settings, preferred routing etc.; the reconfiguring need not affect base station 1620, and it may be unknown or imperceptible to base station 1620, Such procedures and functionalities may be known and practiced in the art. In certain embodiments; measurements may involve proprietary UE signaling facilitating host computer 1610's measurements of throughput, propagation times, latency and the like. The measurements may be implemented in that software 1611 and 1631 causes messages to be transmitted; in particular empty or 'dummy' messages, using OTT connection 1650 while it monitors propagation times, errors etc.

Figure 17:
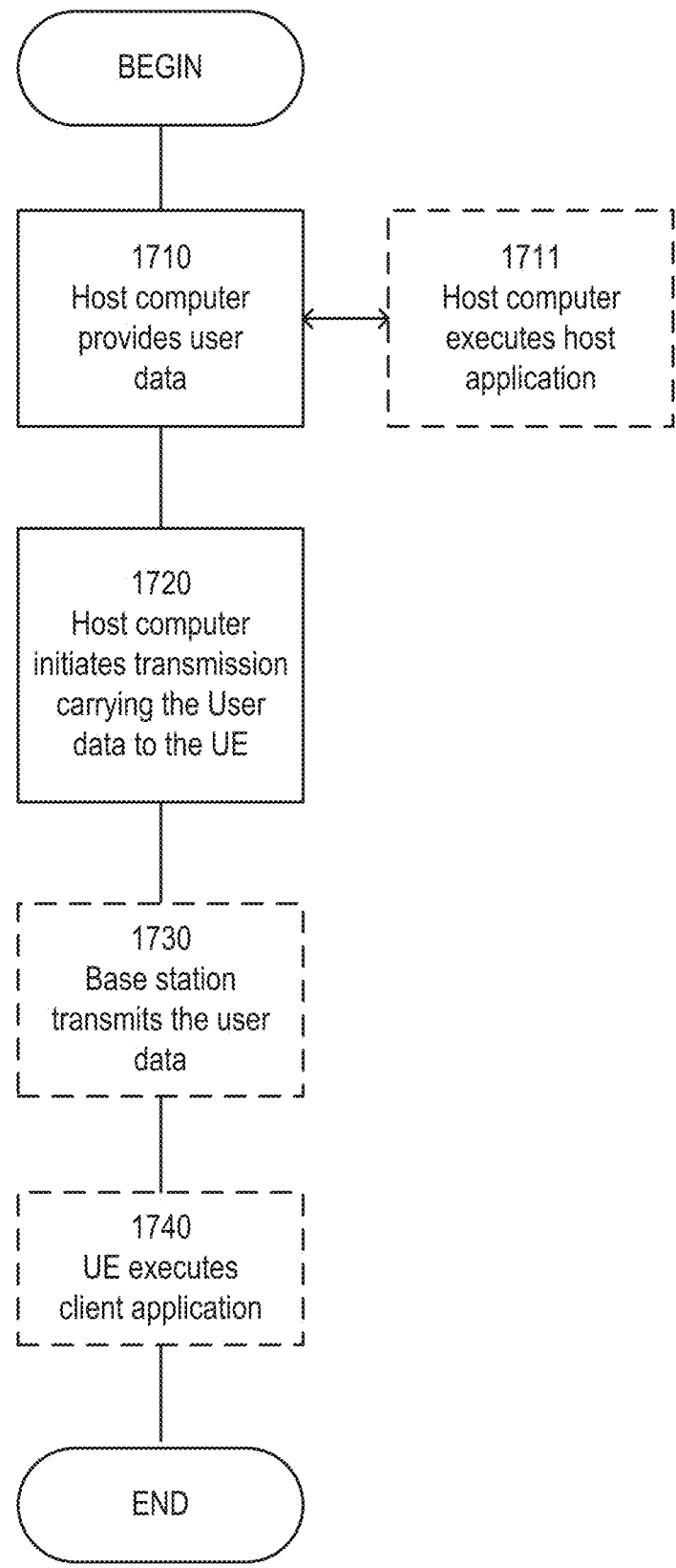
FIGS. 17 to 20 are flowcharts illustrating methods implemented in a communication system.

FIG. 17 is a flowchart illustrating a method implemented in a communication system including a host computer, a base station and a user equipment, in accordance with one embodiment. The communication system includes a host computer, a base station and a UE which may be those described with reference to FIGS. 15 and 16. For simplicity of the present disclosure, only drawing references to FIG. 17 will be included in this section. In step 1710, the host computer provides user data. In substep 1711 (which may be optional) of step 1710, the host computer provides the user data by executing a host application. In step 1720, the host computer initiates a transmission carrying the user data to the UE. In step 1730 (which may be optional), the base station transmits to the UE the user data which was carried in the transmission that the host computer initiated, in accordance with the teachings of the embodiments described throughout this disclosure. In step 1740 (which may also be optional), the UE executes a client application associated with the host application executed by the host computer.

Figure 18:
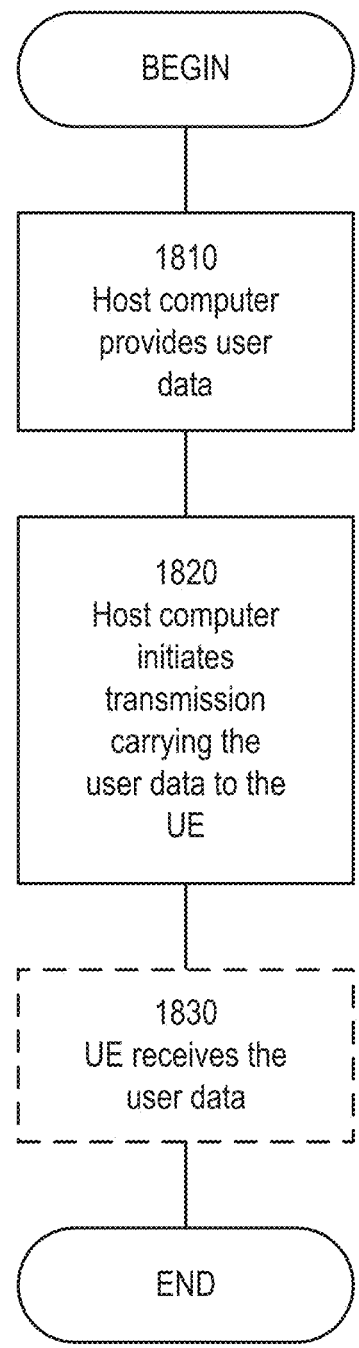

FIG. 18 is a flowchart illustrating a method implemented in a communication system including a host computer, a base station and a user equipment, in accordance with one embodiment. The communication system includes a host computer, a base station and a UE which may be those described with reference to FIGS. 15 and 16. For simplicity of the present disclosure, only drawing references to FIG. 18 will be included in this section. In step 1810 of the method, the host computer provides user data. In an optional substep (not shown) the host computer provides the user data by executing a host application. In step 1820, the host computer initiates a transmission carrying the user data to the UE, The transmission may pass via the base station, in accordance with the teachings of the embodiments described throughout this disclosure. In step 1830 (which may be optional), the UE receives the user data carried in the transmission.

Figure 19:
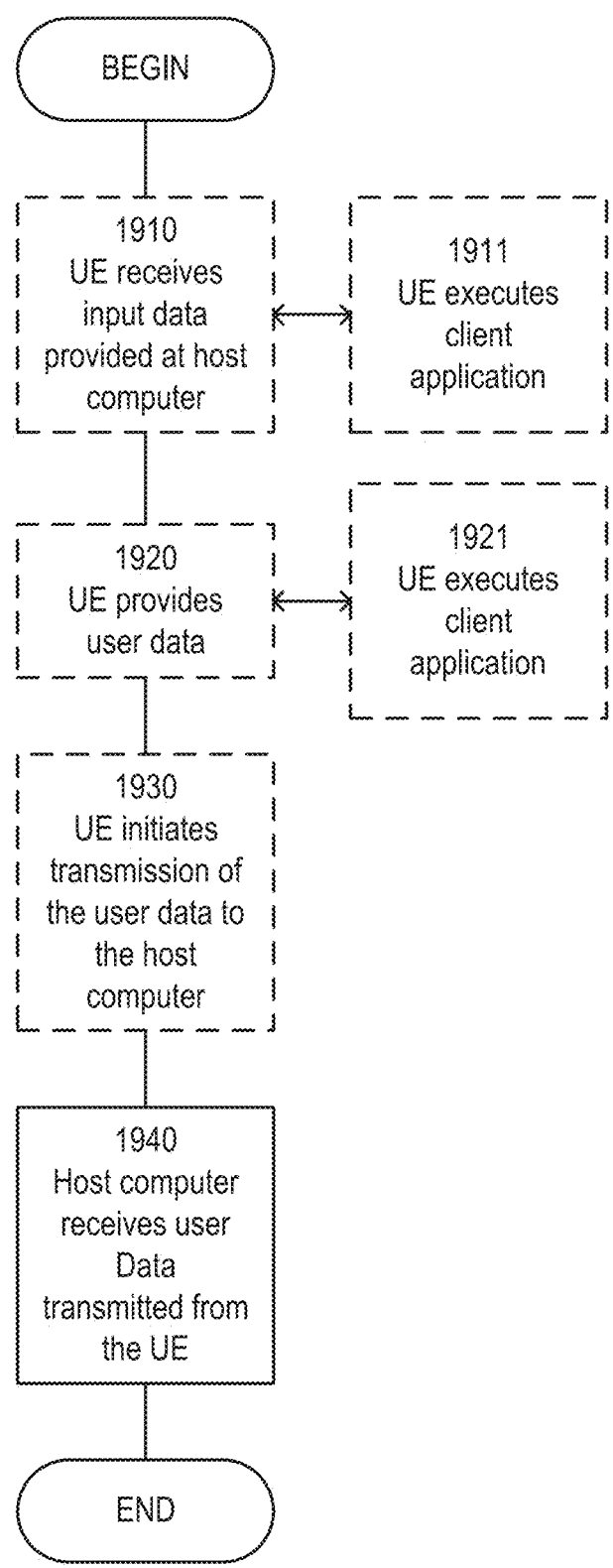

FIG. 19 is a flowchart illustrating a method implemented in a communication system including a host computer, a base station and a user equipment, in accordance with one embodiment. The communication system includes a host computer, a base station and a UE which may be those described with reference to FIGS. 15 and 16. For simplicity of the present disclosure, only drawing references to FIG. 19 will be included in this section. In step 1910 (which may be optional), the UE receives input data provided by the host computer. Additionally or alternatively, in step 1920, the UE provides user data. In substep 1921 (which may be optional) of step 1920, the UE provides the user data by executing a client application. In substep 1911 (which may be optional) of step 1910, the UE executes a client application which provides the user data in reaction to the received input data provided by the host computer. In providing the user data, the executed client application may further consider user input received from the user. Regardless of the specific manner in which the user data was provided, the UE initiates, in substep 1930 (which may be optional), transmission of the user data to the host computer. In step 1940 of the method, the host computer receives the user data transmitted from the UE, in accordance with the teachings of the embodiments described throughout this disclosure.

Figure 20:
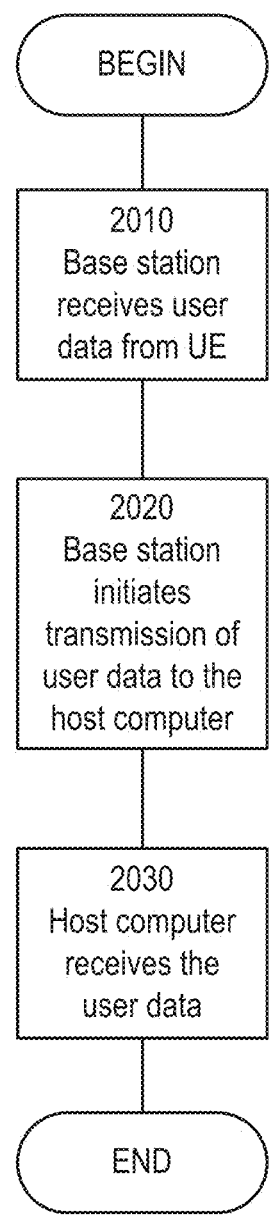

FIG. 20 is a flowchart illustrating a method implemented in a communication system including a host computer, a base station and a user equipment, in accordance with one embodiment. The communication system includes a host computer, a base station and a UE which may be those described with reference to FIGS. 15 and 16. For simplicity of the present disclosure, only drawing references to FIG. 20 will be included in this section. In step 2010 (which may be optional), in accordance with the teachings of the embodiments described throughout this disclosure, the base station receives user data from the UE. In step 2020 (which may be optional), the base station initiates transmission of the received user data to the host computer. In step 2030 (which may be optional), the host computer receives the user data carried in the transmission initiated by the base station.

Any appropriate steps, methods, features, functions, or benefits disclosed herein may be performed through one or more functional units or modules of one or more virtual apparatuses. Each virtual apparatus may comprise a number of these functional units. These functional units may be implemented via processing circuitry, which may include one or more microprocessor or microcontrollers, as well as other digital hardware, which may include digital signal processors (DSPs), special-purpose digital logic, and the like. The processing circuitry may be configured to execute program code stored in memory, which may include one or several types of memory such as read-only memory (ROM), random-access memory (RAM), cache memory, flash memory devices, optical storage devices, etc. Program code stored in memory includes program instructions for executing one or more telecommunications and/or data communications protocols as well as instructions for carrying out one or more of the techniques described herein. In some implementations, the processing circuitry may be used to cause the respective functional unit to perform corresponding functions according one or more embodiments of the present disclosure.

Abbreviations

At least some of the following abbreviations may be used in this disclosure. If there is an inconsistency between abbreviations, preference should be given to how it is used above. If listed multiple times below, the first listing should be preferred over any subsequent listing(s).

| Abbreviation | Explanation |
| --- | --- |
| BCH | Bose-Chaudhuri-Hocquenghem codes |
| FEC | Forward Error Correction |
| LDPC | Low-Density Parity-Check |
| LLR | Log-Likelihood Ratio |
| ML | Maximum Likelihood |
| NN | Neural Network |
| NND | Neural Network Decoder |
| SNR | Signal-to-Noise Ratio |
| SPA | Sum-Product Algorithm |

Further Information

The following pages of the detailed description reproduce the text of an early version of the Thesis: "Machine Intelligence in Decoding of Forward Error Correction Codes" by Navneet Agrawal. This text was included as an appendix to the priority founding application U.S. 62/549,026. The claims of the present application follow the thesis text.

The invention claimed is:

1. The method for training a Neural Network, NN, to recover a codeword of a Forward Error Correction, FEC, code from a received signal, wherein layers of the NN implement sequential iterations of the Sum Product Algorithm, SPA, and wherein the received signal comprises a transmitted codeword and channel impairments, the method comprising:
inputting to an input layer of the NN a representation of message bits of a transmitted codeword obtained from a received signal;
propagating the representation through the NN;
calculating a loss function; and
optimising trainable parameters of the NN to minimise the loss function;
wherein calculating a loss function comprises, for bits in the transmitted codeword:
representing an estimated value of the message bit output from the NN as a probability of the value of the bit in a predetermined real number domain; and
multiplying the representation of the estimated value of the message bit by a representation of a target value of the message bit.

2. The method as claimed in claim 1, wherein calculating a loss function further comprises:
averaging over all bits in the transmitted codeword, the values obtained from multiplying, for bits in the transmitted codeword, the representation of the estimated value of the message bit by a representation of a target value of the message bit.

3. The method as claimed in claim 1, wherein representing an estimated value of the message bit output from the NN as a probability of the value of the bit in a real number domain comprises:
obtaining a probability of the value of the bit from a layer of the NN; and
transforming the obtained probability to a value within the predetermined real number domain.

4. The method as claimed in claim 3, wherein the predetermined real number domain is [−1, 1] and wherein transforming the obtained probability to a value within the predetermined real number domain comprises performing a linear transformation on the obtained probability.

5. The method as claimed in claim 1, wherein the representation of the target value of the message bit comprises a value of the message bit after modulation using a modulation technique applied to the transmitted codeword.

6. The method as claimed in claim 1, wherein calculating a loss function comprises:
calculating the loss function on the basis of an estimated value of the message bit output from an output layer of the NN.

7. The method as claimed in claim 1, wherein the loss function comprises:

$$L_f^E(p, y) = \frac{-1}{N} \Sigma_{n=1}^{N}\left((1 - 2p(n))(-1)^{y(n)}\right)$$

wherein:
N is the number of bits in the transmitted codeword;
p(n) is the probability of the value of the $n^{th}$ bit of the transmitted codeword output by the NN being 1; and
y(n) is the target value of the $n^{th}$ bit of the transmitted codeword.

8. The method as claimed in claim 1, wherein calculating a loss function comprises:
calculating the loss function on the basis of estimated values of the message bit output from even layers of the NN.

9. The method as claimed in claim 8, wherein the loss function comprises:

$$L_m^E(p, y) = \frac{-1}{MN} \sum_{l=2,4,\ldots}^{2M} \left(\sum_{n=1}^{N}\left((1 - 2p(l, n))(-1)^{y(n)}\right)\right)$$

wherein:
N is the number of bits in the transmitted codeword;
2M is the number of hidden layers in the NN;
p(n) is the probability of the value of the nth bit of the transmitted codeword output by the l-th layer of the NN being 1; and
y(n) is the target value of the nth bit of the transmitted codeword.

10. The method as claimed in claim 1, wherein the training codeword comprises a codeword of a binary linear block code.

11. The method as claimed in claim 1, wherein the representation of message bits obtained from a received signal that is input to the input layer of the NN comprises an array of Log-Likelihood Ratios, LLRs, of the individual message bits obtained from the received signal.

12. The method as claimed in claim 1, wherein the NN comprises a Neural Network Decoder, NND.

13. A computer program comprising instructions which, when executed on at least one processor, cause the at least one processor to carry out the method according to claim 1.

14. A controller for training a Neural Network, NN, to recover a codeword of a Forward Error Correction, FEC, code from a received signal, wherein layers of the NN implement sequential iterations of the Sum Product Algorithm, SPA, and wherein the received signal comprises a transmitted codeword and channel impairments, the controller comprising a processor and a memory, the memory containing instructions executable by the processor such that the controller is operable to:
input to an input layer of the NN a representation of message bits of a transmitted codeword obtained from a received signal;
propagate the representation through the NN;
calculate a loss function; and
optimise trainable parameters of the NN to minimise the loss function;
wherein calculating a loss function comprises, for bits in the transmitted codeword:
representing an estimated value of the message bit output from the NN as a probability of the value of the bit in a predetermined real number domain; and
multiplying the representation of the estimated value of the message bit by a representation of a target value of the message bit.

15. The controller as claimed in claim 14, wherein the controller is further operable to perform operations of:
inputting to an input layer of the NN a representation of message bits of a transmitted codeword obtained from a received signal;
propagating the representation through the NN;
calculating a loss function; and optimising trainable parameters of the NN to minimise the loss function;
  wherein calculating a loss function comprises, for bits in the transmitted codeword:
    representing an estimated value of the message bit output from the NN as a probability of the value of the bit in a predetermined real number domain; and
    multiplying the representation of the estimated value of the message bit by a representation of a target value of the message bit.

16. The controller as claimed in claim 14, wherein the controller comprises a virtualized network function.

17. A base station comprising the controller as claimed in claim 14.

18. A controller for training a Neural Network, NN, to recover a codeword of a Forward Error Correction, FEC, code from a received signal, wherein layers of the NN implement sequential iterations of the Sum Product Algorithm, SPA, and wherein the received signal comprises a transmitted codeword and channel impairments, the controller adapted to:
  input to an input layer of the NN a representation of message bits of a transmitted codeword obtained from a received signal;
  propagate the representation through the NN;
  calculate a loss function; and
  optimise trainable parameters of the NN to minimise the loss function;
    wherein calculating a loss function comprises, for bits in the transmitted codeword:
      representing an estimated value of the message bit output from the NN as a probability of the value of the bit in a predetermined real number domain; and
      multiplying the representation of the estimated value of the message bit by a representation of a target value of the message bit.

* * * * *